US008984216B2

(12) United States Patent
Fillingim

(10) Patent No.: US 8,984,216 B2
(45) Date of Patent: Mar. 17, 2015

(54) APPARATUS, SYSTEM, AND METHOD FOR MANAGING LIFETIME OF A STORAGE DEVICE

(75) Inventor: Jeremy Fillingim, Salt Lake City, UT (US)

(73) Assignee: Fusion-io, LLC, Wilmington, DE (US)

( * ) Notice: Subject to any disclaimer, the term of this patent is extended or adjusted under 35 U.S.C. 154(b) by 476 days.

(21) Appl. No.: 13/272,964

(22) Filed: Oct. 13, 2011

(65) Prior Publication Data

US 2012/0066439 A1    Mar. 15, 2012

Related U.S. Application Data

(63) Continuation-in-part of application No. 12/878,987, filed on Sep. 9, 2010, now Pat. No. 8,429,436.

(60) Provisional application No. 61/392,845, filed on Oct. 13, 2010.

(51) Int. Cl.
*G06F 12/00* (2006.01)
*G06F 3/06* (2006.01)
*G06F 11/34* (2006.01)
(Continued)

(52) U.S. Cl.
CPC .......... *G06F 3/0688* (2013.01); *G06F 11/3485* (2013.01); *G06F 11/3433* (2013.01); *G06F 11/3034* (2013.01); *G06F 11/3055* (2013.01); *G06F 11/3062* (2013.01); *G06F 1/206* (2013.01); *G06F 1/3221* (2013.01); *G06F 1/3268* (2013.01); *G06F 11/1008* (2013.01); *G06F 3/0616* (2013.01); *G06F 3/0653* (2013.01); *G11C 16/30* (2013.01); *G11C 16/3495* (2013.01); *G06F 2201/81* (2013.01); *Y02B 60/1246* (2013.01); *G06F 12/0246* (2013.01); *G06F 2212/1036* (2013.01)
USPC .......... 711/105; 711/103; 711/154; 713/300; 713/320; 713/324

(58) Field of Classification Search
USPC .......... 713/300, 320, 324; 711/103, 105, 154
See application file for complete search history.

(56) References Cited

U.S. PATENT DOCUMENTS 4,980,861 A    12/1990 Herdt et al.
5,193,184 A    3/1993 Belsan et al.
(Continued)

FOREIGN PATENT DOCUMENTS

CN    1771495    5/2006
EP    0747822    12/1996
(Continued)

OTHER PUBLICATIONS

Application No. 201080050702.0, 2380.2.34CN1, Second Office Action, Sep. 19, 2014.
(Continued)

*Primary Examiner* — Vincent Tran

(57) ABSTRACT

Apparatuses, systems, and methods are disclosed for managing lifetime for a data storage device. A target module determines a write bandwidth target for a data storage device. An audit module monitors write bandwidth of the data storage device relative to the write bandwidth target. A throttle module adjusts execution of one or more write operations on the data storage device in response to the write bandwidth of the data storage device failing to satisfy the write bandwidth target.

21 Claims, 11 Drawing Sheets

(51) Int. Cl.
*G06F 11/30* (2006.01)
*G06F 1/20* (2006.01)
*G06F 1/32* (2006.01)
*G06F 11/10* (2006.01)
G11C 16/30 (2006.01)
G11C 16/34 (2006.01)
G06F 12/02 (2006.01)

(56) References Cited

U.S. PATENT DOCUMENTS

| | | | |
|---|---|---|---|
| 5,261,068 A | 11/1993 | Gaskins et al. |
| 5,325,509 A | 6/1994 | Lautzenheiser |
| 5,404,485 A | 4/1995 | Ban |
| 5,438,671 A | 8/1995 | Miles |
| 5,504,882 A | 4/1996 | Chai |
| 5,535,399 A | 7/1996 | Blitz et al. |
| 5,553,261 A | 9/1996 | Hasbun et al. |
| 5,594,883 A | 1/1997 | Pricer |
| 5,598,370 A | 1/1997 | Niijima et al. |
| 5,638,289 A | 6/1997 | Yamada et al. |
| 5,651,133 A | 7/1997 | Burkes |
| 5,682,497 A | 10/1997 | Robinson |
| 5,682,499 A | 10/1997 | Bakke et al. |
| 5,701,434 A | 12/1997 | Nakagawa |
| 5,742,787 A | 4/1998 | Talreja |
| 5,754,563 A | 5/1998 | White |
| 5,799,140 A | 8/1998 | Niijima et al. |
| 5,799,200 A | 8/1998 | Brant et al. |
| 5,802,602 A | 9/1998 | Rahman et al. |
| 5,805,501 A | 9/1998 | Shiau et al. |
| 5,812,457 A | 9/1998 | Arase |
| 5,845,329 A | 12/1998 | Onishi et al. |
| 5,960,462 A | 9/1999 | Solomon et al. |
| 6,000,019 A | 12/1999 | Dykstal et al. |
| 6,014,724 A | 1/2000 | Jenett |
| 6,125,072 A | 9/2000 | Wu |
| 6,170,039 B1 | 1/2001 | Kishida |
| 6,170,047 B1 | 1/2001 | Dye |
| 6,173,381 B1 | 1/2001 | Dye |
| 6,185,654 B1 | 2/2001 | Van Doren |
| 6,205,521 B1 | 3/2001 | Schumann |
| 6,236,593 B1 | 5/2001 | Hong et al. |
| 6,240,040 B1 | 5/2001 | Akaogi et al. |
| 6,256,642 B1 | 7/2001 | Krueger et al. |
| 6,278,633 B1 | 8/2001 | Wong et al. |
| 6,330,688 B1 | 12/2001 | Brown |
| 6,336,174 B1 | 1/2002 | Li et al. |
| 6,356,986 B1 | 3/2002 | Solomon et al. |
| 6,370,631 B1 | 4/2002 | Dye |
| 6,385,688 B1 | 5/2002 | Mills |
| 6,385,710 B1 | 5/2002 | Goldman et al. |
| 6,404,647 B1 | 6/2002 | Minne' |
| 6,412,080 B1 | 6/2002 | Fleming et al. |
| 6,418,478 B1 | 7/2002 | Ignatius et al. |
| 6,470,238 B1 * | 10/2002 | Nizar et al. ................. 700/299 |
| 6,507,911 B1 | 1/2003 | Langford |
| 6,515,909 B1 | 2/2003 | Wooldridge |
| 6,515,928 B2 | 2/2003 | Sato et al. |
| 6,523,102 B1 | 2/2003 | Dye et al. |
| 6,552,955 B1 | 4/2003 | Miki |
| 6,564,285 B1 | 5/2003 | Mills |
| 6,587,915 B1 | 7/2003 | Kim |
| 6,601,211 B1 | 7/2003 | Norman |
| 6,608,793 B2 | 8/2003 | Park et al. |
| 6,625,685 B1 | 9/2003 | Cho et al. |
| 6,629,112 B1 | 9/2003 | Shank |
| 6,633,950 B1 | 10/2003 | Brown et al. |
| 6,633,956 B1 | 10/2003 | Mitani |
| 6,643,181 B2 | 11/2003 | Sofer et al. |
| 6,655,758 B2 | 12/2003 | Pasotti et al. |
| 6,658,438 B1 | 12/2003 | Moore et al. |
| 6,671,757 B1 | 12/2003 | Multer et al. |
| 6,683,810 B2 | 1/2004 | Sakamoto |
| 6,694,453 B1 | 2/2004 | Shukla et al. |
| 6,715,027 B2 | 3/2004 | Kim et al. |
| 6,715,046 B1 | 3/2004 | Shoham et al. |
| 6,735,546 B2 | 5/2004 | Scheuerlein |
| 6,751,155 B2 | 6/2004 | Gorobets |
| 6,754,774 B2 | 6/2004 | Gruner et al. |
| 6,760,806 B2 | 7/2004 | Jeon |
| 6,775,185 B2 | 8/2004 | Fujisawa et al. |
| 6,779,088 B1 | 8/2004 | Benveniste et al. |
| 6,785,785 B2 | 8/2004 | Piccirillo et al. |
| 6,807,097 B2 | 10/2004 | Takano et al. |
| 6,845,053 B2 | 1/2005 | Chevallier |
| 6,849,480 B1 | 2/2005 | Low et al. |
| 6,865,657 B1 | 3/2005 | Traversat et al. |
| 6,871,257 B2 | 3/2005 | Conley et al. |
| 6,877,076 B1 | 4/2005 | Cho et al. |
| 6,880,049 B2 | 4/2005 | Gruner et al. |
| 6,883,079 B1 | 4/2005 | Priborsky |
| 6,887,058 B2 | 5/2005 | Fujiwara |
| 6,938,133 B2 | 8/2005 | Johnson et al. |
| 6,957,158 B1 | 10/2005 | Hancock et al. |
| 6,959,369 B1 | 10/2005 | Ashton et al. |
| 6,973,551 B1 | 12/2005 | Walton |
| 6,977,847 B2 | 12/2005 | Lasser et al. |
| 6,981,070 B1 | 12/2005 | Luk et al. |
| 6,990,547 B2 | 1/2006 | Ulrich et al. |
| 6,996,676 B2 | 2/2006 | Megiddo |
| 7,010,652 B2 | 3/2006 | Piccirillo et al. |
| 7,042,664 B2 | 5/2006 | Gill et al. |
| 7,043,599 B1 | 5/2006 | Ware et al. |
| 7,050,337 B2 | 5/2006 | Iwase et al. |
| 7,057,936 B2 | 6/2006 | Yaegashi et al. |
| 7,058,769 B1 | 6/2006 | Danilak |
| 7,064,994 B1 | 6/2006 | Wu |
| 7,089,391 B2 | 8/2006 | Geiger et al. |
| 7,096,321 B2 | 8/2006 | Modha |
| 7,167,944 B1 | 1/2007 | Estakhri |
| 7,167,953 B2 | 1/2007 | Megiddo et al. |
| 7,173,852 B2 | 2/2007 | Gorobets |
| 7,177,197 B2 | 2/2007 | Cernea |
| 7,181,572 B2 | 2/2007 | Walmsley |
| 7,194,577 B2 | 3/2007 | Johnson et al. |
| 7,194,740 B1 | 3/2007 | Frank et al. |
| 7,215,580 B2 | 5/2007 | Gorobets |
| 7,219,238 B2 | 5/2007 | Saito et al. |
| 7,227,777 B2 | 6/2007 | Roohparvar |
| 7,243,203 B2 | 7/2007 | Scheuerlein |
| 7,246,179 B2 | 7/2007 | Camara et al. |
| 7,257,129 B2 | 8/2007 | Lee et al. |
| 7,257,690 B1 | 8/2007 | Baird |
| 7,263,591 B2 | 8/2007 | Estakhri et al. |
| 7,275,135 B2 | 9/2007 | Coulson |
| 7,305,520 B2 | 12/2007 | Voigt et al. |
| 7,310,711 B2 | 12/2007 | New et al. |
| 7,328,307 B2 | 2/2008 | Hoogterp |
| 7,340,558 B2 | 3/2008 | Lee et al. |
| 7,340,566 B2 | 3/2008 | Voth |
| 7,340,581 B2 | 3/2008 | Gorobets et al. |
| 7,398,348 B2 | 7/2008 | Moore et al. |
| 7,400,537 B2 | 7/2008 | Hemink et al. |
| 7,403,424 B2 | 7/2008 | Hemink et al. |
| 7,424,593 B2 | 9/2008 | Estakhri et al. |
| 7,441,090 B2 | 10/2008 | Estakhri et al. |
| 7,450,420 B2 | 11/2008 | Sinclair et al. |
| 7,451,344 B1 | 11/2008 | Rothberg |
| 7,457,166 B2 | 11/2008 | Hemink et al. |
| 7,460,432 B2 | 12/2008 | Warner |
| 7,463,521 B2 | 12/2008 | Li |
| 7,463,532 B2 | 12/2008 | Tran et al. |
| 7,464,240 B2 | 12/2008 | Caulkins et al. |
| 7,480,766 B2 | 1/2009 | Gorobets |
| 7,487,320 B2 | 2/2009 | Bansal et al. |
| 7,495,954 B2 | 2/2009 | Ito |
| 7,499,317 B2 | 3/2009 | Ito |
| 7,499,338 B2 | 3/2009 | Ito |
| 7,522,457 B2 | 4/2009 | Hemink et al. |
| 7,535,766 B2 | 5/2009 | Ito |
| 7,548,464 B2 | 6/2009 | Kim |
| 7,552,271 B2 | 6/2009 | Sinclair et al. |
| 7,599,967 B2 | 10/2009 | Girkar et al. |

(56) References Cited

U.S. PATENT DOCUMENTS

| | | |
|---|---|---|
| 7,630,255 B2 | 12/2009 | Yang |
| 7,631,138 B2 | 12/2009 | Gonzalez et al. |
| 7,644,239 B2 | 1/2010 | Ergan et al. |
| 7,725,628 B1 | 5/2010 | Phan et al. |
| 7,743,210 B1 | 6/2010 | Jernigan, IV et al. |
| 7,752,360 B2 | 7/2010 | Galles |
| 7,777,652 B2 | 8/2010 | Lee et al. |
| 7,818,525 B1 | 10/2010 | Frost et al. |
| 7,856,528 B1 | 12/2010 | Frost et al. |
| 7,873,782 B2 | 1/2011 | Terry |
| 7,898,867 B2 | 3/2011 | Hazama et al. |
| 7,903,468 B2 | 3/2011 | Litsyn et al. |
| 7,908,501 B2 | 3/2011 | Kim et al. |
| 7,930,326 B2 | 4/2011 | Doucette et al. |
| 7,944,762 B2 | 5/2011 | Gorobets |
| 7,970,770 B2 | 6/2011 | Edwards |
| 7,978,541 B2 | 7/2011 | Sutardja |
| 8,001,334 B2 | 8/2011 | Lee |
| 8,010,738 B1 * | 8/2011 | Chilton et al. ............... 711/103 |
| 8,046,551 B1 * | 10/2011 | Sahin ........................ 711/162 |
| 8,055,922 B2 * | 11/2011 | Brittain et al. ............... 713/320 |
| 8,130,551 B2 | 3/2012 | Oowada et al. |
| 8,289,801 B2 | 10/2012 | Smith et al. |
| 8,364,888 B2 | 1/2013 | Melik-Martirosian et al. |
| 8,429,436 B2 | 4/2013 | Fillingim et al. |
| 2002/0066047 A1 | 5/2002 | Olarig et al. |
| 2002/0069318 A1 | 6/2002 | Chow et al. |
| 2002/0103819 A1 | 8/2002 | Duvillier |
| 2002/0133743 A1 | 9/2002 | Oldfield |
| 2002/0138686 A1 * | 9/2002 | Yang et al. .................. 711/105 |
| 2002/0181134 A1 | 12/2002 | Bunker et al. |
| 2002/0199056 A1 | 12/2002 | Ayukawa et al. |
| 2003/0028704 A1 | 2/2003 | Mukaida |
| 2003/0028726 A1 | 2/2003 | Gaertner et al. |
| 2003/0061296 A1 | 3/2003 | Craddock et al. |
| 2003/0115405 A1 | 6/2003 | Funyu et al. |
| 2003/0126475 A1 | 7/2003 | Bodas |
| 2003/0145230 A1 | 7/2003 | Chiu et al. |
| 2003/0163630 A1 | 8/2003 | Aasheim et al. |
| 2003/0163663 A1 | 8/2003 | Aasheim et al. |
| 2003/0198084 A1 | 10/2003 | Fujisawa et al. |
| 2003/0210601 A1 | 11/2003 | Lin et al. |
| 2004/0003002 A1 | 1/2004 | Adelmann |
| 2004/0064647 A1 | 4/2004 | DeWhitt et al. |
| 2004/0103238 A1 | 5/2004 | Avraham et al. |
| 2004/0148360 A1 | 7/2004 | Mehra et al. |
| 2004/0177054 A1 | 9/2004 | Stern et al. |
| 2004/0186946 A1 | 9/2004 | Lee |
| 2004/0225719 A1 | 11/2004 | Kisley et al. |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0141313 A1 | 6/2005 | Gorobets |
| 2005/0144361 A1 | 6/2005 | Gonzalez |
| 2005/0193166 A1 | 9/2005 | Johnson et al. |
| 2005/0210323 A1 | 9/2005 | Batchelor et al. |
| 2005/0216653 A1 | 9/2005 | Aasheim et al. |
| 2005/0240713 A1 | 10/2005 | Wu |
| 2005/0246510 A1 | 11/2005 | Retnamma et al. |
| 2005/0246558 A1 | 11/2005 | Ku |
| 2005/0257017 A1 | 11/2005 | Yagi |
| 2005/0262150 A1 | 11/2005 | Krishnaswamy |
| 2005/0267882 A1 | 12/2005 | Aupperlee et al. |
| 2005/0270927 A1 | 12/2005 | Hayashi |
| 2005/0273476 A1 | 12/2005 | Wertheimer |
| 2006/0004955 A1 | 1/2006 | Ware et al. |
| 2006/0020744 A1 | 1/2006 | Sinclair |
| 2006/0059326 A1 | 3/2006 | Aasheim et al. |
| 2006/0064556 A1 | 3/2006 | Aasheim et al. |
| 2006/0069870 A1 | 3/2006 | Nicholson et al. |
| 2006/0075057 A1 | 4/2006 | Gildea et al. |
| 2006/0085471 A1 | 4/2006 | Rajan et al. |
| 2006/0095659 A1 | 5/2006 | New et al. |
| 2006/0106990 A1 | 5/2006 | Benhase et al. |
| 2006/0136779 A1 | 6/2006 | Lee et al. |
| 2006/0149893 A1 | 7/2006 | Barfuss et al. |
| 2006/0149916 A1 | 7/2006 | Nase |
| 2006/0179263 A1 | 8/2006 | Song et al. |
| 2006/0184722 A1 | 8/2006 | Sinclair |
| 2006/0184736 A1 | 8/2006 | Benhase et al. |
| 2006/0190552 A1 | 8/2006 | Henze et al. |
| 2006/0230295 A1 | 10/2006 | Schumacher et al. |
| 2006/0248387 A1 | 11/2006 | Nicholson et al. |
| 2006/0265624 A1 | 11/2006 | Moshayedi et al. |
| 2006/0265636 A1 | 11/2006 | Hummler |
| 2006/0294300 A1 | 12/2006 | Lubbers |
| 2007/0016699 A1 | 1/2007 | Minami |
| 2007/0033325 A1 | 2/2007 | Sinclair |
| 2007/0033326 A1 | 2/2007 | Sinclair |
| 2007/0033327 A1 | 2/2007 | Sinclair |
| 2007/0033362 A1 | 2/2007 | Sinclair |
| 2007/0043900 A1 | 2/2007 | Yun |
| 2007/0050571 A1 | 3/2007 | Nakamura |
| 2007/0061508 A1 | 3/2007 | Zweighaft |
| 2007/0083530 A1 | 4/2007 | Lakshminath et al. |
| 2007/0086260 A1 | 4/2007 | Sinclair |
| 2007/0088666 A1 | 4/2007 | Saito |
| 2007/0118713 A1 | 5/2007 | Guterman |
| 2007/0143566 A1 | 6/2007 | Gorobets |
| 2007/0143567 A1 | 6/2007 | Gorobets |
| 2007/0156998 A1 | 7/2007 | Gorobets |
| 2007/0168698 A1 | 7/2007 | Coulson et al. |
| 2007/0198770 A1 | 8/2007 | Horii et al. |
| 2007/0204270 A1 | 8/2007 | Shin |
| 2007/0208790 A1 | 9/2007 | Reuter et al. |
| 2007/0230253 A1 | 10/2007 | Kim |
| 2007/0233937 A1 | 10/2007 | Coulson et al. |
| 2007/0233938 A1 | 10/2007 | Cho et al. |
| 2007/0234021 A1 | 10/2007 | Ruberg et al. |
| 2007/0239926 A1 | 10/2007 | Gyl et al. |
| 2007/0245076 A1 | 10/2007 | Chang et al. |
| 2007/0245094 A1 | 10/2007 | Lee et al. |
| 2007/0260608 A1 | 11/2007 | Hertzberg et al. |
| 2007/0266037 A1 | 11/2007 | Terry |
| 2007/0274150 A1 | 11/2007 | Gorobets |
| 2007/0276994 A1 | 11/2007 | Caulkins et al. |
| 2007/0300008 A1 | 12/2007 | Rogers et al. |
| 2008/0010395 A1 | 1/2008 | Mylly et al. |
| 2008/0052477 A1 | 2/2008 | Lee |
| 2008/0052483 A1 | 2/2008 | Rangarajan et al. |
| 2008/0059820 A1 | 3/2008 | Vaden et al. |
| 2008/0080243 A1 | 4/2008 | Edahiro et al. |
| 2008/0104344 A1 | 5/2008 | Shimozono et al. |
| 2008/0117686 A1 | 5/2008 | Yamada |
| 2008/0126507 A1 | 5/2008 | Wilkinson |
| 2008/0126686 A1 | 5/2008 | Sokolov et al. |
| 2008/0140737 A1 | 6/2008 | Garst et al. |
| 2008/0141043 A1 | 6/2008 | Flynn |
| 2008/0228992 A1 * | 9/2008 | Dumitru et al. ............... 711/100 |
| 2008/0243966 A1 | 10/2008 | Croisettier et al. |
| 2008/0263259 A1 | 10/2008 | Sadovsky et al. |
| 2008/0263305 A1 | 10/2008 | Shu et al. |
| 2008/0263569 A1 | 10/2008 | Shu et al. |
| 2008/0266973 A1 | 10/2008 | Sekar et al. |
| 2008/0282031 A1 | 11/2008 | Tanoue |
| 2008/0301475 A1 | 12/2008 | Felter et al. |
| 2008/0320323 A1 | 12/2008 | Brittain et al. |
| 2009/0031072 A1 | 1/2009 | Sartore |
| 2009/0031098 A1 | 1/2009 | Sartore |
| 2009/0037778 A1 | 2/2009 | Resnick |
| 2009/0091979 A1 | 4/2009 | Shalvi |
| 2009/0091996 A1 | 4/2009 | Chen et al. |
| 2009/0106479 A1 | 4/2009 | Okin et al. |
| 2009/0125700 A1 | 5/2009 | Kisel |
| 2009/0150599 A1 | 6/2009 | Bennett |
| 2009/0150605 A1 | 6/2009 | Flynn et al. |
| 2009/0150621 A1 | 6/2009 | Lee |
| 2009/0157989 A1 | 6/2009 | Karamcheti et al. |
| 2009/0193183 A1 | 7/2009 | Kudo et al. |
| 2009/0239468 A1 | 9/2009 | He et al. |
| 2009/0248763 A1 | 10/2009 | Rajan |
| 2009/0276654 A1 | 11/2009 | Butterworth |
| 2009/0287887 A1 | 11/2009 | Matsuki |

(56) References Cited

U.S. PATENT DOCUMENTS

| | | | |
|---|---|---|---|
| 2009/0292861 A1 | 11/2009 | Kanevsky et al. | |
| 2010/0005228 A1 | 1/2010 | Fukutomi | |
| 2010/0023682 A1 | 1/2010 | Lee et al. | |
| 2010/0049913 A1 | 2/2010 | Marcu et al. | |
| 2010/0082529 A1 | 4/2010 | Mace et al. | |
| 2010/0095059 A1 | 4/2010 | Kisley et al. | |
| 2010/0102999 A1 | 4/2010 | Lee et al. | |
| 2010/0106917 A1 | 4/2010 | Ruberg et al. | |
| 2010/0110748 A1 | 5/2010 | Best | |
| 2010/0124123 A1 | 5/2010 | Lee | |
| 2010/0131826 A1 | 5/2010 | Shalvi et al. | |
| 2010/0146187 A1* | 6/2010 | Grimsrud et al. | 711/103 |
| 2010/0153680 A1 | 6/2010 | Baum et al. | |
| 2010/0205335 A1 | 8/2010 | Phan et al. | |
| 2010/0211737 A1 | 8/2010 | Flynn | |
| 2010/0257304 A1 | 10/2010 | Rajan et al. | |
| 2010/0262738 A1 | 10/2010 | Swing et al. | |
| 2010/0262740 A1 | 10/2010 | Borchers et al. | |
| 2010/0262757 A1 | 10/2010 | Sprinkle et al. | |
| 2010/0262758 A1 | 10/2010 | Swing et al. | |
| 2010/0262759 A1 | 10/2010 | Borchers et al. | |
| 2010/0262760 A1 | 10/2010 | Swing et al. | |
| 2010/0262761 A1 | 10/2010 | Borchers et al. | |
| 2010/0262762 A1 | 10/2010 | Borchers et al. | |
| 2010/0262766 A1 | 10/2010 | Sprinkle et al. | |
| 2010/0262767 A1 | 10/2010 | Borchers et al. | |
| 2010/0262773 A1 | 10/2010 | Borchers et al. | |
| 2010/0262894 A1 | 10/2010 | Swing et al. | |
| 2010/0262979 A1 | 10/2010 | Borchers et al. | |
| 2010/0268974 A1 | 10/2010 | Floyd et al. | |
| 2010/0332871 A1 | 12/2010 | Allalouf et al. | |
| 2010/0332897 A1 | 12/2010 | Wilson | |
| 2011/0004722 A1* | 1/2011 | Jeddeloh | 711/103 |
| 2011/0208911 A1 | 8/2011 | Taguchi et al. | |
| 2011/0225364 A1 | 9/2011 | Edwards | |
| 2012/0030408 A1 | 2/2012 | Flynn et al. | |
| 2012/0239868 A1 | 9/2012 | Ryan et al. | |
| 2012/0254515 A1 | 10/2012 | Melik-Martirosian et al. | |

FOREIGN PATENT DOCUMENTS

| | | |
|---|---|---|
| GB | 0123416.0 | 9/2001 |
| GB | 0123416.0 | 11/2001 |
| KR | 1020000026300 | 5/2000 |
| KR | 1020010034476 | 4/2001 |
| KR | 1020050024278 | 3/2005 |
| KR | 1020060107728 | 10/2006 |
| TW | 200825696 | 6/2008 |
| WO | 0131512 | 5/2001 |
| WO | 0201365 | 1/2002 |
| WO | 2004099989 | 11/2004 |
| WO | 2005103878 | 11/2005 |
| WO | 2006062511 | 6/2006 |
| WO | 2006065626 | 6/2006 |
| WO | 2008130799 | 3/2008 |
| WO | 2010053756 | 5/2010 |
| WO | 2011106394 | 9/2011 |

OTHER PUBLICATIONS

Shibata, Noboru, "19nm 112.8mm2 64Gb Multi-level Flash Memory with 400Mb/s/pin 1.8V Toggle Mode Interface", Flash Memory Summit, 2012, pp. 21 and 23, Santa Clara, California.
Application No. PCT/US2012/024927, 2380.2.62PCT, International Preliminary Report on Patentability and Written Opinion, Aug. 13, 2013.
"ECC and Signal Processing Technology for Solid State Drives and Multi-bit per cell NAND Flash Memories", Forward Insights, 2012, pp. 21, 2nd Edition, Report No. FI-NFL-FSP-0112.
Am29DL322D/323D/324D Data Sheet, Spansion, Jul. 2003, pp. 57, Publication No. 21534 Revision D, Amendment +7, Issue Date Oct. 7, 2004.
"Intel Turbo Memory with User Pinning", Intel NAND Storage Solutions, 2008, pp. 4.
International Bureau, International Search Report for PCT/US2010/048321, Apr. 28, 2011.
International Bureau, International Search Report for PCT/US2010/048320, Apr. 28, 2011.
Leventhal, Adam, Flash Storage Memory, Communications of the ACM, vol. 51, No. 7, Jul. 2008.
United States Patent and Trademark Office, Notice of Allowance, U.S. Appl. No. 12/878,981, Jun. 25, 2012.
PCT/US2010/048321, International Search Report, Apr. 28, 2011.
PCT/US2010/048320, International Search Report, Apr. 28, 2011.
P201021PCT, Application No. PCT/US2011/064728, International Search Report and Written Opinion, Jul. 31, 2012.
Mellor, Chris, "New RAM Shunts Data Into Flash in Power Cuts", The Channel, Oct. 19, 2011, p. 1, http://www.channelregister.co.uk/2011/10/19/viing_hybrid_dram_nand/.
U.S. Appl. No. 12/878,981, Notice of Allowance, Aug. 28, 2012.
AgigaRAM Company, Technology Review, Feb. 2008, p. 1, reviewed Feb. 17, 2010.
"Agiga Tech Introduction", Agigaram, San Diego, California, US.
"Finding the Perfect Memory", Agiga Tech, White Paper, Sep. 3, 2009, pp. 15, Poway, California, US.
"Bulletproof Memory for RAID Servers, Part 1", Agiga Tech, 2009, pp. 4, http://agigatech.com/blog/bulletproof-memory-for-raid-servers-part-1/.
Ajanovic, Jasmin, "PCI Express* (PCIe*) 3.0 Accelerator Features", Intel Corporation, pp. 10.
Malventano, Allyn, "DDRdrive Hits the Ground Running—PCI-E RAM-based SSD", PC Perspective, May 4, 2009, pp. 2, http://www.pcper.com/article.php?aid=704.
Hutsell, Woody, "An In-depth Look at the RamSan-500 Cached Flash Solid State Disk", Texas Memory Systems, White Paper, Mar. 2008, pp. 16.
Shrout, Ryan, "Gigabyte iRAM Solid State SATA Storage Review", PC Perspective, Apr. 5, 2006, pp. 2, http://www.pcper.com/article.php?aid=224&type=expert.
Wu, Michael, "eNVy: A Non-Volatile, Main Memory Storage System", Association of Computing Machinery, 1994, pp. 12, 0-89791-660-3/94/0010, San Jose, California, US.
Lottiaux, Renaud, "OpenMosix, OpenSSI and Kerrighed: A Comparative Study", INRIA Institut National De Recherche en Informatique et en Automatique, Nov. 2004, pp. 23, No. 5399.
"(Take 2): Transcendent Memory ("tmem") for Linux", LWN Merchandise, 2009, pp. 3, http://lwn.net/Articles/340409/.
Rose, Mike, "FPGA PCIe Bandwidth", University of California San Diego, Jun. 9, 2010, pp. 7, Department of Computer Science and Engineering.
Condit, Jeremy, "Better I/O Through Byte-Addressable, Persistent Memory", Microsoft Research, UCLA, Oct. 11-14, 2009, pp. 14, ACM 978-1-60558-752—Mar. 9, 2010, Big Sky, Montana, US.
"NAND Flash 101: An Introduction to NAND Flash and How to Design It in to Your Next Product", Micron Technical Note, 2006, pp. 28, TN-29-19: NAND Flash 101 NAND vs. NOR Comparison.
"Pivot3 RAIGE Storage Cluster", Pivot3 White Paper, Jun. 2007, pp. 17, Technology Overview.
Application No. 200780050983.8, Office Action, May 18, 2011.
Application No. 07865334.2, Office Action, Dec. 10, 2010.
"Information Technology—SCSI Object-Based Storage Device Commands (OSD)", Seagate Technology, Jul. 30, 2004, pp. 187, Project T10/1355-D, Revision 10.
Application No. 07865334.2, Office Action, Jan. 30, 2012.
U.S. Appl. No. 11/952,109, Office Action, Mar. 17, 2011.
U.S. Appl. No. 11/952,109, Office Action, Jul. 1, 2011.
Application No. 200780050970.0, Office Action, Oct. 28, 2010.
Application No. 200780050970.0, Office Action, Jun. 29, 2011.
Application No. 200780050970.0, Office Action, Jan. 5, 2012.
U.S. Appl. No. 11/952,113, Office Action, Dec. 15, 2010.
Application No. 200780051020.X, Office Action, Nov. 11, 2010.
Application No. 200780051020.X, Office Action, Jul. 6, 2011.
Application No. 200780051020.X, Nov. 7, 2011.
Application No. 07865345.8, Office Action, Dec. 10, 2010.
Application No. 07865345.8, Office Action, Jan. 30, 2012.

(56) References Cited

OTHER PUBLICATIONS

"Actel Fusion FPGAs Supporting Intelligent Peripheral Management Interface (IPMI) Applications", Actel, Oct. 2006, pp. 17, Application Note AC286, Mountain View, California, US.
"Method for Fault Tolerance in Nonvolatile Storage", PriorArtDatabase, Feb. 3, 2005, pp. 6, Technical Disclosure.
Ismail, Ari, "Performance Boosting and Workload Isolation in Storage Area Networks with SANCache", Hewlett Packard Laboratories, May 2006, pp. 11, Proceedings of the 23rd IEEE/14th NASA Goddard Conference on Mass Storage Systems and Technologies (MSST 2006), College Park, Maryland, US.
"ASPMC-660", ASINE, downloaded Nov. 18, 2009, pp. 3, http://www.asinegropu.com/products/aspmc660.html.
Brandon, Daniel, Jr., "Sparse Matrices in CS Education", 2009, pp. 6, Consortium for Computing Sciences in Colleges.
Coburn, Joel, "NV-Heaps: Making Persistent Objects Fast and Safe with Next-Generation, Non-Volatile Memories", University of California San Diego, 2011, pp. 13, ACM 978-1-4503-0266.1/11/03, Newport Beach, California, US.
"NAND Flash Memories and Programming NAND Flash Memories Using ELNEC Device Programmers", ELNEC, Aug. 2008, pp. 44, Application Note, Version 2.10/08.2008.
Wright, Charles P., "Amino: Extending ACID Semantics to the File System", p. 1.
Gal, Eran, "A Transactional Flash File System for Microcontrollers", USENIX Association, 2005, pp. 16, 2005 USENIX Annual Technical Conference.
Garfinkel, Simson L., "One Big File Is Not Enough" A Critical Evaluation of the Dominant Free-Space Sanitization Technique, Harvard University, Jun. 28, 2006, pp. 31.
Gutmann, Peter, "Secure Deletion of Data from Magnetic and Solid-State Memory", University of Auckland, Jul. 22-25, 1996, pp. 18, Sixth USENIX Security Symposium Proceedings, San Jose, California, US.
Dan Raz, "Implementing MLC NAND Flash for Cost-Effective, High-Capacity Memory", M-Systems, Sep. 2003, pp. 13, 91-SR-014-02-8L, REV 1.1.
"File System Primer", CoolSolutionsWiki, downloaded Oct. 18, 2006, pp. 5, http://wiki.novell.com/index.php/File_System_Primer.
Application No. PCT/US2011/025885, International Preliminary Report on Patentability, Sep. 7, 2012.
Application No. PCT/US2007/025048, International Search Report and Written Opinion, May 27, 2008.
Application No. PCT/US2007/025048, International Preliminary Report on Patentability, Jun. 18, 2009.
Application No. PCT/US2007/086688, International Search Report and Written Opinion, Apr. 28, 2008.
Application No. PCT/US2007/086688, International Preliminary Report on Patentability, Mar. 16, 2009.
Application No. PCT/US2007/086691, International Search Report and Written Opinion, Aug. 5, 2008.
Application No. PCT/US2007/086691, International Preliminary Report on Patentability, Feb. 16, 2009.
Application No. PCT/US2007/086701, International Search Report and Written Opinion, Jun. 5, 2008.
Application No. PCT/US2007/086701, International Preliminary Report on Patentability, Mar. 16, 2009.
Plank, James S., "A Tutorial on Reed-Solomon Coding for Fault-Tolerance in RAID-like Systems", University of Tennessee, pp. 19, Technical Report CS-96-332, http://www.cs.utk.edu/plank/papers/CS-03-504.html.
Porter, Donald E., "Operating System Transactions", The University of Texas at Austin, Oct. 11-14, 2009, pp. 20.
Rosenblum, Mendel, "The Design and Implementation of a Log-Structured File System", ACM, Feb. 1992, pp. 27, vol. 10, No. 1.
"Introduction to Samsung's Linux Flash File System—RFS", Samsung Electronics, Nov. 2006, pp. 6, Application Note, Version 1.0.
Sears, Russell C., "Stasis: Flexible Transactional Storage", University of California at Berkeley, Jan. 8, 2010, pp. 176, Technical Report No. UCB/EECS-2010-2, http://www.eecs.berkeley.edu/Pubs/TechRpts/2010/EECS-2010-2.html.
Seltzer, Margo Ilene, "File System Performance and Transaction Support", University of California at Berkeley, 1983, pp. 131.
Seltzer, Margo Ilene, "Transaction Support in a Log-Structured File System", Harvard University, pp. 8.
Seltzer, Margo, "Transaction Support in Read Optimized and Write Optimized File Systems", University of California Berkeley, pp. 12.
"Data Management Software (DMS) for AMD Simultaneous Read/Write Flash Memory Devices", Spansion, Jul. 2003, pp. 10, Technology Background, Publication No. 22274, Revision A, Amendment 0.
Spillane, Richard P., "Enabling Transactional File Access via Lightweight Kernel Extensions", Stony Brook University, 2009, pp. 23, Proceedings of the 7th USENIX Conference on File and Storage Technologies.
Tal, Arie, "NAND vs. NOR Flash Technology", M-Systems, Feb. 1, 2002, pp. 3, http://www.electronicproducts.com/Digital_ICs/NAND_vs_NOR_flash_t.
Van Hensbergen, Eric, "Dynamic Policy Disk Caching for Storage Networking", IBM, Nov. 28, 2006, pp. 13, RC24123 (W0611-189).
Volos, Haris, "Mnemosyne: Lightweight Persistent Memory", ACM, 2011, pp. 13, 978-1-4503-0266-1/11/03.
U.S. Appl. No. 11/952,109, Office Action, Nov. 29, 2011.
U.S. Appl. No. 11/952,109, Office Action, May 1, 2012.
U.S. Appl. No. 11/952,113, Office Action, Mar. 6, 2012.
Morgenstern, David, "Is There a Flash Memory RAID in Your Future?", Ziff Davis Enterprise Holdings, Inc., Nov. 8, 2006, pp. 4, http://www.eweek.com.
Application No. PCT/US2007/086687, International Search Report and Written Opinion, May 9, 2008.
Application No. PCT/US2007/086687, International Preliminary Report on Patentability, Mar. 18, 2009.
P201010pct, Application No. PCT/US2011/053795, International Search Report and Written Opinion, May 4, 2012.
Arpaci-Dusseau, Andrea C., "Removing the Costs of Indirection in Flash-based SSDs with Nameless Writes", Microsoft Research, pp. 5.
Leventhal, Adam, "Flash Storage Memory", Communications of the ACM, Jul. 2008, pp. 5, vol. 51, No. 7.
Kawaguchi, Atsuo, "A Flash-Memory Based File System", Hitachi, Ltd., pp. 10.
Mesnier, Mike, "Object-Based Storage", IEEE Communication Magazine, Aug. 2003, pp. 7, Storage Area Networking, 0163-6804/03.
U.S. Appl. No. 12/878,987, Notice of Allowance, Mar. 21, 2013.
U.S. Appl. No. 12/878,987, Office Action, Oct. 18, 2012.
U.S. Appl. No. 60/625,495, filed Nov. 6, 2004.
U.S. Appl. No. 60/718,768, filed Aug. 20, 2005.
U.S. Appl. No. 60/797,127, filed May 3, 2006.
Macko, Peter, "Tracking Back References in Write-Anywhere File System", 8th USENIX Conference on File and Storage Technologies, Feb. 23-26, 2010, pp. 15, San Jose, California, US.
U.S. Appl. No. 13/834,955, Final Office Action, Sep. 8, 2014.
U.S. Appl. No. 13/834,955, Office Action, Apr. 4, 2014.
Application No. 201080050702.0, Office Action, Feb. 20, 2014.
Application No. 10816108.4, Search Report, Apr. 2, 2014.
U.S. Appl. No. 11/952,101, Office Action, Jan. 6, 2011.
U.S. Appl. No. 13/015,458, Office Action, Sep. 7, 2012.
Application No. 12176826.1, Search Report, Dec. 10, 2012.
U.S. Appl. No. 13/189,402, Notice of Allowance, Nov. 15, 2012.
U.S. Appl. No. 13/372,430, Office Action, Aug. 6, 2014.
U.S. Appl. No. 13/372,430, Office Action, Nov. 7, 2013.
U.S. Appl. No. 13/372,430, Final Office Action, Apr. 21, 2014.
Application No. PCT/US2007/086702, International Preliminary Report on Patentability, Nov. 19, 2009.
Application No. PCT/US2007/086702, International Search Report and Written Opinion, Nov. 4, 2009.
Hutsell, Woody, "An In-depth Look at the RamSan-500 Cached Flash Solid State Disk", Texas Memory Systems, Mar. 2008, pp. 16.
Suh, Kang-Deog, "A 3.3 V 32 Mb NAND Flash Memory with Incremental Step Pulse Programming Scheme", IEEE Journal of Solid-State Circuits, Nov. 30, 1995, pp. 8, vol. 30, No. 11, New York, US.

(56) References Cited

OTHER PUBLICATIONS

Application No. PCT/US2011/065927, International Search Report, Aug. 28, 2012.
Application No. PCT/US2012/024927, Written Opinion, Oct. 12, 2012.
Application No. PCT/US2012/024927, International Search Report, Oct. 16, 2012.
"File Level Caching", ADABAS Caching Facility, May 11, 2004, pp. 9.
Shrout, Ryan, "Gigabyte iRAM Solid State SATA Storage Review", PC Perspective, Apr. 5, 2006, pp. 6, http://www.pcper.com/article.php?aid+224&type+expert.
Kim, Jin-Ki, "Low Stress Program and Single Wordline Erase Schemes for NAND Flash Memory", MOSAID Technologies Incorporated, 2007, pp. 2, Ottawa, Ontario, Canada.
Application No. PCT/US2011/045801, International Search Report, Apr. 6, 2012.
Application No. PCT/US2011/036539, International Preliminary Report on Patentability, Nov. 13, 2012.
"Introduction to Samsung's Linus Flash File System—RFS", Samsung Electronics Application Noted, Nov. 2006, pp. 6, Version 1.0.
Volos, Haris, "Mnemosyne: Lightweight Persistent Memory", ASPLOS, Mar. 5-11, 2011, pp. 13, Newport Beach, California, US.
Application No. EP11813216, Search Report, Nov. 7, 2013.
U.S. Appl. No. 13/015,458, Notice of Allowance, Sep. 19, 2012.
Application No. PCT/US2011/025885, International Search Report and Written Opinion, Sep. 28, 2011.
U.S. Appl. No. 13/652,427, Office Action, Nov. 20, 2014.

\* cited by examiner

APPARATUS, SYSTEM, AND METHOD FOR MANAGING LIFETIME OF A STORAGE DEVICE

CROSS-REFERENCES TO RELATED APPLICATIONS

This application claims priority to U.S. Provisional Patent Application No. 61/392,845 entitled "APPARATUS, SYSTEM, AND METHOD FOR MANAGING A LIFETIME OF A STORAGE DEVICE" and filed on Oct. 13, 2010 for Jeremy Fillingim and to U.S. patent application Ser. No. 12/878,987, entitled "APPARATUS, SYSTEM, AND METHOD FOR POWER REDUCTION IN A STORAGE DEVICE" and filed on Sep. 9, 2010 for Jeremy Fillingim et al., both of which are incorporated herein by reference.

FIELD OF THE INVENTION

This invention relates to storage devices and more particularly relates to maintaining a lifetime of a storage device.

BACKGROUND

Description of the Related Art

Storage media for data storage devices can degrade with age and use. It can be problematic for a manufacturer or vendor to warrantee or guarantee a storage device for a predefined amount of time, as usage can vary widely by different users of the storage device. If more data is written to one storage device than another during the same time period, the storage device will typically wear out at a faster rate. Without knowing beforehand what the use case or operating load for a storage device is going to be, a manufacturer or vendor often cannot reliably determine an amount of time to warrantee or guarantee the storage device.

SUMMARY

Methods are presented to manage lifetime for a data storage device. In one embodiment, a method includes determining a write bandwidth target for a data storage device. A method, in a further embodiment, includes monitoring write bandwidth of the data storage device relative to the write bandwidth target. In another embodiment, a method includes adjusting execution of one or more write operations on the data storage device in response to the write bandwidth of the data storage device failing to satisfy the write bandwidth target. In a further embodiment, a method includes adjusting the write bandwidth target based on a total amount of data written to the data storage device, so that the total amount of data written does not exceed a threshold within the lifetime of the data storage device.

Apparatuses are presented to manage lifetime for a data storage device. In one embodiment, a target module is configured to determine a write bandwidth target for a data storage device. An audit module, in a further embodiment, is configured to monitor write bandwidth of the data storage device relative to the write bandwidth target. A throttle module, in one embodiment, is configured to adjust execution of one or more write operations on the data storage device in response to the write bandwidth of the data storage device failing to satisfy the write bandwidth target. In a further embodiment, the target module is configured to dynamically adjust the write bandwidth target based on the elapsed temporal lifetime of the data storage device.

Systems are presented to manage lifetime for a data storage device. In one embodiment, a data storage device contains multiple storage elements. In a further embodiment, a target module determines a write bandwidth target for each data storage element. In a certain embodiment, an audit module monitors write bandwidth of each data storage element relative to the write bandwidth target. In a further embodiment, a throttle module adjusts execution of one or more write operations on each data storage element in response to the write bandwidth of the data storage element failing to satisfy the write bandwidth target.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1A:
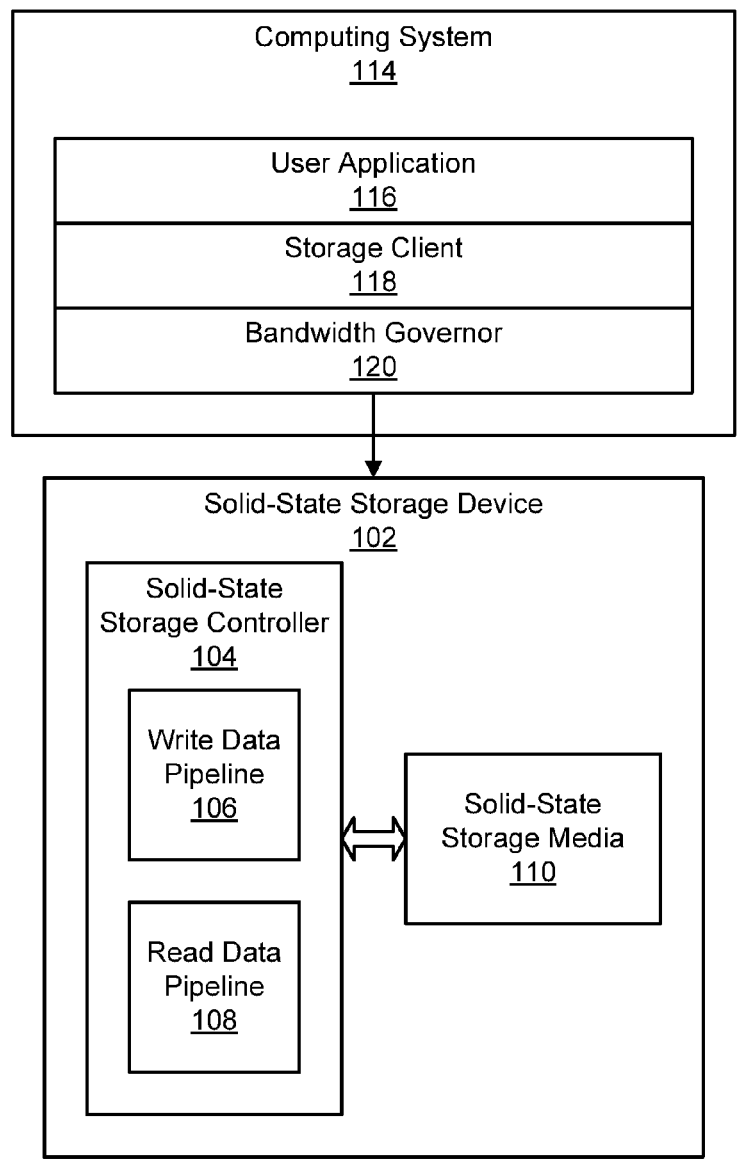
FIG. 1A is a schematic block diagram illustrating one embodiment of a system for managing lifetime of a storage device.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. These features and advantages of the present invention will become more fully apparent from the following description and appended claims, or may be learned by the practice of the invention as set forth hereinafter.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

System for Reducing Storage Device Power Consumption

FIG. 1A depicts one embodiment of a system 100 for managing lifetime of a storage device 102. In certain situations, it is beneficial to have a storage device 102 operate at less than full write bandwidth to ensure that an endurance rating is not surpassed during a defined temporal lifetime for the storage device 102, or the like. As used herein, temporal lifetime is the product lifetime, the time during which the product is expected to operate and/or perform its functions, the time the product is warranted or guaranteed, a custom lifetime defined by a user, or the like.

In the depicted embodiment, the system 100 includes a computing system 114 and a storage device 102. The computing system 114, in the depicted embodiment, includes a user application 116, a storage client 118, and a bandwidth governor module 120. The computing system 114 may be a computer such as a server, laptop, desktop, a mobile device, or other computing device known in the art. The computing system 114 typically includes components such as memory, processors, buses, and other components as known to those of skill in the art.

The computing system 114 stores data in the storage device 102 and communicates data with the storage device 102 via a communications connection. The storage device 102 may be internal to the computing system 114 or external to the computing system 114. The communications connection may be a bus, a network, or other manner of connection allowing the transfer of data between the computing system 114 and the storage device 102. In one embodiment, the storage device 102 is connected to the computing system 114 by a PCI connection such as PCI express ("PCI-e"). The storage device 102 may be a card that plugs into a PCI-e connection on the computing system 114. In other embodiments, the storage device 102 may be connected to the computing system 114 over serial advanced technology attachment ("serial ATA" or "SATA"), parallel ATA ("PATA"), small computer system interface ("SCSI"), IEE 1394 ("FireWire"), Fiber Channel, universal serial bus ("USB"), PCIe-AS, a data network connection, or another connection with the computing system 114.

The storage device 102 provides nonvolatile storage for the computing system 114. FIG. 1A shows the storage device 102 as a nonvolatile solid-state storage device 102 comprising a solid-state storage controller 104, a write data pipeline 106, a read data pipeline 108, and nonvolatile solid-state storage media 110. The storage device 102 may contain additional components that are not shown in order to provide a simpler view of the storage device 102.

The solid-state storage media 110 stores data such that the data is retained even when the storage device 102 is not powered. Examples of solid-state storage media 110 include flash memory, nano random access memory ("NRAM"), magneto-resistive RAM ("MRAM"), dynamic RAM ("DRAM"), phase change RAM ("PRAM"), Racetrack memory, Memristor memory, and nanocrystal wire-based memory, silicon-oxide based sub-10 nanometer process memory, graphene memory, Silicon-Oxide-Nitride-Oxide-Silicon ("SONOS"), Resistive random-access memory ("RRAM"), programmable metallization cell ("PMC"), conductive-bridging RAM ("CBRAM"), and the like.

While, in the depicted embodiment, the storage device 102 includes solid-state storage media 110, in other embodiments, the storage device 102 may include magnetic media such as hard disks, tape, and the like, optical media, or other nonvolatile data storage media. The storage device 102 also includes a storage controller 104 that coordinates the storage and retrieval of data in the solid-state storage media 110. The storage controller 104 may use one or more indexes to locate and retrieve data, and perform other operations on data stored in the storage device 102. For example, the storage controller 104 may include a groomer for performing data grooming operations such as garbage collection.

As shown, the storage device 102, in certain embodiments, implements a write data pipeline 106 and a read data pipeline 108, an example of which is described in greater detail below with regard to FIG. 4. The write data pipeline 106 may perform certain operations on data as the data is transferred from the computing system 114 into the solid-state storage media 110. These operations may include, for example, error correction code ("ECC") generation, encryption, compression, and others. The read data pipeline 108 may perform similar and potentially inverse operations on data that is being read out of solid-state storage media 110 and sent to the computing system 114.

The computing system 114, in the depicted embodiment, includes a user application 116, a storage client 118, and a bandwidth governor module 120. In one embodiment, the user application 116 is a software application operating on or in conjunction with the storage client 118. The storage client 118 manages files and data and utilizes the functions and features of the storage controller 104 and associated storage media 110. Representative examples of storage clients 118 include, but are not limited to, a server, a file system, an operating system, a database management system ("DBMS"), a volume manager, and the like.

The storage client 118, in one embodiment, is in communication with the storage controller 104 of the storage device 102 through a software driver, device driver or software controller for the storage device 102. At least a portion of the bandwidth governor module 120, in one embodiment, is part of a device driver or software controller for the storage device 102. In one embodiment, the bandwidth governor module 120 is entirely embodied in a device driver or software controller on the computing system 114. In a further embodiment, at least a portion of the bandwidth governor module 120 is part of a hardware controller for the storage device 102. Similarly, the storage controller 104 that manages the storage media 110, in certain embodiments, may include various hardware and software controllers, drivers, and software.

As noted above, in certain embodiments, it may be beneficial to have a storage device 102 operate at less than full write bandwidth to ensure that an endurance rating is not surpassed during a defined temporal lifetime for the storage device 102, or the like. A vendor, manufacturer, distributor, retailer, and/or user of the storage device 102, in certain embodiments, may desire to warrant or guarantee that the storage device 102 will remain functional (have not exhausted the endurance rating) for at least a temporal lifetime, defined as an amount of time that the storage device 102 is in use. For many types of storage devices 102, the temporal lifetime of the storage device 102 may be directly impacted by an endurance rating, write data lifetime, byte lifetime, or the like. An endurance rating, write data lifetime, or byte lifetime for a storage device 102, as used herein, comprises a total physical amount of data written to the storage device 102 before solid-state storage media 110 or other components of the storage device 102 wear-out from use, are expected to wear-out from use, or the like.

Wear-out for the solid-state storage media 110 as used herein means one or more of that the integrity of data stored on the media 110 is no longer guaranteed and/or manageable, the storage cells of the media 110 are no longer functioning as designed, or some other failure of the media 110 prevents normal use. Once components such as storage elements or dies of the storage device 102 wear-out, the storage device 102 may prevent further use of the component. Alternatively, the storage device 102 may permit further use of the component so long as the degraded functionality and/or data integrity is accounted for either by the storage device 102 or the storage client 118. In order to guarantee a specified temporal lifetime, in one embodiment, the bandwidth governor module 120 throttles or otherwise adjusts one or more write operations on the storage device 102 to ensure that an endurance rating value is not exceeded within a defined temporal lifetime of the storage device 102.

The bandwidth governor module 120, in one embodiment, monitors a write bandwidth of the storage device 102 relative to a write bandwidth target. The write bandwidth of the storage device 102, as used herein, is a rate that data is written to the storage device 102, which may be measured as an amount of data written to the storage device 102 during a specified period of time, or the like. In one embodiment, the write bandwidth is an average write bandwidth to allow for bursts of write data for the storage device 102 within the average. A write bandwidth target, as used herein, is a target write bandwidth that, if satisfied, ensures that the endurance rating for the storage device 102 is not met before the temporal lifetime for the storage device 102. The write bandwidth target, in certain embodiments, may be a target for an average write bandwidth, or the like, to account for bursts of write data.

In one embodiment, the bandwidth governor module 120 adjusts execution of write operations on the storage device 102 based on the write bandwidth of the storage device 102. Adjusting execution of write operations, such as throttling or slowing execution of operations, in one embodiment, ensures that, at least on average, a write bandwidth target is met, and no more than an amount of data associated with an endurance rating of the storage device 102 may be written to the storage device 102 within a specified temporal lifetime of the storage device 102. In one embodiment, the bandwidth governor module 120 verifies whether the write bandwidth of the storage device 102 satisfies the write bandwidth target in response to adjusting execution of operations on the storage device 102.

In certain embodiments, the bandwidth governor module 120 may dynamically determine and/or adjust the write bandwidth target for the storage device 102 over time. For example, in one embodiment, the bandwidth governor module 120 may adjust the write bandwidth target based on a total amount of data written to the storage device 102 at a point in time and an elapsed amount of the temporal lifetime at that point in time. By dynamically adjusting the write bandwidth target and determining the write bandwidth as an average, such as a total average, a moving average, a decaying average, or the like, in certain embodiments, the bandwidth governor module 120 imposes minimal write bandwidth limits while ensuring that the endurance rating is not exceeded within the temporal lifetime of the storage device 102. In one embodiment, the bandwidth governor module 120 may impose little or no bandwidth governing for normal usage patterns of a storage device 102. While a write bandwidth target may be less than a maximum write bandwidth for a storage device 102, by monitoring an average write bandwidth for the storage device 102, the bandwidth governor module 120 may allow write operations up to the maximum write bandwidth for the storage device 102 in bursts, while continuing to maintain the temporal lifetime of the storage device 102.

In one embodiment, the bandwidth governor module 120, a vendor, a manufacturer, a user, or the like, stores an endurance rating, a temporal lifetime value, a static or default write bandwidth target, or the like in persistent storage of the storage device 102. One example of persistent storage that may store an endurance rating value and a temporal lifetime value is a programmable read only memory ("PROM") that stores identification data for the storage device 102, or the like. The storage device 102, in certain embodiments, may include a module identification data PROM ("MID-PROM") that stores vendor specific device characteristics, such as an endurance rating value, a temporal lifetime value, a firmware version number, a hardware version number, a serial number, vendor specific device characteristics, parameters relating programming the attached solid-state storage media, or the like.

In one embodiment, reliability engineers or the like of a vendor of the storage device 102 determine the endurance rating value and the temporal lifetime value for a particular storage device 102, a class of storage devices 102, or the like. In certain embodiments, the vendor determines a set of endurance rating values and/or temporal lifetime values that vary based on other factors such as the operating environment of the device, (temperature extremes, high vibration environments, radiation exposure, high performance applications such as military use, etc.). The endurance rating value and the temporal lifetime value, in various embodiments, may be based on a variety of factors including measured lifetimes for a storage device 102 or class of storage devices 102, a type of storage media 110 used in a storage device 102, a manufacturer's recommendation for a storage device 102, and/or other storage device 102 reliability factors. In addition, the vendor for the storage device 102 may perform various experiments, simulations, and modeling tests of the solid-state storage media 110 and other components of the solid-state storage device 102 in order to derive a suitable endurance rating and temporal lifetime for a specific storage device 102. In other embodiments, a user of the storage device 102 may select an endurance rating and/or a temporal lifetime for a storage device 102 as a custom user-selectable setting, or the like.

Deriving the suitable endurance rating and temporal lifetime for solid-state storage media 110 may include translating a Program/Erase cycle count provided by a solid-state storage media 110 manufacturer into an endurance rating and temporal lifetime that factors in the architecture and wear-leveling processes used in the storage device 102. The architecture and wear-leveling processes may include use of log-based sequentially writing to the storage media 110, storage space recovery, data integrity protections such as ECC, organizing the media 110 into banks and channels, and the like.

The endurance rating and temporal lifetime may factor in the specific geometry and/or type of the solid-state storage media 110, manufacturer of the solid-state storage media 110, quality of the parts used in the storage device 102, and/or whether the storage device 102 includes solid-state storage media 110 from a combination of solid-state storage media 110 manufacturers.

The endurance rating value, in one embodiment, is expressed in data units, such as bits, bytes, kilobytes, megabytes, gigabytes, terabytes, petabytes, kibibytes, mebibytes, gibibytes, tebibytes, pebibytes, or the like. The temporal lifetime value, in one embodiment, is expressed in time units, such as seconds, minutes, hours, days, months, years, or the like. For example, in one embodiment, the storage device 102 stores the endurance rating value as a binary representation of a number of terabytes, petabytes, or the like and stores the temporal lifetime value as a binary representation of a number of days, years, or the like.

In one embodiment, the bandwidth governor module 120 provides a user an option of opting out of write bandwidth governing for the storage device 102. For example, in certain embodiments, the bandwidth governor module 120 may present a user with the option of either enabling or disabling write bandwidth governing in response to the user installing the storage device 102, installing a driver for the storage device 102, or the like. In another embodiment, a software tool (GUI or CLI) or other utility for the storage device 102 may provide a user with the ability to opt out of write bandwidth governing for the storage device 102. The software tool may warn the user and put the user on notice that opting out of governing write bandwidth voids any existing warranties. The software tool may update the MID-PROM to reflect the change in opting out of bandwidth governing such that use of the storage device 102 after a power cycling event or in a different system retains the opt-out setting. In still another embodiment, the bandwidth governor module 120 provides a user the option of opting out of write bandwidth governing as a user-selectable configuration setting in a management program for the storage device 102, a driver for the storage device 102, or the like.

The bandwidth governor module 120, in a further embodiment, stores in persistent storage of the storage device 102 an indicator of whether a user has opted out of write bandwidth governing. Opting out of write bandwidth governing, in certain embodiments, voids a warranty of the storage device 102. The bandwidth governor module 120, in one embodiment, prevents a user from re-enabling write bandwidth governing or opting back in to using write bandwidth governing once a user has opted out of write bandwidth governing. For example, in certain embodiments, the bandwidth governor module 120 may lock or disable a setting for write bandwidth governing once a user has opted out, and prevents user access to the indicator in persistent storage of the storage device 102 indicating that the user has opted out. Alternatively, or in addition, management tools for the storage device 102 may be programmed to permit only opting out and no ability to reverse the opt-out setting. In one embodiment, the bandwidth governor module 120 stops governing write bandwidth for the storage device 102 once the temporal lifetime of the storage device 102 has expired. In another embodiment, the bandwidth governor module 120 stops governing write bandwidth for the storage device 102 once the endurance rating for the storage device 102 can no longer be exceeded during the temporal lifetime of the storage device 102. The bandwidth governor module 120 is discussed in greater detail below with regard to FIGS. 7A and 7B.

The user application 116, storage client 118, or computing system 114, in one embodiment, may provide a write bandwidth target, an endurance rating value, a temporal lifetime value, and/or other write bandwidth management information to the bandwidth governor module 120 over a communications channel, such as a data bus, a PCI-e bus, a data network, or the like. In one embodiment, the bandwidth governor module 120 supports a protocol, an application programming interface ("API"), or the like for setting a write bandwidth target, an endurance rating value, a temporal lifetime value, and/or other write bandwidth management information. In one embodiment, the bandwidth governor module 120 sets a write bandwidth target dynamically based on a specified endurance rating value and temporal lifetime value for the storage device 102 and on a monitored write bandwidth of the storage device 102.

In one embodiment, the system 100 may include several bandwidth governor modules 120 for different storage devices 102. In another embodiment, a single bandwidth governor module 120 may govern write bandwidths separately for several different storage devices 102. In a further embodiment, one or more bandwidth governor modules 120 may govern write bandwidths separately for different storage elements within the storage device 102. For example, in one embodiment, the storage device 102 is a solid state storage device with multiple dual in-line memory modules ("DIMMs"). One or more bandwidth governor modules 120 may adjust write operations separately for each DIMM independently of the other DIMMs to satisfy individual write data and temporal lifetimes for each DIMM. In another embodiment, the bandwidth governor module 120 may govern a shared write bandwidth for multiple DIMMS or other elements of a storage device 102 to satisfy shared write data and temporal lifetimes for the multiple DIMMs.

The write bandwidth target, as used herein, is a target rate for writing data to the storage device 102 that satisfies an endurance rating parameter and a temporal lifetime parameter for the storage device 102. In certain embodiments, the write bandwidth target is a rate for writing data such that the entire endurance rating of the storage device 102 is exhausted (complete media "wear out") at, or later than, the expiration of the temporal lifetime of the storage device 102 but not before the expiration of the temporal lifetime. In certain embodiments, the bandwidth governor module 120 may permit write bandwidths over the write bandwidth target for certain periods so long as an average write bandwidth falls below the write bandwidth target. In certain embodiments, the write bandwidth target is a single value. In other embodiments, the write bandwidth target includes a baseline write bandwidth, but allows for bursts and may optionally provide bandwidth restrictions on bursting above a certain level, for example by using a moving average or a decaying average for the monitored write bandwidth, or the like.

A write bandwidth of the storage device 102, in various embodiments, may satisfy a write bandwidth target by being less than the write bandwidth target, by falling away from the write bandwidth target, by being outside of a predefined range around the write bandwidth target, by being inside a predefined range around the write bandwidth target, and/or by having another predefined relationship with the write bandwidth target. Conversely, a write bandwidth, in various embodiments, may fail to satisfy a write bandwidth target by approaching the write bandwidth target, by exceeding the write bandwidth target, by being outside of a predefined range around the write bandwidth target, by being inside a predefined range around the write bandwidth target, and/or by having another predefined relationship with the write bandwidth target. One of skill in the art, in view of this disclosure, will recognize many possible types of write bandwidth targets, and corresponding ways that a write bandwidth can satisfy or fail to satisfy the different types of write bandwidth targets.

Figure 1B:
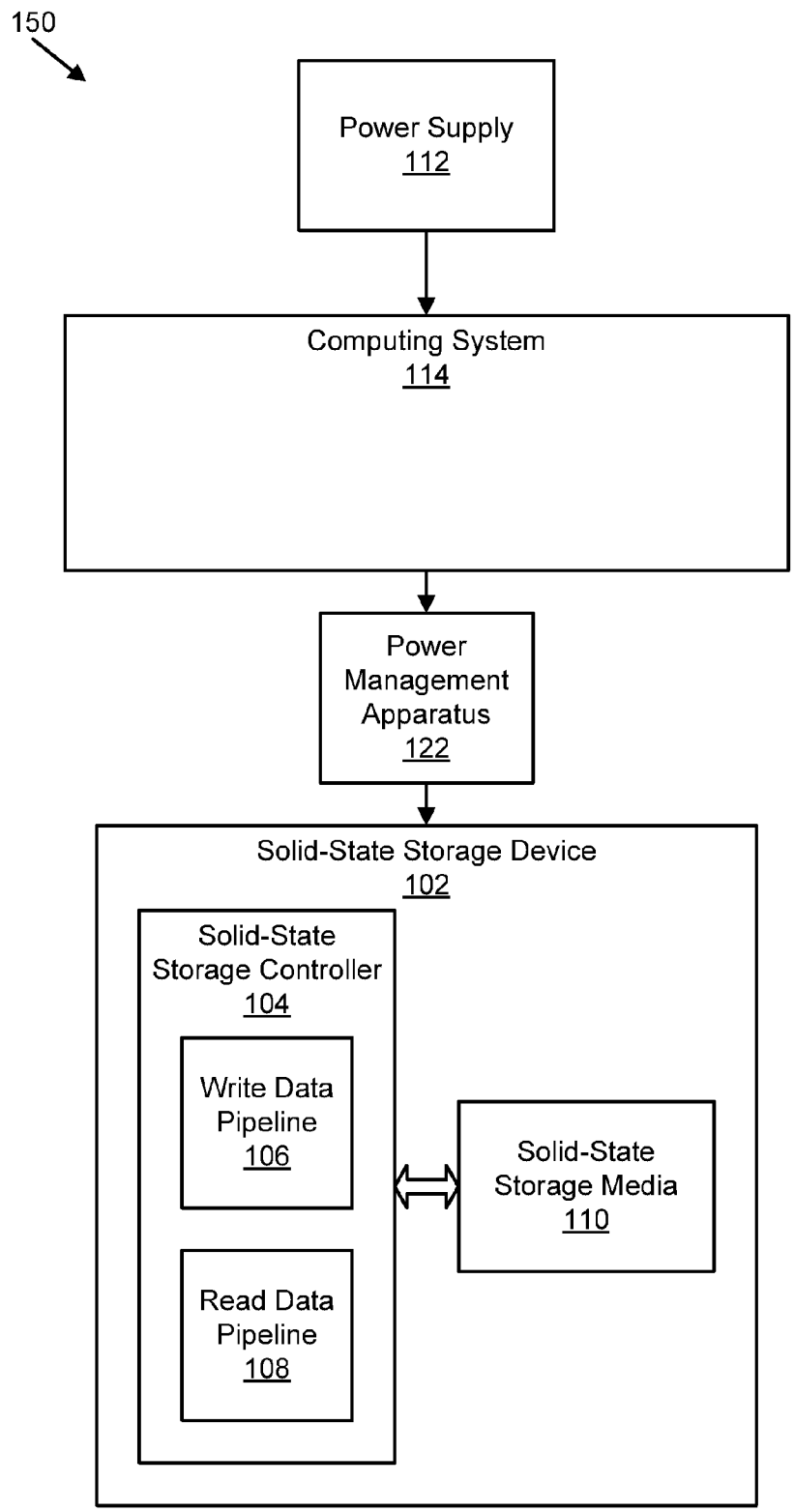
FIG. 1B is a schematic block diagram illustrating one embodiment of a system for managing power consumption of a storage device.

FIG. 1B depicts one embodiment of a system 150 for reducing power consumption and/or a thermal state of a storage device 102. In certain situations, it is beneficial to have a storage device 102 operate at less than full power due to constraints imposed by the system 150. In the depicted embodiment, the system 150 includes a power supply 112, the computing system 114, a power management apparatus 122, and the storage device 102. In one embodiment, the computing system 114 and/or the storage device 102 are substantially similar to the computing system 114 and/or the storage device 102 described above with regard to FIG. 1A. In one embodiment, the power management apparatus 122 may be integrated with and/or in communication with the bandwidth governor module 120 described above with regard to FIG. 1A, and may adjust write bandwidth to satisfy power consumption demands, thermal demands, or the like.

The power supply 112, in the depicted embodiment, provides electrical power to the computing system 114 and, through it, the storage device 102 and other components of the computing system 114. The power supply 112 may receive power from a standard electrical connection and transform the power received into one or more voltages that can be used by the computing system 114. The power supply 112 may be a battery or other power source used in computing systems 114. The power supply 112 may be internal or external to the computing system 114. Those of skill in the art, in view of this disclosure, will appreciate that there are a variety of different configurations and types of power supplies 112.

The storage device 102, in the depicted embodiment, receives electric power from the power supply 112 that provides the storage device 112 with power to perform data storage operations such as reads, writes, erases, etc. The storage device 102, in the depicted embodiment, receives the power from the power supply 112 over a power connection with the computing system 114. In certain embodiments, a power connection and the communications connection discussed above are part of the same physical connection between the computing system 114 and the storage device 102. For example, the storage device 102 may receive power over PCI, PCI-e, SATA, PATA, SCSI, FireWire, Fiber Channel, USB, PCIe-AS, or another connection with the computing system 114. In one embodiment, the computing system 114 distributes power from the power supply 112 through one or more slots, ports, or the like of a motherboard.

In other embodiments, the storage device 112 may connect to the power supply 112 directly, independently of a computing system 114. For example, the power supply 112 may be a power converter (often called a power brick), a power supply unit ("PSU") for the storage device 102, or the like. Those of skill in the art will appreciate, in view of this disclosure, that there are various ways by which a storage device 102 may receive power, and the variety of devices that can act as the power supply 112 for the storage device 102.

In one embodiment, the computing system 114 includes one or more other components in addition to the storage device 102, such as additional storage devices, graphics processors, network cards, and the like that also receive power from the power supply 112. Those of skill in the art, in view of this disclosure, will appreciate the different types of components that may be in a computing system 114. The components may be internal or external to the computing system 114. In one embodiment, some of the components may be PCI or PCI-e cards that connect to the computing system 114 and receive power through the computing system 114.

The system 150, in the depicted embodiment, also includes a power management apparatus 122. In certain embodiments, the power management apparatus 122 may be implemented as part of the storage controller 104. In further embodiments, the power management apparatus 122 may be, for instance, implemented as part of a software driver of the computing system 114, implemented in firmware for the storage device 102, or the like. In other embodiments, the power management apparatus 122 may be implemented partially in a software driver and partially in the storage controller 104, or the like. In various embodiments, the power management apparatus 122 may be integrated with, in communication with, and/or operate in conjunction with a bandwidth governor module 120.

As noted above, the computing system 114 may be configured to accept more components, such as storage devices 102, than the computing system 114 can provide power for under all conditions. The computing system 114 may not be able to provide sufficient power to a storage device 102 operating at or near full performance, or providing sufficient power may damage the computing system 114 and/or the power supply 112, especially if other components are also drawing power.

Other situations may arise in which it is important to tailor the performance of the storage device 102 or other computer components based on power considerations. In certain embodiments, the power management apparatus 122 manages a variety of states that correspond to various power conditions. One possible state is a power disruption state where the available power is reduced to an amount that can be provided by a secondary power supply, or the like. In this state, the power management apparatus 122 may perform power disruption or power failure management.

The power management apparatus 122, in one embodiment, monitors a power consumption rate of the storage device 102 relative to a power consumption target. In a further embodiment, the power management apparatus 122 adjusts execution of operations on the storage device 102 based on the power consumption rate. Adjusting execution of operations, such as throttling or slowing execution of operations, in one embodiment, reduces the power consumption rate of the storage device 102. In one embodiment, the power management apparatus 122 verifies whether the power consumption rate of the storage device 102 satisfies the power consumption target in response to adjusting execution of operations on the storage device 102. In another embodiment, the power management apparatus 122 manages and schedules execution of operations on the storage device 102 to stay within the power consumption target.

The power management apparatus 122, in one embodiment, references operations parameters, such as the power consumption target, that specify performance limitations on the storage device 102 and/or on other components. The performance limitations are related to power consumption of the storage device 102, or of other components. The parameters may be designed, coded, hard corded, and/or programmed directly into the power management apparatus 122, or may be sent to the power management apparatus 122 by the computing system 114 or by another power management apparatus 122. In one embodiment, the system 150 includes a plurality of power management apparatuses 122 for different components. In certain embodiments, the different power management apparatuses 122 share information with each other; in other embodiments, each power management apparatus 122 acts independently. One embodiment of a system with a plurality of power management apparatuses 122 is described below with regard to FIG. 5.

In certain embodiments, the power management apparatus 122 may dynamically adjust the power allocation for the storage device 102. The computing system 114 may dedicate more or less power to the storage device 102 at a particular time; for example, in the event that another component is a graphics card, there may be considerably less power available to the storage device 102 during graphics intensive operations. Similarly, more power may be available to the storage device 102 when the computing system 114 is not performing intensive graphics operations. The computing system 114 may thus dynamically change the allocation of power and send appropriate parameters to the power management apparatus 122. In certain embodiments, the computing system 114 includes software, firmware, hardware, or some combination thereof that is specifically tailored to determine how much power is available in the computing system 114.

The computing system 114, in one embodiment, may send a power consumption target and/or other power management information to the power management apparatus 122 over a communications channel, such as a PCI-e bus, a data network, or the like. In one embodiment, the power management apparatus 122 supports a protocol, an API, or the like for setting a power consumption target. The power consumption target, in one embodiment, is user configurable or selectable, through an interface on the computing system 114, an interface of the storage device 102, or the like.

In other embodiments, the power management apparatus 122 sets a power management plan or parameters without receiving parameters from the computing system 114. The power management apparatus 122 may dynamically adjust the power allocation to different elements within the storage device 102. For example, in one embodiment, the storage device 102 is a solid state storage device with multiple DIMMs. The power management apparatus 122 may have (or set) a particular power limit (such as 25 watts), which may also be referred to as a power budget, a power consumption target, or a power consumption ceiling, for the entire storage device 102 and may dynamically allocate power to remain within the constraints of the power budget. Thus, one DIMM performing a number of energy intensive operations may be allocated 20 watts while another DIMM is allocated 5 watts until the energy intensive operations are complete.

The power consumption target, as used herein, is the amount of power that a power supply system is configured to make available, and/or provide to the storage device 102 and/or other components supplied by the power supply system. In certain embodiments, the power consumption target is a power consumption ceiling, a maximum allowed upper bound for the power consumption rate of the storage device 102. In other embodiments, while the power consumption target is a maximum amount, the power supply 112 may permit uses of power over the maximum amount so long as the average power use falls below a power consumption target. In certain embodiments, the power consumption target is a single power value. In other embodiments, the power consumption target includes a baseline power, but allows for bursts and provides power restrictions on bursting. For example, these restrictions might include magnitude, duration, rise time, fall time, and the like. In a further embodiment, the power consumption target is a range of allowable power consumption rates, or the like. The power consumption target, in one embodiment, is defined as a value or range of values having a standard power metric unit, such as the watt ("W").

A power consumption rate of the storage device 102 or of another component, in various embodiments, may satisfy a power consumption target by falling away from the power consumption target, by being outside of a predefined range around the power consumption target, by being inside a predefined range around the power consumption target, and/or by having another predefined relationship with the power consumption target. Conversely, a power consumption rate, in various embodiments, may fail to satisfy a power consumption target by approaching the power consumption target, by exceeding the power consumption target, by being outside of a predefined range around the power consumption target, by being inside a predefined range around the power consumption target, and/or by having another predefined relationship with the power consumption target. One of skill in the art, in view of this disclosure, will recognize many possible types of power consumption targets, and corresponding ways that a power consumption rate can satisfy or fail to satisfy the different types of power consumption targets.

The computing system 114 may dynamically change the power consumption target for the storage device 102 in response to changes in the power supply 110. The power consumption target may also be dynamically allocated in response to changes in workload, as discussed in greater detail below. For example, if the power supply 110 is connected to a source such as an electrical outlet, the computing system 114 may specify one power consumption target. If the power supply 110 is disconnected from the source, such that the power supply 110 is operating on battery power, the computing system 114 may decrease the power consumption target for the storage device 102. In one embodiment, the computing system 114 may dynamically change the power consumption target for the storage device 102 as the battery life decreases. In certain embodiments with multiple components, the power consumption targets for the components are not adjusted downward equally as battery life decreases; for example, the power consumption target for a component providing an active wireless connection may remain stable or be reduced at a slower rate than that of the storage device 102, or the like.

In one embodiment, the power management apparatus 122 provides thermal management for the storage device 102. The power management apparatus 122, in one embodiment, monitors a temperature for the storage device 102 relative to a thermal ceiling or other thermal threshold. The power management apparatus 122, in one embodiment, adjusts execution of operations on the storage device 102 in response to the temperature of the storage device 102 approaching the thermal ceiling. In a further embodiment, the power management apparatus 122 verifies that the temperature of the storage device 102 is moving away from the thermal ceiling in response to adjusting execution of the operations.

In one embodiment, the power management apparatus 122 combines thermal adjustments and power adjustments into a single combined adjustment. In a further embodiment, the power management apparatus 122 (and/or the bandwidth governor module 120 described above) combines power adjustments and/or thermal adjustments with write bandwidth adjustments for execution of operations into a single combined adjustment. The power management apparatus 122 and/or the bandwidth governor module 120, in one embodiment, combine multiple adjustments into a single combined adjustment by selecting the largest adjustment from among the multiple adjustments and using the largest adjustment as the single combined adjustment.

Solid-State Storage Device

Figure 2:
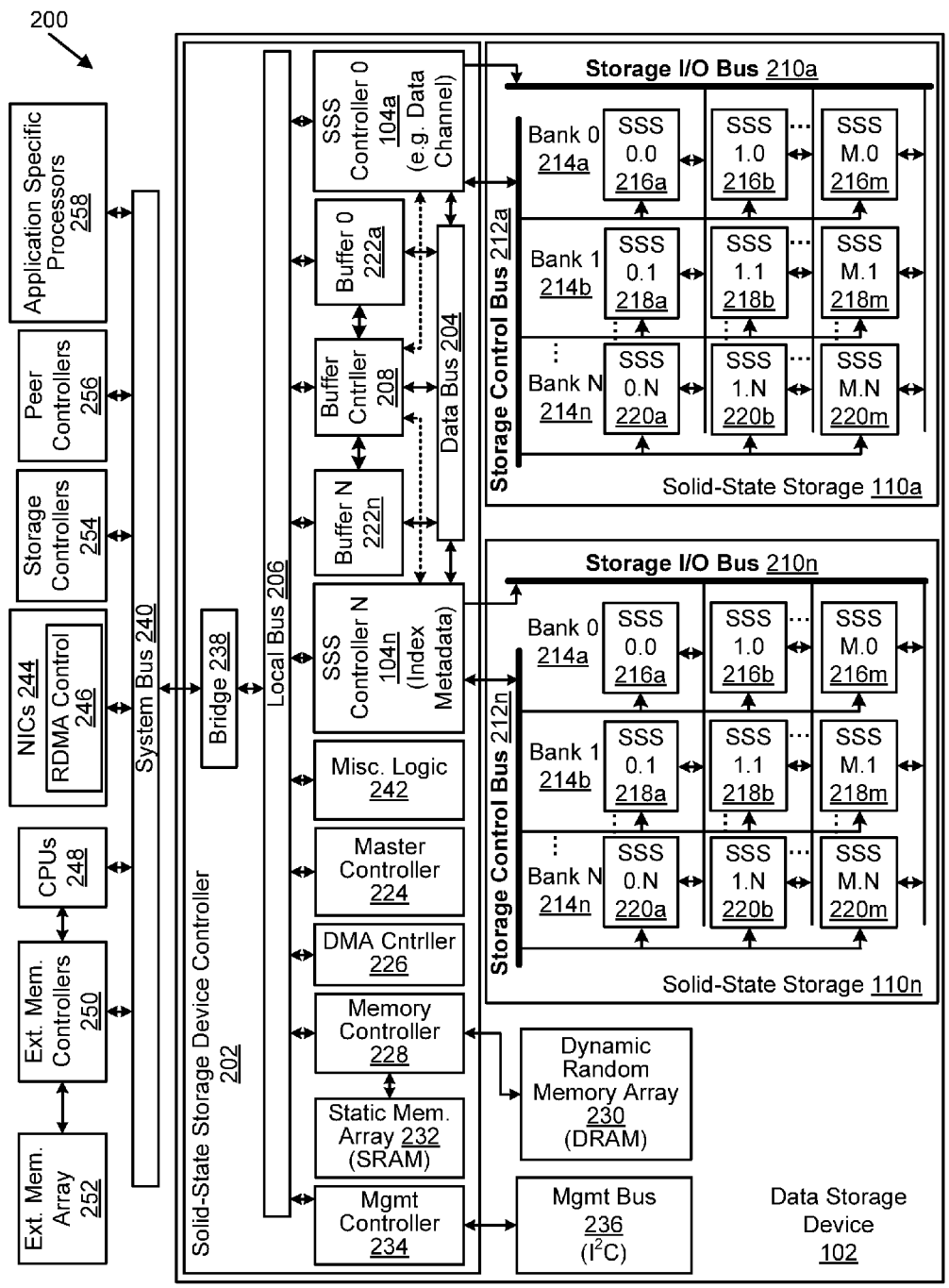
FIG. 2 is a schematic block diagram illustrating one embodiment of a solid-state storage device controller for a data storage device.

FIG. 2 is a schematic block diagram illustrating one embodiment 200 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage media 110. In the depicted embodiment, two solid-state controllers are shown: solid-state controller 0 104a and solid-state storage controller N 104n, and each controls solid-state storage media 110a-n. In the depicted embodiment, solid-state storage controller 0 104a controls a data channel so that the attached solid-state storage media 110a stores data. Solid-state storage controller N 104n controls an index metadata channel associated with the stored data and the associated solid-state storage media 110n stores index metadata. In an alternate embodiment, the solid-state storage device controller 202 includes a single solid-state controller 104a with a single solid-state storage media 110a. In another embodiment, there are a plurality of solid-state storage controllers 104a-n and associated solid-state storage media 110a-n. In one embodiment, one or more solid state controllers 104a-104n-1, coupled to their associated solid-state storage media 110a-110n-1, control data while at least one solid-state storage controller 104n, coupled to its associated solid-state storage media 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a row of solid-state storage elements 216a, 216b, 216m is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage media 110. Of course different embodiments may include different values for n and m. In one embodiment, a solid-state storage media 110a includes twenty solid-state storage elements 216, 218, 220 per bank 214 with eight banks 214. In one embodiment, the solid-state storage media 110a includes twenty four solid-state storage elements 216, 218, 220 per bank 214 with eight banks 214. In addition to the n×m storage elements 216, 218, 220, one or more additional columns (P) may also be addressed and operated in parallel with other solid-state storage elements 216a, 216b, 216m for one or more rows. The added P columns in one embodiment, store parity data for the portions of an ECC chunk (i.e. an ECC codeword) that span m storage elements for a particular bank. In one embodiment, each solid-state storage element 216, 218, 220 is comprised of single-level cell ("SLC") devices. In another embodiment, each solid-state storage element 216, 218, 220 is comprised of multi-level cell ("MLC") devices.

In one embodiment, solid-state storage elements that share a common storage I/O bus 210a (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 8.0) 216a-220a, each in a separate bank 214a-n. In another embodiment, 24 storage elements (e.g. SSS 0.0-SSS 0.24) 216 form a logical bank 214a so that each of the eight logical banks has 24 storage elements (e.g. SSS0.0-SSS 8.24) 216, 218, 220. Data is sent to the solid-state storage media 110 over the storage I/O bus 210 to all storage elements of a particular group of storage elements (SSS 0.0-SSS 8.0) 216a, 218a, 220a. The storage control bus 212a is used to select a particular bank (e.g. Bank 0 214a) so that the data received over the storage I/O bus 210 connected to all banks 214 is written just to the selected bank 214a.

In a one embodiment, the storage I/O bus 210 is comprised of one or more independent I/O buses ("IIOBa-m" comprising 210a.a-m, 210n.a-m) wherein the solid-state storage elements within each column share one of the independent I/O buses that accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216a, 216b, 216m is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. An erase block on a solid-state storage element 216, 218 220 may be called a physical erase block or "PEB." A typical page is 2000 bytes ("2 kB"). In one example, a solid-state storage element (e.g. SSS 0.0) includes two registers and can program two pages so that a two-register solid-state storage element 216, 218, 220 has a capacity of 4 kB. A bank 214 of 20 solid-state storage elements 216a, 216b, 216m would then have an 80 kB capacity of pages accessed with the same address going out the channels of the storage I/O bus 210.

This group of pages in a bank 214 of solid-state storage elements 216a, 216b, 216m of 80 kB may be called a logical page or virtual page. Similarly, an erase block of each storage element 216a-m of a bank 214a may be grouped to form a logical erase block or a virtual erase block. In one embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a particular physical erase block of a particular storage element of a particular bank, a physical address is sent on the storage I/O bus 210 and followed by the packet. The physical address contains enough information for the solid-state storage element 216, 218, 220 to direct the packet to the designated location within the page. Since all storage elements in a column of storage elements (e.g. SSS 0.0-SSS N.0 216a, 218a, 220a) are accessed simultaneously by the appropriate bus within the storage I/O bus 210a.a, to reach the proper page and to avoid writing the data packet to similarly addressed pages in the column of storage elements (SSS 0.0-SSS N.0 216a, 218a, 220a), the bank 214a that includes the solid-state storage element SSS 0.0 216a with the correct page where the data packet is to be written is simultaneously selected by the storage control bus 212.

Similarly, satisfying a read command on the storage I/O bus 210 requires a simultaneous signal on the storage control bus 212 to select a single bank 214a and the appropriate page within that bank 214a. In one embodiment, a read command reads an entire page, and because there are multiple solid-state storage elements 216a, 216b, 216m in parallel in a bank 214, an entire logical page is read with a read command. However, the read command may be broken into subcommands, as will be explained below with respect to bank interleave. A logical page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g. Bank 0 214a) is selected over the storage control bus 212 to prevent erasure of similarly addressed erase blocks in all of the banks (Banks 1-N 214b-n). Alternatively, no particular bank (e.g. Bank 0 214a) is selected over the storage control bus 212 to enable erasure of similarly addressed erase blocks in all of the banks (Banks 1-N 214b-n) simultaneously. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage media 110. For example, packets are streamed to the storage write buffers of a bank 214a of storage elements 216 and when the buffers are full, the packets are programmed to a designated logical page. Packets then refill the storage write buffers and, when full, the packets are written to the next logical page. The next logical page may be in the same bank 214a or another bank (e.g. 214b). This process continues, logical page after logical page, typically until a logical erase block is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the solid-state storage media 110. When a copy is made, a new copy of the requested data is created and a new entry is created in the index mapping the new copy of the requested data to the original packets. The new copy of the requested data is also written to the solid-state storage media 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the solid-state storage media 110 and allows the solid-storage device controller 202 to monitor storage hot spots and level usage of the various logical pages in the solid-state storage media 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computing system 114 or may be other devices.

Typically the solid-state storage controller(s) 104 communicate data to the solid-state storage media 110 over a storage I/O bus 210. In a typical embodiment where the solid-state storage is arranged in banks 214 and each bank 214 includes multiple storage elements 216a, 216b, 216m accessed in parallel, the storage I/O bus 210 is an array of busses, one for each column of storage elements 216, 218, 220 spanning the banks 214. As used herein, the term "storage I/O bus" may refer to one storage I/O bus 210 or an array of data independent busses 204. In one embodiment, each storage I/O bus 210 accessing a column of storage elements (e.g. 216a, 218a, 220a) may include a logical-to-physical mapping for storage divisions (e.g. erase blocks) accessed in a column of storage elements 216a, 218a, 220a. This mapping (or bad block remapping) allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104a-104n-1 and associated solid-state storage media 110a-110n-1 while at least one channel (solid-state storage controller 104n, solid-state storage media 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computing system 114 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device/solid-state storage device controller 202 manages multiple data storage devices/solid-state storage media 110a-n, the master controller 224 divides the work load among internal controllers, such as the solid-state storage controllers 104a-n. For example, the master controller 224 may divide an object to be written to the data storage devices (e.g. solid-state storage media 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computing system 114 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in a computer such as the computing system 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a computing system 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more storage elements 216, 218, 220 of a logical page where the parity information protects data stored in the other storage elements 216, 218, 220 of the same logical page.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple logical devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 202, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I2C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
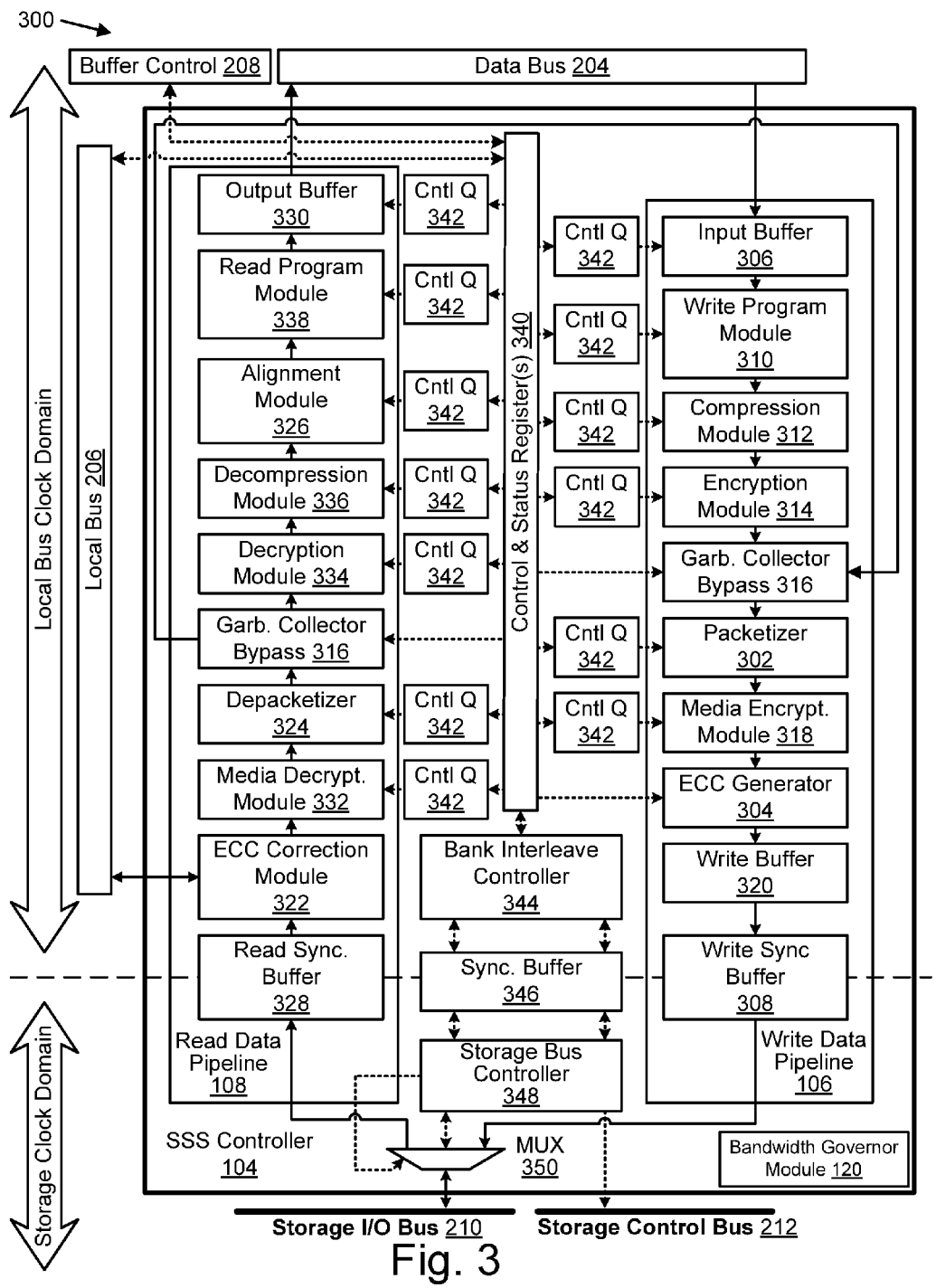
FIG. 3 is a schematic block diagram illustrating one embodiment of a solid-state storage controller with a write data pipeline and a read data pipeline in a data storage device.

FIG. 3 is a schematic block diagram illustrating one embodiment 300 of a solid-state storage controller 104 with a write data pipeline 106 and a read data pipeline a solid-state storage device 102 in accordance with the present invention. The embodiment 300 includes a bandwidth governor module 120 similar in functionality and features to the bandwidth governor module 120 described above with regard to FIG. 1A. Alternatively, the embodiment 300 may include certain portions of the logic for implementing certain features and functionality of the bandwidth governor module 120 with remaining features and functionality implemented in a device driver or other component of a system. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the computing system 114, or other computer or device and is transmitted to the solid-state storage device 102 in data segments streamed to the solid-state storage device 102. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicates the data segment, object, data structure or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the ECC algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computing system 114, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synchronization buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from a solid-state storage controller 104.

The media encryption module 318 and corresponding media decryption module 332 provide a level of security for data stored in the solid-state storage media 110. For example, where data is encrypted with the media encryption module 318, if the solid-state storage media 110 is connected to a different solid-state storage controller 104, solid-state storage device 102, or server, the contents of the solid-state storage media 110 typically could not be read without use of the same encryption key used during the write of the data to the solid-state storage media 110 without significant effort.

In a typical embodiment, the solid-state storage device 102 does not store the encryption key in non-volatile storage and allows no external access to the encryption key. The encryption key is provided to the solid-state storage controller 104 during initialization. The solid-state storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a computing system 114, a server, key manager, or other device that manages the encryption key to be used by the solid-state storage controller 104. In another embodiment, the solid-state storage media 110 may have two or more partitions and the solid-state storage controller 104 behaves as though it was two or more solid-state storage controllers 104, each operating on a single partition within the solid-state storage media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The solid-state storage device 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a computing system 114, another computer, key manager, or other device that holds the encryption key to be used to encrypt the data segment. In one embodiment, encryption keys are transferred to the solid-state storage controller 104 from one of a solid-state storage device 102, computing system 114, computer, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows data structure-by-data structure or segment-by-segment data encryption without a single file system or other external system to keep track of the different encryption keys used to store corresponding data structures or data segments. Each requesting device 155 or related key manager independently manages encryption keys used to encrypt only the data structures or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific solid-state storage device 102, if the solid-state storage media 110 is connected to a different solid-state storage controller 104, solid-state storage device 102, or computing system 114, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that computing systems 114 or other devices writing data to the solid-state storage device 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by computing systems 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically the encryption key used to decrypt data by the media decryption module 332 is identical to the encryption key used by the media encryption module 318. In another embodiment, the solid-state storage media 110 may have two or more partitions and the solid-state storage controller 104 behaves as though it was two or more solid-state storage controllers 104 each operating on a single partition within the solid-state storage media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a computing system 114, a client, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

In one embodiment, the bandwidth governor module 120 adjusts the execution of write operations by adjusting a rate that write operations progress through the write data pipeline 106. The bandwidth governor module 120, in one embodiment, may adjust the rate that packets progress between stages in the write data pipeline 106, either at a single point or at multiple points in the write data pipeline 106. An adjustment to a frequency at which write operations are submitted to the storage device 102 for execution is referred to as front-end throttling. Front-end throttling, in certain embodiments, takes advantage of natural or built-in pauses or breaks in the write data pipeline 106 (i.e. write operations to the media) to add or reduce delays, thereby managing a submission frequency of write operations. For example, the write data pipeline 106 may include a natural or built in delay at a control queue 342, a buffer 306, 308, 346, between stages of the write data pipeline 106, or the like that the bandwidth governor module 120 may manage. Using various managed delays, the bandwidth governor module 120 may adjust a rate that data is submitted to, or advanced through, the write data pipeline 106.

For example, the bandwidth governor module 120 may determine a submission frequency that satisfies a write bandwidth target, and at one or more points in the write data pipeline 106, may allow a write operation or delay the write operation to satisfy the submission frequency. By using front-end throttling, in certain embodiments, the bandwidth governor module 120 allows other operations to execute on the storage device 102 between submitting write operations to the storage device 102, because front-end adjustments typically do not lock or block access to the storage device 102. For example, the bandwidth governor module 120 may allow read operations, system operations, read voltage threshold adjustments, write voltage threshold adjustments, bus arbitration operations, address operations, or the like to execute while waiting to submit a write operation to the storage device 102.

In another embodiment, the bandwidth governor module 120 may use back-end throttling, adjusting the rate that the storage bus controller 348 may place write operations on the storage control bus 212. One example of a back-end adjustment is an adjustment to a tPROG wait time. The tPROG wait time is discussed in greater detail below with regard to FIG. 6A and FIG. 7A. In general, the tPROG wait time is the period of time between submitting a program command to a memory area (such as a die, a bank, a physical or logical page, or the like) and submitting a subsequent command to the same memory area (typically a READ STATUS command, or the like, program commands may be followed by Read Status commands to ensure the program command was successful before permitting execution of a subsequent command).

In one embodiment, the control and status registers 340 include a tPROG register for setting a tPROG wait time for the storage device 102, and the bandwidth governor module 120 adjusts or throttles the execution of write operations by changing the value in the tPROG register. Increasing the tPROG wait time, in one embodiment, increases an amount of time that a program operation appears to take (the solid-state storage 110 may actually have taken less time to complete the program operation), thereby slowing the progression of write data from the write data pipeline 106 and decreasing the write bandwidth of the storage device 102. In certain embodiments, back-end throttling may temporarily lock or block the storage device 102 from executing other operations.

In one embodiment, the bandwidth governor module 120 manages or throttles a write bandwidth for the storage device 102 at a position or point in the data flow at or below a lowest common point or single point through which every byte of data physically written to the storage media 110 passes, including garbage collector or groomer data fed into the garbage collector bypass 316, header data or other metadata added by the packetizer 302, ECC data added by the ECC generator 304, and/or other write data.

In the depicted embodiment 300, the lowest common point or single point is at or below the write buffer 320. In other embodiments, the bandwidth governor module 120 may determine the write bandwidth for a position above a lowest common point or single point, so as to exclude certain data from the write bandwidth monitoring, such as garbage collector or groomer data fed into the garbage collector bypass 316, header data or other metadata added by the packetizer 302, ECC data added by the ECC generator 304, and/or other write data.

In one embodiment, the bandwidth governor module 120 adjusts or throttles execution of write operations at a point within or after the write data pipeline 106 such that no write data bypasses the throttling. For example, the bandwidth governor module 120 may throttle write operations at a point after the garbage collector bypass 316 such that garbage collector or groomer data and user data are both equally throttled. In another embodiment, the bandwidth governor module 120 may monitor and throttle certain types of write data while allowing other write data to bypass throttling. For example, the bandwidth governor module 120, in certain embodiments, may monitor and potentially throttle write bandwidths of user data, but may bypass throttling for garbage collector data, groomer data, storage device metadata, and the like. In one embodiment, the garbage collector bypass 316 disables bandwidth throttling when writing garbage collector data forward in the log, by alerting the bandwidth governor module 120, setting a tPROG register, or the like.

Figure 4:
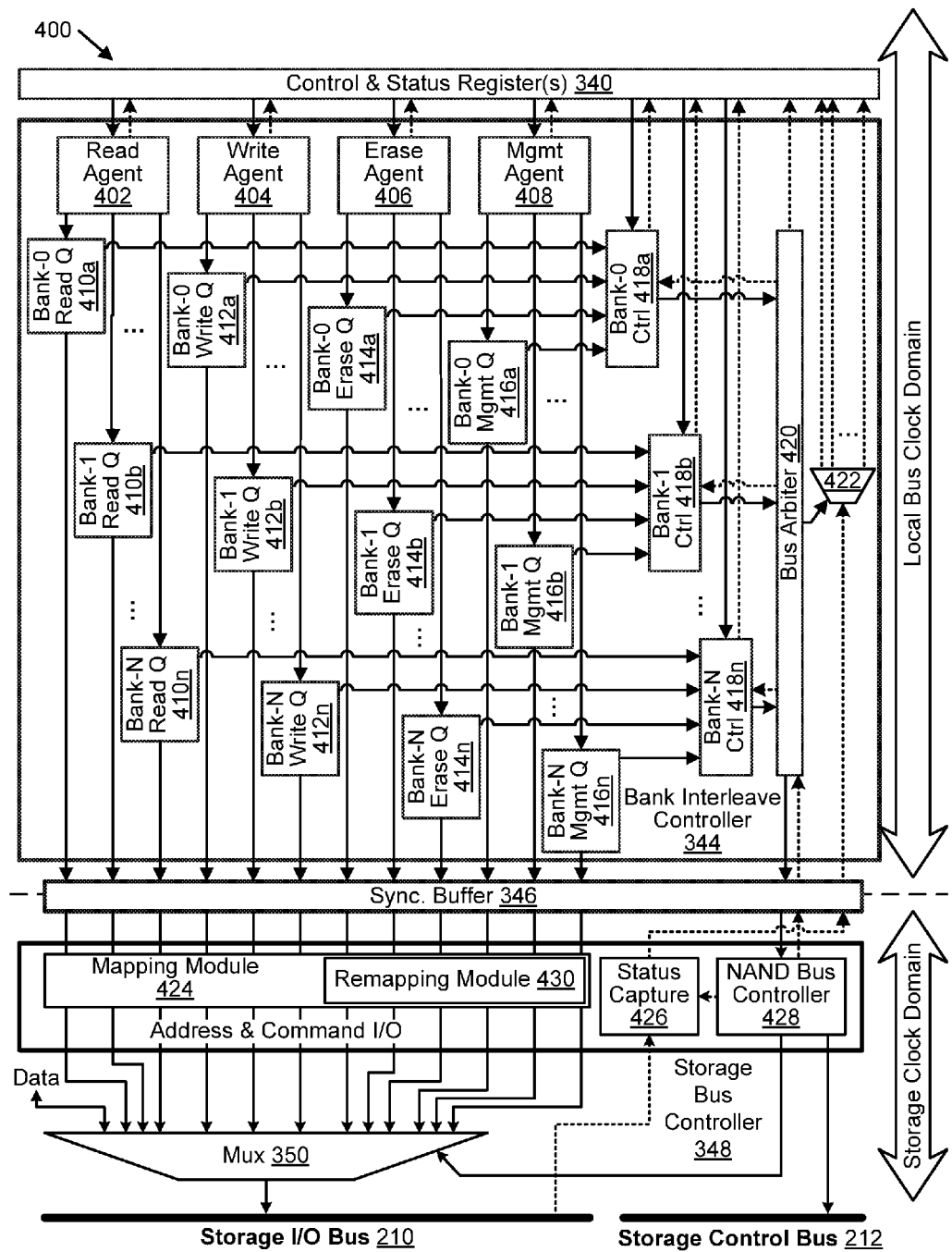
FIG. 4 is a schematic block diagram illustrating one embodiment of a bank interleave controller in a solid-state storage controller.

The solid-state storage controller 104 and or solid-state storage device 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 104 and coordinates among the banks 214 of the solid-state storage media 110 execution of the commands stored in the queues, such that a command of a first type executes on one bank 214a while a command of a second type executes on a second bank 214b. The one or more commands are separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, NRAM, MRAM, DRAM, PRAM, etc.

For other types of solid-state storage media 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage media 110, a write queue 412 for write commands to the solid-state storage media 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a. The storage bus controller 348 then transmits a write subcommand on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write synchronization buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While Bank 0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each column of storage elements 216a-m, 218a-m, 220a-m. For example, one bank interleave controller 344 serves one column of storage elements SSS 0.0-SSS N.0 216a, 218a, . . . 220a, a second bank interleave controller 344 serves a second column of storage elements SSS 0.1-SSS N.1 216b, 218b, . . . 220b etc.

Storage-Specific Components

The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each column of solid-state storage elements (e.g. SSS 0.0 216a, SSS 1.0 218a, SSS N.0 220a). A MUX 350 combines data from the write data pipeline 106 and commands sent to the solid-state storage media 110 via the storage I/O bus 210 and separates data to be processed by the read data pipeline 108 from commands. Packets stored in the write buffer 320 are directed on busses out of the write buffer 320 through a write synchronization buffer 308 for each column of solid-state storage elements (SSS 0.x to SSS N.x 216, 218, 220) to the MUX 350 for each column of solid-state storage elements (SSS 0.x to SSS N.x 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage media 110 with an array of twenty storage elements (e.g. SSS 0.0 to SSS 0.M 216) per bank 214a may have a logical address for a particular erase block mapped to twenty physical addresses of the erase block, one physical address per storage element. Because the storage elements are accessed in parallel, erase blocks at the same position in each storage element in a column of storage elements 216a, 218a, 220a will share a physical address. To select one erase block (e.g. in storage element SSS 0.0 216a) instead of all erase blocks in the row (e.g. in storage elements SSS 0.0, 1.0, . . . N.0 216a, 218a, 220a), one bank (in this case Bank 0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 0.1 216b, . . . , and to storage element 0.M 216m, virtual erase block 2 may be mapped to erase block 2 of storage element SSS 1.0 218a, to erase block 2 of storage element SSS 1.1 218b, . . . , and to storage element 1.M 218m, etc. Alternatively, virtual erase block 1 may be mapped to one erase block from each storage element in an array such that virtual erase block 1 includes erase block 1 of storage element SSS 0.0 216a to erase block 1 of storage element SSS 0.1 216b to storage element 0.M 216m, and erase block 1 of storage element SSS 1.0 218a to erase block 1 of storage element SSS 1.1 218b, . . . , and to storage element 1.M 218m, for each storage element in the array up to erase block 1 of storage element N.M 220m.

If erase block 1 of a storage element SSS0.0 216a is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216a is available and currently not mapped, the remapping module 430 could change the mapping of virtual erase block 1 to point to erase block 221 of storage element SSS 0.0 216a, while continuing to point to erase block 1 of storage element SSS 0.1 216b, erase block 1 of storage element SSS 0.2 (not shown) . . . , and to storage element 0.M 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage media 110 and sends the status messages to the status MUX 422. In another embodiment, when the solid-state storage media 110 is flash memory, the storage bus controller 348 includes a NAND bus controller 428. The NAND bus controller 428 directs commands from the read and write data pipelines 106, 108 to the correct location in the solid-state storage media 110, coordinates timing of command execution based on characteristics of the flash memory, etc. If the solid-state storage media 110 is another solid-state storage type, the NAND bus controller 428 would be replaced by a bus controller specific to the storage type. One of skill in the art will recognize other functions of a NAND bus controller 428.

Reducing Storage Device Power Consumption

Figure 5:
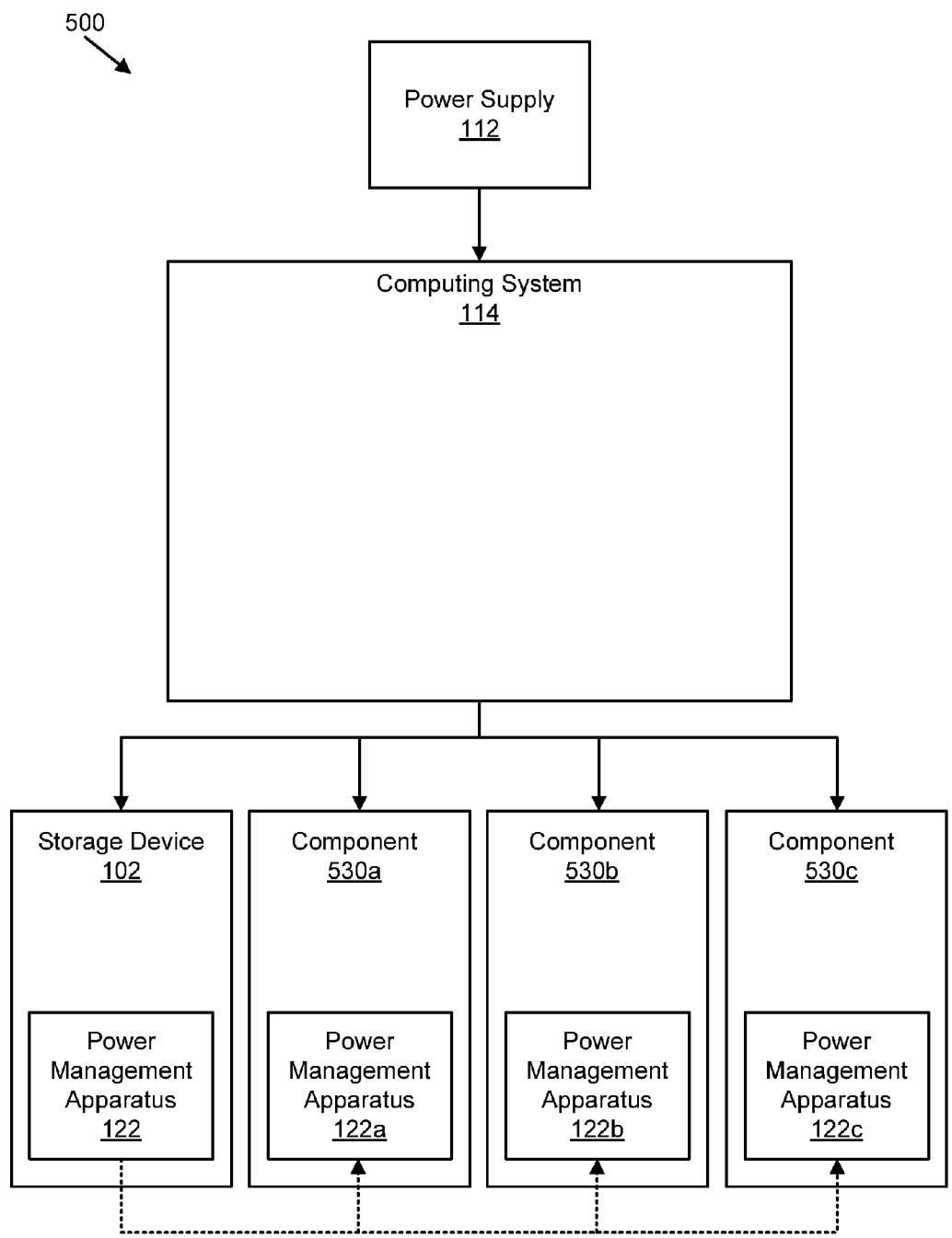
FIG. 5 is a schematic block diagram illustrating one embodiment of a system with multiple components having power management apparatuses.

FIG. 5 depicts one embodiment of a system 500 for managing power consumption in a storage device 102 and in a plurality of components 530a-c. The system 500, in one embodiment, is substantially similar to the system 150 described above with regard to FIG. 1B, with the addition of the plurality of components 530a-c. In the depicted embodiment, the storage device 102 includes a power management apparatus 122, and each of the components 530a-c includes a power management apparatus 122a-c. In another embodiment, a single power management apparatus 122 manages power consumption for the storage device 102 and the components 530a-c. The power management apparatus 122 is described in greater detail below with regard to FIGS. 6A and 6B.

While the power management apparatuses 122, 122a-c, in the depicted embodiment, are illustrated as part of the storage device 102 and the components 530a-c, in other embodiments, as described above with regard to FIG. 1B, the power management apparatuses 122, 122a-c may be implemented as software drivers of the computing system 114, as a combination of software drivers and firmware/hardware/controllers of the storage device 102 and the components 530a-c, or the like. In one embodiment, the computing system 114 loads separate software drivers for each power management apparatus 122, 122a-c.

Similarly, while the system 500, as depicted, includes the power management apparatuses 122, 122a-c, in other embodiments, the power management apparatuses 122, 122a-c may be substituted with bandwidth governor modules 120, the power management apparatuses 122, 122a-c may be integrated with one or more bandwidth governor modules 120, or the like. While the description below focuses primarily on the power management apparatuses 122, 122a-c adjusting operations to satisfy a power consumption target and/or a thermal ceiling, in certain embodiments, the description is also applicable to adjusting operations to satisfy a write bandwidth target per component 530, per set of components 530, or shared write bandwidth target for all components 530.

The power supply 112, in the depicted embodiment, provides electric power to the computing system 114 and, through it, the attached storage device 102 and components 530a-c. In certain embodiments, the computing system 114 distributes power to various components such as the storage device 102 and the components 530a-c shown. The power may be distributed via a number of different approaches; in one embodiment, the storage device 102 and the components 530a-c connect to a motherboard which provides the necessary power for the computing system 114. In other embodiments, the storage device 102 and/or one or more of the components 530a-c are remote from the computing system 114 and network attached.

The components 530a-c provide computing capabilities for the computing system 114. The components 530a-c may be additional storage devices, such as Flash memory, hard disk drives, optical drives, or the like; graphics processors; network cards; or other computer components. Those of skill in the art will appreciate the different types of components 530a-c that may be in a computing system 114. The storage device 102 and the components 530a-c may be internal or external to the computing system 114. In one embodiment, the components 530a-c are PCI or PCI-e cards that connect to the computing system 114. The components 530a-c may receive power through the computing system 114.

In certain embodiments, the power management apparatuses 122, 122a-c may dynamically adjust power allocations for the storage device 102 and the components 530a-c. The computing system 114 and/or the power management apparatuses 122, 122a-c may dedicate more or less power to a particular component 530a-c or the storage device 102 at a particular time based on power consumption rates of other components 530a-c and of the storage device 102. The computing system 114 and/or the power management apparatuses 122, 122a-c may thus dynamically change the allocation of power and send appropriate parameters to the storage device 102 and the components 530a-c.

In certain embodiments, the power management apparatuses 122, 122a-c monitor the activity of the storage device 102 and the components 530a-c to determine whether or not the storage device 102 and the components 530a-c are active. If a particular component 530a-c or the storage device 102 is inactive, the power management apparatus 122, 122a-c for that component 530a-c or storage device 102 may inform the other power management apparatuses 122, 122a-c that the component 530a-c or storage device 102 is inactive. For example, if a component 530a-c that is a wireless card is not currently connected to a wireless network, or if the wireless connection and/or card is powered off, the power management apparatus 122a-c on that component 530a-c may inform the other power management apparatuses 122, 122a-c, and correspondingly increase the power consumption target for any of the other active components 530a-c and/or the storage device 102.

In the depicted embodiment, the power management apparatuses 122, 122a-c are arranged in a master/slave relationship, with the power management apparatus 122 of the storage device 102 as the master. In other embodiments, the system 500 may include a single system power management apparatus 122 that manages power consumption rates for the storage device 102 and the components 530a-c, the power management apparatuses 122, 122a-c may operate independently, one of the component power management apparatuses 122a-c may serve as a master, or the like.

In one embodiment, the slave power management apparatuses 122a-c follow adjustments that the master power management apparatus 122 makes. For example, in one embodiment, instead of monitoring power consumption rates for the storage device 102 and each of the components 530a-c, the master power management apparatus 122 monitors the power consumption rate of a single component (the storage device 102, in the depicted embodiment) and the power management apparatuses 122, 122a-c each adjust operations on the storage device 102 and the components 530a-c based on the power consumption rate of the single component.

In certain embodiments, adjusting operations of the storage device 102 and the components 530a-c similarly, in parallel, may be more efficient than managing them separately. For example, in an embodiment where the storage device 102 and the components 530a-c comprise a storage array that is accessed in parallel, it may be inefficient to throttle or slow operations on a single storage device 102 without throttling or slowing operations on the other components 530a-c. In the example embodiment, power consumption rates may also be similar in the storage device 102 and the components 530a-c, due to parallel accesses, which also makes parallel adjustments efficient by allowing the power management apparatus 122 to monitor a single power consumption rate.

The master power management apparatus 122, in various embodiments, may communicate an adjustment to be made, a power consumption rate, a power consumption target, and/or other information to the slave power management apparatuses 122a-c. In another embodiment, instead of basing adjustments on a static master component or master power management apparatus 122, the power management apparatuses 122, 122a-c dynamically adjust operations based on any one of the power consumption rates failing to satisfy a power consumption target.

In one embodiment, either a master power management apparatus 122 or a single system power management apparatus 122 (not shown) dynamically adjusts operations on the storage device 102 and the components 530a-c based on a system power consumption target for the storage device 102 and the components 530a-c so that a total power consumption rate satisfies the system power consumption target. In one embodiment, using a system power consumption target allows the power management apparatus 122 to dynamically allocate and balance power from the power supply 112 between the storage device 102 and the components 530a-c, allowing greater power use for certain components 530a-c executing power intensive operations by lowering a power allocation of other components 530a-c, or the like.

In another embodiment, instead of having a master/slave arrangement, the power management apparatuses 122, 122a-c are arranged as peers. The power management apparatuses 122, 122a-c, in one embodiment, communicate information, such as power consumption rates, power consumption targets, operation adjustments, and/or other information, to other power management apparatuses 122, 122a-c. In a further embodiment, the power management apparatuses 122, 122a-c adjust operations, adjust a power consumption target, or the like based on power consumption rates reported by peer power management apparatuses 122, 122a-c. In a further embodiment, a power management apparatus 122, 122a-c may request an additional allocation of power from a master power management apparatus 122, a peer power management apparatus 122, 122a-c, or the like.

In one embodiment, the power management apparatuses 122, 122a-c manage thermal states of the storage device 102 and the components 530a-c. The power management apparatuses 122, 122a-c, in various embodiments, may manage the thermal states substantially as described above with regard to power consumption, as master/slave, as peers, or the like. For example, in various embodiments, a single system power management apparatus 122 may manage the thermal states for the storage device 102 and the components 530a-c, one power management apparatus 122 may be selected as a master while other power management apparatus 122a-c may be selected as slaves for thermal management, the power management apparatuses 122, 122a-c may be arranged as peers for thermal management purposes, or the like.

In one embodiment, the power management apparatuses 122, 122a-c (or a single system power management apparatus 122) may monitor a single temperature for the storage device 102 and the components 530a-c, instead of monitoring separate individual temperatures. The single temperature or system temperature, in one embodiment, may be a temperature of an enclosure that houses the storage device 102 and the components 530a-c. In another embodiment, the single temperature may be the temperature of a single one of the storage device 102 and the components 530. In a further embodiment, the power management apparatuses 122, 122a-c (or a single system power management apparatus 122) monitor individual temperatures for each of the storage device 102 and the components 530a-c. The power management apparatuses 122, 122a-c (or a single system power management apparatus 122), in various embodiments, may manage the thermal states (adjusting execution of operations, etc.) of each of the storage device 102 and the components 530 individually, in parallel, or some combination of the two.

In a further embodiment, the power management apparatuses 122, 122a-c manage both power consumption and thermal states of the storage device 102 and the components 530a-c. In one embodiment, the power management apparatuses 122, 122a-c combine adjustments made for power consumption with adjustments made for thermal management into a single adjustment to operations for each of the storage device 102 and the components 530a-c. For example, in one embodiment, adjusting execution of operations for the storage device 102 and/or for the components 530a-c may serve a dual purpose of adjusting power consumption, which, in certain embodiments, may also have a direct correlation to reducing thermal heating.

In one embodiment, a master power management apparatus 122 determines a system adjustment to make for power consumption, and each power management apparatus 122, 122a-c determines an individual thermal adjustment and separately combines the individual thermal adjustment with the system adjustment into a single, independent adjustment for each respective storage device 102 and component 530a-c. In such an embodiment, the power management apparatuses 122, 122a-c make adjustments for power consumption substantially identically while making adjustments for thermal management independently.

The power management apparatuses 122, 122a-c, in one embodiment, combine power consumption adjustments and thermal adjustments cumulatively, summing the adjustments. In other embodiments, the power management apparatuses 122, 122a-c may combine power consumption adjustments and thermal adjustments by selecting the largest adjustment for use, factoring in previous adjustments, and/or otherwise combining the adjustments.

In one embodiment, one or more bandwidth governor modules 120 combine write bandwidth adjustments with power consumption adjustments and/or with thermal adjustments. As described above with regard to the power management apparatuses 122, 122a-c, in one embodiment, the one or more bandwidth governor modules 120 combine write bandwidth adjustments, power consumption adjustments, and/or thermal adjustments by selecting the largest adjustment as a single combined adjustment. In other embodiments, the one or more bandwidth governor modules 120 combine write bandwidth adjustments, power consumption adjustments, and/or thermal adjustments by cumulatively summing the adjustments, factoring in previous adjustments, or otherwise combining the adjustments.

Separate bandwidth governor modules 120 for each component 102, 530a-c or a single system bandwidth governor module 120, in certain embodiments, combine a system power consumption adjustment for the system 500 with an individually determined write bandwidth adjustment for each corresponding component 102, 530a-c. In another embodiment, separate bandwidth governor modules 120 for each component 102, 530a-c or a single system bandwidth governor module 120 combine an individually determined thermal adjustment for each component 102, 530a-c with an individually determined write bandwidth adjustment for each corresponding component 102, 530a-c. In a further embodiment, separate bandwidth governor modules 120 for each component 102, 530a-c or a single system bandwidth governor module 120 combine a system power consumption adjustment with individually determined thermal adjustments and write bandwidth adjustments for each component 102, 530a-c. In view of this disclosure, one of skill in the art will recognize other combinations of power consumption adjustments, thermal adjustments, and/or write bandwidth adjustments for the system 500.

Figure 6A:
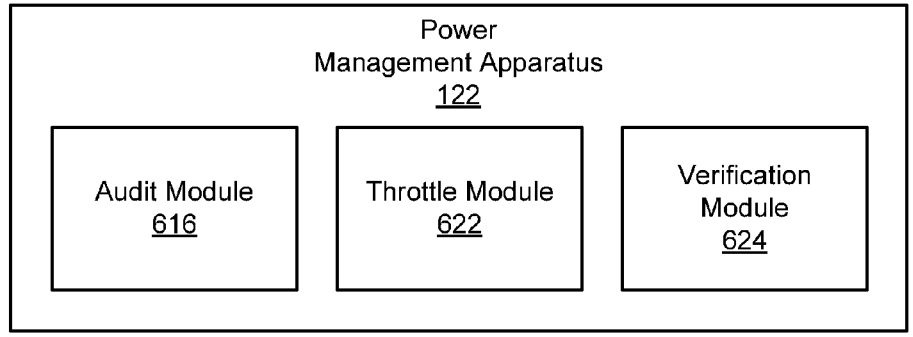
FIG. 6A is a schematic block diagram illustrating one embodiment of a power management apparatus.

FIG. 6A depicts one embodiment of the power management apparatus 122. The power management apparatus 122, in one embodiment, is substantially similar to the power management apparatus 122 described above with regard to FIG. 1B and/or the power management apparatuses 122, 122a-c described above with regard to FIG. 5. In the depicted embodiment, the power management apparatus 122 includes an audit module 616, a throttle module 622, and a verification module 624. Other embodiments of the power management apparatus 122, the audit module 616, the throttle module 622, and the verification module are described below with regard to FIG. 6B.

In general, the audit module 616 monitors a power consumption rate of a component 530, such as the storage device 102, relative to a power consumption target, the throttle module 622 adjusts operations on the component 530 in response to the power consumption rate failing to satisfy the power consumption target, and the verification module 624 verifies whether the power consumption rate of the component 530 satisfies the power consumption target in response to adjusting the execution of operations on the component 530. In a further embodiment, the audit module 616 monitors a temperature for a component 530, such as the storage device 102, relative to a thermal ceiling or other thermal target, the throttle module adjusts execution of operations on the component 530 in response to the temperature approaching the thermal ceiling, and the verification module 624 verifies whether the temperature is moving away from the thermal ceiling in response to adjusting the execution of the operations on the component 530.

The audit module 616, in one embodiment, monitors a power consumption rate of the associated component 530 relative to a power consumption target. In a further embodiment, the audit module 616 monitors a temperature for the associated component 530 relative to a thermal target, such as a thermal ceiling, or the like. Determining a power consumption target and/or a thermal target is described in greater detail below with regard to the target module 610 of FIG. 6B. In one embodiment, the audit module 616 determines whether or not the power consumption rate satisfies the power consumption threshold. In a further embodiment, the audit module 616 determines whether the temperature satisfies the thermal target.

The audit module 616, in one embodiment, receives power consumption and/or temperature information for the component 530 from one or more sensors, such as voltage sensors, current sensors, temperature sensors, and the like. The audit module 616, in one embodiment, determines a power consumption rate using a known or estimated voltage and a reading from a current sensor. For example, protocols such as PCI-e, Mini PCI-e, and the like often provide relatively stable voltage levels at 12V, 3.3V, 1.5V, and the like. The audit module 616, in one embodiment, uses provided voltage levels and measured current levels to determine a power consumption rate for the component 530.

In one embodiment, the audit module 616 monitors a power consumption rate that is an instantaneous power consumption rate based on current power usage of the corresponding component 530. In a further embodiment, the audit module 616 monitors a power consumption rate that is an average of power consumption over time, such as a decaying average, or the like. In one embodiment, a period of the average power consumption for the power consumption rate is selected to smooth spikes in power usage.

The audit module 616, in one embodiment, monitors a temperature for the corresponding component 530 based on a reading from a temperature sensor, such as a thermometer. In one embodiment, a controller, processor, FPGA, or other hardware of the component 530 includes a temperature sensor, and the audit module 616 accesses temperature readings from the hardware of the component 530. In a further embodiment, the component 530 includes a separate temperature sensor that provides the audit module 616 with a temperature for the component 530. Other embodiments of the audit module 616 are described below with regard to FIG. 6B.

The throttle module 622, in one embodiment, adjusts execution of operations on the corresponding component 530 in response to the power consumption rate for the component 530 failing to satisfy the power consumption target. As described above, in various embodiments, a power consumption rate fails to satisfy a power consumption target by approaching a power consumption ceiling defined by a power consumption target, exceeding a power consumption target or threshold set below a power consumption ceiling, being outside a range of allowable power consumption defined by a power consumption target, or the like.

In one embodiment, the throttle module 622 adjusts operations by throttling or slowing down operations on the component 530 to lower the power consumption rate of the component 530. In a further embodiment, the throttle module 622 adjusts operations by scheduling the operations so that power consumed by concurrently executed operations satisfies the power consumption target. Other ways that the throttle module 622 may adjust operations are described below with regard to FIG. 6B.

The throttle module 622, in one embodiment, adjusts operations on the corresponding component 530 by reducing a frequency with which the operations are executed on the component 530. In certain embodiments, the throttle module 622 reduces the frequency of operations by reducing a clock rate, clock speed, or clock frequency of a synchronous circuit of the component 530. In one embodiment, the throttle module 622 reduces the frequency of operations by setting a timer value specifying a frequency with which operations are submitted to the component 530 for execution. In another embodiment, the throttle module 622 reduces the frequency of operations by setting a timer value specifying a frequency with which hardware of the component 530 polls to verify that an operation has completed.

For example, in one embodiment, where the corresponding component 530 includes a nonvolatile solid-state storage device such as the storage device 102, the throttle module 622 may adjust a tPROG wait time for the component 530, and increasing the tPROG wait time reduces the frequency of program operations for the component 530. For nonvolatile solid-state storage, such as Flash memory, the tPROG wait time is the period of time between submitting a program command to a memory area (such as a die, a bank, a physical or logical page, or the like) and submitting a subsequent command to the same memory area. In certain embodiments, the subsequent command may be a status command, such as a READ STATUS command or the like, to verify that the program command has completed, was successful, or the like.

In a further embodiment, the power consumption target specifies a number of quanta or units that define an allowable amount of energy or power that the component 530 may use during a period of time. Operations on the component 530, in one embodiment, may also be assigned various amounts of quanta or units based on the amount of energy or power used to perform each operation. The throttle module 622, in one embodiment, adjusts execution of operations on the component 530 by scheduling the operations such that the quanta or units associated with concurrently executing operations satisfies the number of quanta or units permitted to satisfy the power consumption target.

In another embodiment, the throttle module 622 adjusts execution of the operations on the component 530 by selecting operations from one or more queues of pending operations so that the power or energy used by concurrently executed operations satisfies the power consumption target. The throttle module 622, in certain embodiments, may adjust certain types of operations without adjusting other types of operations, may adjust different types of operations in different manners, or may otherwise dynamically or selectively adjust operations by type.

For example, in one embodiment, the throttle module 622 may adjust write (or program) operations but not erase operations, or vice versa. In another example embodiment, the throttle module 622 may adjust write (or program) operations differently than erase operations. In one embodiment, the throttle module 622 may ignore certain operations, such as read operations or the like, and may not adjust them at all. In a further example embodiment, the throttle module 622 may reduce a frequency of write (or program) operations by setting a timer, adjusting a tPROG wait time, or the like and may schedule erase operations to satisfy a power consumption target. Further embodiments of the throttle module 622 are described below with regard to FIG. 6B.

The verification module 624, in one embodiment, verifies whether the power consumption rate of the corresponding component 530 satisfies the power consumption target in response to the throttle module 622 adjusting execution of operations on the component 530. In another embodiment, the verification module 624 verifies whether the temperature of the component 530 satisfies the thermal target, is moving away from the thermal ceiling, or the like in response to the throttle module 622 adjusting execution of operations on the component 530.

The verification module 624, in one embodiment, is substantially similar to, is integrated with, is in communication with, cooperates with, and/or performs similar functions to the audit module 616. For example, in one embodiment, the verification module 624 may be part of or integrated with the audit module 616 and may compare a power consumption rate from prior to the adjustment of operations to a power consumption rate from after the adjustment of operations. In a further embodiment, the verification module 624 may compare a power consumption rate directly to the power consumption target to determine whether the power consumption rate satisfies the power consumption target. In one embodiment, the verification module 624 may verify that a temperature for the component 530 satisfies a thermal target in a similar manner.

In one embodiment, the verification module 624 waits a predefined period of time after the throttle module 622 adjusts the operations before verifying that the power consumption rate and/or the temperature of the component 530 satisfies the corresponding target. For example, in various embodiments, the predefined period of time may be selected to account for thermal inertia, throughput of the adjustments, or the like. In one embodiment, if the verification module 624 determines that the power consumption rate fails to satisfy the power consumption target, the throttle module 622 readjusts execution of subsequent operations on the component 530. Similarly, in a further embodiment, the throttle module 622 may readjust execution of subsequent operations on the component 530 in response to the verification module 624 determining that the temperature fails to satisfy the thermal target.

The power management apparatus 122, in one embodiment, is arranged in a system of a plurality of power management apparatuses 122, 122*a-c* as described above with regard to FIG. 5. Depending on whether the system is arranged with a single system power management apparatus 122, with master/slave power management apparatuses 122, 122*a-c*, with peer power management apparatuses 122, 122*a-c*, or in another arrangement, such a system may include one or more audit modules 616, one or more throttle modules 622, and/or one or more verification module 624, which may function as described above with regard to FIG. 5.

For example, in one embodiment, each power management apparatus 122, 122*a-c* may include an audit module 616, a throttle module 622, and a verification module 624. In a further embodiment, just a master or system power management apparatus may include an audit module 616, a throttle module 622, and a verification module 624. In another embodiment, a master power management apparatus 122 may include an audit module 616, a throttle module 622, and a verification module 624, and one or more slave power management apparatuses 122*a-c* may include just a throttle module 622, or the like. In view of this disclosure, one of skill in the art will recognize other arrangements and combinations of audit modules 616, throttle modules 622, and verification modules 624 suitable for use in a system with a plurality of components 530*a-c* as described above with regard to FIG. 5.

Figure 6B:
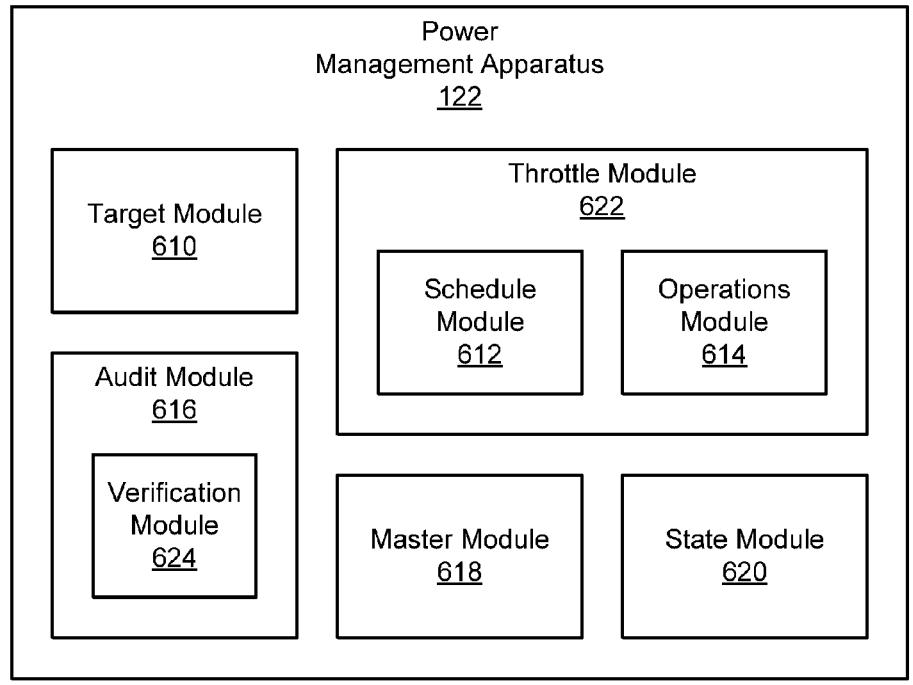
FIG. 6B is a schematic block diagram illustrating another embodiment of a power management apparatus.

FIG. 6B shows one embodiment of the power management apparatus 122. The power management apparatus 122 includes, in the depicted embodiment, a target module 610, the audit module 616, a master module 618, a state module 620, and the throttle module 622. The audit module 616, in the depicted embodiment, includes the verification module 624. The throttle module, in the depicted embodiment, includes a schedule module 612 and an operations module 614. In other embodiments, the power management apparatus may include a subset of the depicted modules, such as an audit module 616, a throttle module 622, and a verification module 624, or other combinations of the depicted modules.

In one embodiment, the target module 610 determines an appropriate power consumption target for the component 530 that the power management apparatus 122 is responsible for. As used herein, references to a component 530 include the storage device 102, which is a specific example of a component 530. The power consumption target sets the power limits for the component 530. In one embodiment, the power consumption target may be expressed in watts. The power consumption target may be a power consumption ceiling defining a maximum amount of power for the component 530, a power consumption threshold set below a power consumption ceiling, an average amount of power for the component 530 with allowances for deviation during burst operations, a range of allowable power consumptions levels for the component 530, or another manner of expressing the power limits for the component 530. Those of skill in the art will appreciate the other ways in which the power consumption target may be expressed, in view of this disclosure.

In another embodiment, the target module 610 determines an appropriate thermal target for the corresponding component 530. The target module 610, in one embodiment, may determine the thermal target in substantially the same manner as the power consumption target. The thermal target, in one embodiment, sets temperature limits for the component 530. The thermal target, in various embodiments, may be expressed as degrees Celsius, degrees Fahrenheit, Kelvin units, or the like. As described above with regard to the power consumption target, the thermal target, in various embodiments, may be a thermal ceiling defining a maximum allowable temperature or thermal rating for the component 530, a thermal threshold set below a thermal ceiling, an average temperature for the component 530 with allowances for deviation, a range of allowable temperatures for the component 530, or another manner of expressing temperature limits for the component 530.

In one embodiment, the thermal target includes a thermal ceiling and a thermal threshold below the thermal ceiling, to account for thermal inertia. In a further embodiment, if the temperature for the component 530 approaches the thermal ceiling by exceeding or passing the thermal threshold, the temperature fails to satisfy the thermal target, and the throttle module adjusts operations on the component 530. In one embodiment, setting a thermal threshold below a thermal ceiling provides the power management apparatus 122 time to account for thermal inertia so that a rate of change of the temperature slows and reverses before the temperature for the component 530 hits and/or exceeds the thermal ceiling.

For example, in one embodiment, a thermal rating for a consumer grade component 530 may be around about 85 degrees Celsius, or for an industrial grade component 530 around about 100 degrees Celsius. In one embodiment, the thermal ceiling for the component 530 is set at the thermal rating for the component 530. A thermal threshold, in various embodiments, may be set at a number of degrees below the thermal ceiling, such as about 1 to 15 degrees below the thermal ceiling. In one embodiment, a thermal threshold is set at about 7 degrees below the thermal ceiling, to account for thermal inertia. In the example embodiments, the thermal threshold for the consumer grade component 530 may be set at around 78 degrees Celsius and the thermal threshold for the industrial grade component 530 may be set at around 93 degrees Celsius, or the like.

In one embodiment, the power consumption target and/or the thermal target is communicated to a software driver by a user, another module, another power management apparatus 122, or the like, and the software driver sends the power consumption target and/or the thermal target to a physical card or device on which the component 530 is realized. The target module 610 may be part of the software driver, part of the physical card or device, or both. While the power consumption target is one parameter that the target module 610 may determine, the target module 610 may also determine other parameters; for example, the target module 610 may determine parameters specifying allowable burst limits and times, power ramping limits, the thermal target, and others.

In one embodiment, the target module 610 retrieves or otherwise determines the power consumption target and/or other parameters. These parameters may be stored in nonvolatile storage within the power management apparatus 122, in RAM for a computing system 114, or on a persistent storage device such as a parameter file in a file system. For example, in certain embodiments, the power consumption target is coded into the power management apparatus 122 as a hardware defined value, software defined value, firmware defined value, and/or some combination thereof. The power consumption target and other parameters may be retrieved by the target module 610, or retrieved by the target module 610, during start up. In certain embodiments, updates may be made to the firmware or software on the power management apparatus 122 to change the power consumption target and other parameters directly. In such embodiments, the computing system 114 may not be aware, or have a need to be aware, of the power management activities on the components 530a-c.

In certain embodiments, the target module 610 may receive initial parameters from the BIOS of the computing system 114 when the computing system 114 is starting up. In one embodiment, the BIOS may provide a set of parameters that puts the component 530 into a mode that provides lower performance but is a "safe" setting, as that term is commonly used in the computing industry. The computing system 114 may update/revise the set of parameters at a later point in the initialization process.

In embodiments where the computing system 114 is aware of the power management apparatuses 122a-c on the components 530a-c, the computing system 114 may communicate with the power management apparatuses 122a-c. The target module 610 may receive the power consumption target and other parameters from the system itself, or it may receive the power consumption target and other parameters from other components 530a-c that are aware of the power management apparatus 122.

In certain embodiments, the power management apparatuses 122, 122a-c may share and communicate information with one another. The information may be shared in accordance with a protocol, as described below. The power management apparatus 122 may have a master module 618 described below to facilitate sharing this information. The power management apparatus 122 in the system may also be configured to act as a single logical power management apparatus 122. Such embodiments may allow certain components 530 to be given more power at a particular time by lowering the power allotment for other components 530 in the system. As noted above, this power allotment may be dynamic.

The power management apparatus 122 may respond to direction from a user indicating that the functions of one particular component 530 are more important than those of another. For example, a user may indicate that establishing a strong wireless connection is more important than storage performance at a particular time. Thus, a component 530 that is a wireless card may be allowed to operate at full power while the power allotted to the component 530 that is a storage device, such as the storage device 102, is decreased. In other embodiments, the dynamic reallocation of power may be initiated by other components 530 or processes transparently to the user. For example, a particular solid state storage device 102 may be falling behind in reclaiming storage space as part of garbage collection due to the restrictions on power. The power management apparatus 122 may allocate more power to that solid state storage device 102 for a period of time to allow it to catch up, while decreasing the power allocation to other components 530 during that period.

In one embodiment, the throttle module 622 uses the operations module 614 to adjust operations for the component 530. The operations module 614, in one embodiment, associates the power consumption target, and other parameters received by the target module 610, with performance limits on the component 530. Performance limits, in one embodiment, include the adjustments of operations described above with regard to the throttle module 622 of FIG. 6A. For example, a power consumption target of 25 watts may be associated with one set of performance limits (i.e. operation adjustments) on the component 530, while a power consumption target of 20 watts may be associated with another set of performance limits (i.e. operation adjustments) on the component 530.

The parameters may include any data that specifies limitations on or information on how the component 530 can use power. The operations module 614 selects performance limits for the component 530 that correspond to the power consumption target provided to the target module 610. Performance limits, as used herein, are values, operation modes, adjustments, and/or rules that manage, limit, control, or otherwise adjust the performance of the component 530 to a level that corresponds to the parameters received or otherwise determined by the target module 610. In certain embodiments, the operations module 614 uses tables, indexes, and other structures to determine the appropriate performance limits for the given parameter inputs to the target module 610. By determining appropriate performance limits for the given parameter inputs (such as the power consumption target, the thermal target, or the like), the operations module 614 identifies a level of performance for the component 530 that the operations module 614 determines will provide the desired power consumption and/or thermal state of the component 530.

In certain embodiments, the operations module 614 associates the power consumption target and/or the thermal target with timer values or counter values used in controlling the component 530, thus limiting the performance, power consumption, and temperature of the component 530. Timers, in certain embodiments, may be used to control when, after an operation is started on a storage device, the controller polls to determine if the prior operation completed and before sending a new operation. Timers, in other embodiments, may be used to control how frequently operations are submitted to a storage device for execution.

For example, a solid state storage device may use timers, such as the tPROG wait time discussed above, to control when the software polls the hardware of the solid state storage device (such as the banks discussed above) to verify that an operation has completed before initiating a new operation. In one embodiment, the operations module 614 provides an increased time between the polling such that the controller polls the hardware of the solid state storage device less frequently. This causes a reduction in the number of operations per unit time, and a corresponding decrease in power consumption per unit time. In one embodiment, reducing a frequency with which operations are executed introduces downtime on a communications bus of the component 530, reducing bandwidth, throughput, and/or other performance of the component 530 as a tradeoff for reducing power consumption and/or temperature.

The schedule module 612 executes operations on the component 530 according to the performance limits selected by the schedule module 612. As a result, the component 530 may not operate as effectively as it would if full power were available; for example, the component 530 may operate at a lower bandwidth. However, in one embodiment, the component 530 may also consume less power during operation than it would without the performance limits. In one embodiment, the performance limits are set such that the actual power consumed by the component 530 under the performance limits is within a tolerable range, either above or below, the power consumption target, satisfying the power consumption target.

Thus, if the power consumption target is 50 mW, the actual power consumed by the component 530 when operating under the performance limits associated with a power consumption target of 50 mW is within a tolerable range of 50 mW. For example, the timers controlling the polling of the banks may be slowed to a point where average power usage is approximately 50 mW. Those of skill in the art will appreciate how to specify a tolerable range; in one embodiment, the tolerable range allows for a difference of 4% (for example) above or below the power consumption target.

While this application discusses specific approaches to reducing bandwidth on a storage device 102, those of skill in the art, in view of this disclosure, will appreciate that there are other ways to reduce bandwidth of a storage device 102 in a predictable fashion such that the power consumption of the storage device 102 may be reduced. Slowing timers and clocks, scheduling operations, and other approaches discussed herein are examples of approaches to achieve power management.

In certain embodiments, the power management apparatus 122 may also include the audit module 616. The audit module 616, in one embodiment, measures and/or monitors the actual power consumed by the component 530 and compares the actual power with a projected or expected power consumption of the component 530 that is a predicted amount of power that the component 530 uses when executing operations in accordance with the performance limits or other adjustments. The projected power consumption may be the power consumption target. In other embodiments, the projected power consumption is based on the power consumption target and the other parameters or adjustments governing the component 530. For example, the operations module 614 may determine that a first set of performance limits are appropriate for the parameters provided to the target module 610, and that the component 530 operating under the first set of performance limits will have a projected power consumption of 50 mW.

In one embodiment, the audit module 616 measures the actual power and compares it with the projected power consumption to determine whether the actual power consumption of the component 530 is within an allowable tolerance of the projected power consumption of the component 530 as specified by the power management apparatus 122, i.e. whether the actual power consumption satisfies the power consumption target. The actual power may be a measured power value; in other embodiments the actual power is an approximation based on at least one measurement. For example, assuming that voltage provided to the component 530 is constant, current measurements alone may be sufficient to determine an actual power value.

In one embodiment, the audit module 616 communicates with the throttle module 622 and makes appropriate adjustments and optimizations to bring the actual power usage of the component 530 closer to the projected power usage of the component 530 and/or closer to satisfying the power consumption target. For example, if the audit module 616 determines that the component 530 is consistently using more power than the power allocated to it, the audit module 616 may provide this information to the throttle module 622. The throttle module 622 may then adjust the performance limits and/or the operations of the component 530 to account for the discrepancy between the actual power and the projected power. For example, the throttle module 622 may use the operations module 614 to decrease the frequency of polling to reduce the actual power consumed by the device. The throttle module 622, in one embodiment, may store the adjustments such that, in the future, the performance limits selected for the particular set of parameters are the adjusted performance limits.

Thus, the audit module 616 may be used to ensure that the actual power usage of the component 530 is sufficiently close to the power usage that the power management apparatus 122 estimates to match the selected performance limits. The audit module 616 may also be used to allow the performance limits and/or operations of the component 530 to be adjusted and/or corrected during the life of the component 530, as the power consumption characteristics of components 530 often change over the life of the component 530. In the depicted embodiment, the audit module 616 includes the verification module 624. As described above with regard to FIG. 6A, in certain embodiments, the verification module 624 works with the audit module 616 to verify that specific adjustments to operations of the component 530 bring the power consumption rate within the power consumption target and/or bring the temperature of the component 530 away from the thermal ceiling.

In one embodiment, the power management apparatus 122 may also include a master module 618. The master module 618 allows the power management apparatus 122 to share and receive information from other power management apparatuses 122, 122a-c in the system. In certain embodiments, the master module 618 may assign operations to other power management apparatuses 122, 122a-c, and receive operations for execution from other power management apparatuses 122, 122a-c in the system. The master module 618 may also receive operations for execution from the computing system 114. The master module 618 may also manage priorities for operations in the system and dynamically reconfigure priorities. The master module 618 may dynamically adjust the power consumption target for the component 530 if there are changes in the power consumption or the power consumption needs of other components 530 in the system.

The master module 618 may also maintain a global or system power consumption target for the set of components 530a-c, not just the component 530a on which the master module 618 is operating. The master module 618 may apportion the global or system power consumption target among the components 530a-c, and change the local power consumption targets dynamically while ensuring that the components 530a-c do not cumulatively exceed the global power consumption target. As described herein, in certain embodiments, the components 530a-c may include the storage device 102 and/or each component 530a-c may comprise a storage device 102.

In certain embodiments, there is only one master module 618 that manages all of the power management apparatus 122 in the system. In other embodiments, the master module 618 is distributed across the power management apparatuses 122a-c, which master modules 618 share information. In certain embodiments, the power management apparatuses 122a-c use a default set of settings if the master module 618 goes offline or is otherwise unavailable for cooperative power management.

The master module 618 may also be used to coordinate power allocation within a single component 530. For example, as noted above, a solid state storage device may include multiple DIMMs, and the master module 618 may coordinate power allocation between the multiple DIMMs. The master module 618 may dynamically reallocate the power made available to each DIMM while ensuring that the component 530 itself does not exceed the power consumption target.

In one embodiment, the power management apparatus 122 includes a state module 620 that specifies various possible modes of operation for the component 530 for which the power management apparatus 122 is responsible. For example, one state may be a power disruption state, which causes the power management apparatus 122 to manage operations on the component 530 to manage the power disruption. Another state may be a power reduction state in which the power management apparatus 122 throttles performance to achieve power savings (i.e., when a computing system hosting the power management apparatus 122 moves to operate on battery power or other secondary power sources). Another state may be a thermal reduction state in which the power management apparatus 122 throttles performance to reduce the temperature of the component 530, the temperature output of the component 530, or the temperature of the enclosure housing the component 530.

While the above discussion has been directed primarily to power, given the relationship between power and thermal energy, the modules discussed above may be tailored to allow for thermal monitoring and to allow performance throttling as a thermal management tool for managing thermal temperature levels affected by the component 530. For example, the audit module 616 may also include the necessary hardware (i.e. sensors, temperature sub-systems, and the like) to monitor temperature on the component 530, as described above. In other embodiments, the audit module 616 monitors the temperature of an enclosure that contains the components 530a-c. The audit module 616, in certain embodiments, may use thermistors or other known hardware to monitor the temperature.

If a temperature detected by the audit module 616 is greater than a temperature threshold value or otherwise does not satisfy the thermal target, the state module 620 may put the component 530 in a temperature reduction state. In certain embodiments, the throttle module 622 may also store data that describes the thermal characteristics of operations; for example, the operations module 614 may define the average amount of heat given off during an erase operation, a read operation, or a program operation. The throttle module 622 may use the thermal characteristics to adjust or schedule execution of the operations on the component 530, as described above.

Those of skill in the art will appreciate that, given the close relationship between power consumption and heat, the techniques described in this application in connection to power management based on reducing power consumption may be effectively applied to reduce the thermal energy radiated by the component 530. In some cases, the application of these techniques may require an inverse adjustment such as activating a cooling system instead of, or in addition to, terminating certain operations, and/or adjusting the operating speed in completing queued operations. Similarly, the audit module 616 may monitor the actual temperature and adjust the thermal characteristics as necessary to ensure the component 530 is providing the expected level of thermal energy for the given thermal characteristics.

Managing Storage Device Lifetime

Figure 7A:
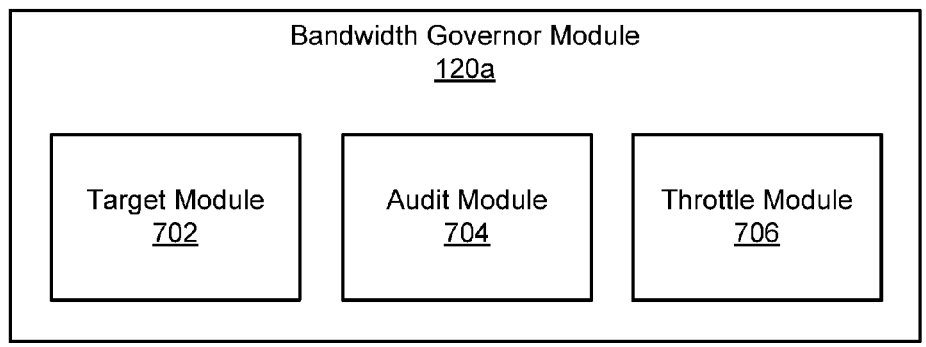
FIG. 7A is a schematic block diagram illustrating one embodiment of a bandwidth governor module.

FIG. 7A depicts one embodiment of a bandwidth governor module 120a. The bandwidth governor module 120a, in one embodiment, is substantially similar to the bandwidth governor module 120 described above with regard to FIG. 1A. In the depicted embodiment, the bandwidth governor module 120a includes a target module 702, an audit module 704, and a throttle module 706. Another embodiment of a bandwidth governor module 120b is described below with regard to FIG. 7B. In certain embodiments, the bandwidth governor module 120a may operate similarly to, be integrated with, be in communication with, and/or operate in conjunction with a power management apparatus 122. For example, in addition to managing a lifetime of a storage device 102, the target module 702, the audit module 704, and the throttle module 706 may monitor a power consumption rate and/or a temperature for the storage device 102, and the throttle module 706 may combine adjustments for lifetime management, power management, and/or temperature management into a single adjustment to write operations of the storage device 102 as described above with regard to FIG. 5.

In general, the target module 702 determines a write bandwidth target, the audit module 704 monitors a write bandwidth of a storage device 102 relative to the write bandwidth target, and the throttle module 706 adjusts execution of write operations on the storage device 102 in response to the write bandwidth failing to satisfy the write bandwidth target. While this description focuses on governing of write operations, in other embodiments, the bandwidth governor module 120a may monitor and adjust execution of write operations, erase operations, and/or other operations on a storage device 102 substantially as described herein with regard to write operations.

For certain types of storage media 110, such as NAND flash, write operations (i.e. program operations) and erase operations cause more stress on the storage device 102 than read operations. In certain embodiments, governing write/program operations indirectly governs erase operations because storage elements of the storage media 110 are typically erased prior to a write/program operation. Similarly, in certain embodiments, governing write operations may indirectly govern read operations, because a groomer, garbage collector, or the like may write frequently read data forward in a log on the storage media 110 more often than less frequently read data to prevent data errors due to read disturb or other phenomenon.

In other embodiments, the bandwidth governor module 120a may directly monitor and adjust erase operations and/or read operations instead of or in addition to governing write operations. In certain embodiments, that write data using a log-based sequential writing format and write to previously erased erase blocks, the bandwidth governor module 120 does not throttle erase operations because erase operations for certain non-volatile storage media 110 take the longest time to complete and erase operations are typically caused by the storage device 102 working to recover storage space to accommodate subsequent write/program operations. In other embodiments, the bandwidth governor module 120 throttles erase operations since the number of erases per unit of time constitutes an erase bandwidth.

In one embodiment, the target module 702 determines a write bandwidth target for a storage device 102. A write bandwidth target, as used herein, is a write bandwidth at which the storage device 102 may operate through a duration of a temporal lifetime, without exceeding an endurance rating for the storage device 102. The target module 702 may determine a write bandwidth target as an average, as a range, as a static value, as a dynamically determined and updated value, or the like.

The target module 702, in certain embodiments, determines the write bandwidth target for the storage device 102 dynamically throughout the temporal lifetime of the storage device 102. For example, the target module 702 dynamically adjusts the write bandwidth target once each write bandwidth sample period, as described below with regard to the audit module 704. In other embodiments, the target module 702 may determine a single static write bandwidth target spanning the temporal lifetime of the storage device 102. For example, the target module 702 may retrieve or otherwise receive a preset write bandwidth target defined by a manufacturer or vendor for the storage device 102, or the like. In embodiments where the audit module 704 determines a write bandwidth as an average, as described below, the target module 702 may determine the write bandwidth target as a target for the average write bandwidth.

In one embodiment, the target module 702 determines or adjusts the write bandwidth target based on a total amount of data written to the storage device 102 and on an elapsed amount of the temporal lifetime for the storage device 102. The target module 702, in a further embodiment, determines or adjusts the write bandwidth target so that the total amount of data written to the storage device 102 does not exceed the endurance rating for the storage device 102 within the temporal lifetime for the storage device 102. In certain embodiments, the write bandwidth target is a trajectory (explained in greater detail below in relation to FIG. 8D) between the current amount of written data on a storage device 102 and the endurance rating of the storage device 102, i.e., if the write bandwidth follows the write bandwidth trajectory, it will hit the endurance rating at the end of the temporal lifetime.

In one embodiment, the target module 702 dynamically determines a write bandwidth target by dividing a remaining amount of the endurance rating of a storage device 102 (in data units) by a remaining temporal lifetime for the storage device 102 (in time units). The target module 702, in one embodiment, determines the remaining amount of the endurance rating for a storage device 102 by subtracting a current total data written value for the storage device 102 (i.e. either total physical data or total user data written to the storage device 102 up to the current time) from an endurance rating value for the storage device 102 (i.e. the expected amount of data that may be written to the storage device 102 before wear-out occurs).

The audit module 704, in one embodiment, monitors a write bandwidth of an associated storage device 102 relative to a write bandwidth target, such as the write bandwidth target, described above with regard to the target module 702. The write bandwidth target, in certain embodiments, may be dynamic. In one embodiment, the audit module 704 determines whether or not a write bandwidth for a storage device 102 satisfies a write bandwidth target for the storage device 102. A write bandwidth, in various embodiments, may satisfy a write bandwidth target by being below the write bandwidth target, by being less than or equal to the write bandwidth target, by having an average below the write bandwidth target, and/or by having another predefined relationship with the write bandwidth target.

The audit module 704, in one embodiment, monitors write bandwidth for a storage device 102 by periodically determining the write bandwidth for the storage device 102. The audit module 704, in a further embodiment, determines a write bandwidth by counting, tallying, or otherwise determining how much data is written to a storage device 102 over one or more predefined time periods. In another embodiment, the audit module 704 subtracts a total amount of data written to a storage device 102 up to a previous time from a total amount of data written to the storage device 102 up to a current time to determine an amount of data written in a current time period (the time between the current time and the previous time). To determine the bandwidth for the current time period, the amount of data written in the current time period is divided by the length of the current time period.

In certain embodiments, the total amount of physical bytes written to a storage device 102 may be tracked or monitored by the solid-state storage controller 104. In such embodiments, the solid-state storage controller 104 may make the total amount of physical bytes written available to the audit module 704. In certain embodiments, the total amount of logical data bytes written to a storage device 102 may be tracked or monitored by the solid-state storage controller 104. The total amount of logical data bytes written may alternatively be made available to the audit module 704. Logical data bytes written typically includes user data and excludes metadata and data written as a result of grooming or data recovery.

In one embodiment, the audit module 704, a software driver for a storage device 102, a storage controller 104, or the like persistently stores a tally of the total physical amount of data written to a storage device 102. The tally may be persistently stored at intervals on the storage device 102. For example, in one embodiment, the audit module 704, a software device driver for a storage device 102, a storage controller 104, or the like may store the tally of the total amount of data written to a storage device 102 with metadata stored on the solid-state storage media 110 associated with each erase block, such as a PEB, a logical erase block ("LEB"), or the like, or with each of another type of segment of the storage device 102. Preferably, this metadata is written before user data for a PEB or LEB is written. In this manner, in embodiments that write new PEBs or LEBs as part of a log-based set of sequential writes, a running total for the physical bytes written to the media 110 is persistently preserved before any additional data is written to the storage device 102.

One location in which the audit module 704, a software driver for a storage device 102, a storage controller 104, or the like may store the total written data tally is with other metadata in an erase block opener at the beginning of each erase block as data is written sequentially to the storage device 102. An erase block opener, in certain embodiments, is a set of data written to an erase block with metadata for the erase block, metadata for the storage device 102, or the like. In one embodiment, an erase block opener is written to each erase block in succession with updated statistics, counts, tallies, or other metadata for the storage device 102 such that the most recently written erase block opener includes the most recent metadata. The audit module 704, in one embodiment, reads or determines the current total written data tally up through the end of a current sampling period and subtracts a total written data tally up through the previous sampling period to determine the amount of data written during the current sample period.

Embodiments of the present invention determine a trend for bandwidth use over time in relation to the predetermined temporal lifetime and predetermined endurance rating of the storage device 102. Given that the predetermined temporal lifetime and predetermined endurance rating are known, the average amount of data that can be written per unit of time can be determined at any time in the temporal lifetime of the storage device 102.

Of course, the amount of data remaining for a specified endurance rating depends on the amount of write data used at a given time in the temporal lifetime. Given that use of the storage device 102 to write data varies over time, embodiments of the present invention automatically determine a current usage trend, represented by the bandwidth usage, and determine what adjustments (increasing or decreasing available bandwidth) are required such that the actual bandwidth usage equals the average bandwidth usage when the current time equals the temporal lifetime.

Due to the potential variance in the use patterns for the storage device 102, the audit module 704, in certain embodiments, may employ one or more smoothing techniques for determining a bandwidth usage trend for the storage device 102. Based on the results of the smoothing techniques, the throttle module 706 may engage to restrict or permit bandwidth usage levels to ensure the overall bandwidth usage will satisfy the temporal lifetime and endurance rating constraints.

Those of skill in the art will recognize a variety of smoothing techniques which may be used for time series data such as the amount of bandwidth used within a given period of time in relation to the overall time period. Examples of other smoothing techniques that can be used with embodiments of the present invention include median smoothing, distance weighted least squares smoothing, exponentially weighted smoothing, negative exponentially weighted smoothing, bicubic splines smoothing, or the like. While these various smoothing techniques may be used with different embodiments of the present invention, in preferred embodiments, the smoothing technique used accounts to bursts of write operations over a given period of time as provided by the moving average smoothing technique. Those of skill in the art recognize that variations on the moving average smoothing technique may be used within the scope of the present invention.

In certain embodiments, the audit module 704 uses moving average smoothing. Moving average smoothing replaces each element of the time series data with an average or weighted average of measurements from n surrounding elements of the time series. n represents the "window" of data measurements used to determine the moving average.

In one embodiment, the audit module 704 determines the write bandwidth of a storage device 102 by calculating a total average, a moving average (a.k.a. a rolling average, rolling mean, or running average), a decaying average, or the like over a predefined period. The audit module 704 determines a moving average write bandwidth, in one embodiment, using a moving or sliding window.

The predefined period of the moving average, in one embodiment, defines a size of the moving or sliding window. In a further embodiment, the moving or sliding window includes a predefined number of write bandwidth samples. The number of write bandwidth samples, in one embodiment, is defined by a sampling period and the size of the moving window. For example, if the sampling period is one minute and the predefined period or size of the moving window is eight hours, the moving window may include 480 write bandwidth samples, one for each minute of the eight hour period. For each sample period, in one embodiment, the oldest write bandwidth sample moves out of the moving window, and one new sample (the most recent or youngest sample) is added to the moving window.

The audit module 704, in certain embodiments, maintains a data structure for the moving window that stores the write bandwidth samples such that the write bandwidth samples are preserved between sample periods and are not re-determined each cycle. In each new sample period, the audit module 704 removes the oldest write bandwidth sample from the moving window data structure and adds the new sample to the moving window data structure. Advantageously, using a moving window greatly decreases the overhead required to compute the moving average for each sample period because one sample is removed from one end of the window and one sample is added to the other end of the window rather than computing or identifying a write bandwidth sample for each sample in the window over again each sample period. In one embodiment, by determining the write bandwidth as a moving or decaying average, the audit module 704 accounts for bursts of data within the moving window, as long as the average bandwidth within the moving window satisfies the write bandwidth target, because the bursts of data are amortized over the moving window.

Each write bandwidth sample, in one embodiment, includes a total amount of data written to the storage device 102 during the sampling period divided by the sampling period, so that substantially all data written to the storage device 102 is accounted for in each write bandwidth sample. In a further embodiment, each write bandwidth sample may include an instantaneous bandwidth at a sampling time, such as a number of current writes, or the like, and the write bandwidth samples may not necessarily account for all data written to the storage device 102. The audit module 704, in one embodiment, determines the moving average write bandwidth once each sampling period.

The audit module 704, in one embodiment, includes both user data and metadata (i.e. in-band and out-of-band data) write operations on the storage device 102 in the determined write bandwidth, so that the write bandwidth is a total write bandwidth for the storage device 102. As described above with regard to FIG. 3, in certain embodiments, the write bandwidth includes all physical bytes written to the storage device 102, including write operations of a groomer or garbage collector, and/or other device level write operations. In a further embodiment, the write bandwidth may represent a logical amount of data written to the storage device 102 that is a subset of an actual amount of data written to the storage device 102. For example, in one embodiment, the write bandwidth may include write operations for user data (i.e. in-band data) and exclude write operations for metadata (i.e. out-of-band data), write operations from a groomer or garbage collector, and/or other write data.

The endurance rating of the storage device 102, in one embodiment, is selected to correspond to the types of write data included in the write bandwidth, such as all data written to the storage device 102, user data written to the storage device 102, or the like. The throttle module 706, in one embodiment, adjusts execution of write operations on the corresponding storage device 102 in response to the write bandwidth for the storage device 102 failing to satisfy the write bandwidth target. In a further embodiment, the throttle module 706 adjusts execution of write operations on the storage device 102 to remove or release bandwidth restrictions in response to the write bandwidth for the storage device 102 satisfying the write bandwidth target. In one embodiment, the throttle module 706 adjusts write operations for a subsequent sample period based on a write bandwidth (such as an average write bandwidth, a moving average write bandwidth, or the like) of a previous sample period.

As described above, in various embodiments, a write bandwidth fails to satisfy a write bandwidth target by exceeding a write bandwidth target, by approaching a write bandwidth ceiling defined by a write bandwidth target, by exceeding a write bandwidth target or threshold set below a write bandwidth ceiling, by being outside a range of allowable write bandwidth defined at least in part by a write bandwidth target, or the like. As described above, in certain embodiments, the write bandwidth may be an average write bandwidth, a moving average write bandwidth, or the like, and the throttle module 706 may adjust execution of write operations based on whether the average write bandwidth, moving average write bandwidth, or the like satisfies a write bandwidth target.

In one embodiment, the throttle module 706 determines whether or not the write bandwidth satisfies the write bandwidth target once for each write bandwidth sample period and potentially adjusts write operations once after each write bandwidth sample period. As discussed above with regard to the target module 702, in one embodiment, the target module 702 dynamically adjusts the write bandwidth target once each write bandwidth sample period. In other embodiments, the target module 702 may determine a single static write bandwidth target spanning the temporal lifetime of the storage device 102.

In one embodiment, the throttle module 706 adjusts write operations by throttling or slowing down write operations on the storage device 102 to lower the write bandwidth of the storage device 102. The throttle module 706, in one embodiment, throttles or slows write operations proportionally to the amount that the write bandwidth (which may be an average write bandwidth), exceeds the write bandwidth target. For example, in one embodiment, the throttle module 706 adjusts or throttles write operations using a scale between no adjustment and a predefined maximum adjustment and selects an adjustment to make along the scale in proportion to the amount that the write bandwidth exceeds the write bandwidth target. If, in the example embodiment, the scale ranges from 0 to 10, 10 being the predefined maximum adjustment, and the write bandwidth exceeds the target write bandwidth by 30%, in one embodiment, the throttle module 706 adjusts write operations by a level 3 on the scale. If the write bandwidth satisfies the write bandwidth target, in the example embodiment, the throttle module 706 adjusts write operations by a level 0 on the scale, in one embodiment, making no adjustment.

In one embodiment, the predefined maximum adjustment is a maximum allowed adjustment defined by a manufacturer, a vendor, a user or the like as the maximum level of throttling allowed for the storage device 102. For example, in one embodiment, the maximum allowed adjustment may be set to 100 megabytes per second, or the like, to ensure both usability of the storage device 102 while ensuring that the amount of data associated with the endurance rating of the storage device 102 is not consumed before the temporal lifetime of the storage device 102 expires.

In a further embodiment, the maximum adjustment may be a maximum possible adjustment, the maximum amount that the throttle module 706 is capable of throttling write operations. In one embodiment, a maximum possible adjustment may comprise stopping, quiescing, and/or blocking write operations for a period of time. In various embodiments, the throttle module 706 may stop, quiesce, and/or block write operations by holding the operations in a queue, responding to a write request with an error, denying a write request, or the like. Denied write requests, in certain embodiments, may be resubmitted at a later time. The throttle module 706, in a further embodiment, maintains throttled write requests in a queue to execute at a later time when excess write bandwidth is available, without a resubmission of the write requests. In one embodiment, the predefined maximum adjustment is set such that, once throttled, if data were written to the storage device 102 at a write bandwidth consistent with the predefined maximum adjustment continuously for the entire temporal lifetime of the storage device 102, the amount of data written would be at or below the endurance rating of the storage device 102 at the expiration of the temporal lifetime.

The throttle module 706, in one embodiment, adjusts write operations on the storage device 102 by reducing or otherwise adjusting a frequency with which the write operations are executed on the storage device 102. In certain embodiments, the throttle module 706 adjusts the frequency of write operations by adjusting a clock rate, clock speed, or clock frequency of a synchronous circuit of the storage device 102. In one embodiment, the throttle module 706 performs a front-end adjustment, adjusting a frequency with which write operations are submitted to the storage device 102 for execution. In another embodiment, the throttle module 706 performs a back-end adjustment, adjusting the frequency of write operations by setting a timer value specifying a frequency with which hardware of the storage device 102 polls to verify that a write operation has completed, or the like.

For example, in one embodiment, where the storage device 102 includes a nonvolatile solid-state storage device such as the storage device 102 depicted in FIG. 1A, the throttle module 706 may adjust a tPROG wait time for the storage device 102 and increasing the tPROG wait time reduces the frequency of program (i.e. write) operations for the storage device 102. For nonvolatile solid-state storage, such as Flash memory, the tPROG wait time is the period of time between submitting a program command to a memory area (such as a die, a bank, a physical or logical page, or the like) and submitting a subsequent command to the same memory area. In certain embodiments, the subsequent command is typically a status command, such as a READ STATUS command or the like, to verify that the program command has completed, was successful, or the like. Increasing the tPROG wait time, in certain embodiments, increases the amount of time that program operations appear to take, thereby slowing or throttling execution of program operations.

As described above with regard to the bandwidth governor module 120 of FIG. 1A, in certain embodiments, the bandwidth governor module 120a stops governing bandwidth of the storage device 102 when the temporal lifetime of the storage device 102 expires. The throttle module 706, in one embodiment, stops throttling or placing artificial constraints on write bandwidth in response to the temporal lifetime expiring. In another embodiment, the bandwidth governor module 120a and the throttle module 706 stop governing bandwidth for the storage device 102 in response to the target module 702 determining that the endurance rating for the storage device 102 can no longer be exceeded during the temporal lifetime of the storage device 102. For example, once the write bandwidth target exceeds a maximum possible write bandwidth for the storage device 102, throttling or governing write bandwidth may no longer be useful, as the endurance rating cannot be exceeded during the remaining temporal lifetime, and the bandwidth governor module 120a may stop monitoring and governing the write bandwidth. The write bandwidth target may exceed the maximum possible write bandwidth if the storage device 102 is disconnected or unused for a period of time, if the storage device 102 has a low write bandwidth for a period of time, or the like.

The bandwidth governor module 120a, in one embodiment, is arranged in a system of a plurality of bandwidth governor modules 120a, similar to the system of a plurality of power management apparatuses 122, 122a-c described above with regard to FIG. 5. Depending on whether the system is arranged with a single system bandwidth governor module 120a, with master/slave bandwidth governor modules 120a with peer bandwidth governor modules 120a, or in another arrangement, such a system may include one or more target modules 702, one or more audit modules 704, and/or one or more throttle modules 706, which may function substantially as described above with regard to FIG. 5.

For example, in one embodiment, each bandwidth governor module 120a may include a target module 702, an audit module 704, and a throttle module 706. In a further embodiment, just a master or system bandwidth governor module 120a may include a target module 702, an audit module 704, and a throttle module 706. In another embodiment, a master bandwidth governor module 120a may include a target module 702, an audit module 704, and a throttle module 706, and one or more slave bandwidth governor modules 120a may include just a throttle module 706, or the like. In view of this disclosure, one of skill in the art will recognize other arrangements and combinations of target modules 702, audit modules 704, and throttle modules 706 suitable for use in a system with a plurality of components 530a-c as described above with regard to FIG. 5.

In one embodiment, the storage device 102 may include several different modular data storage elements, which may be installed in and removed from the storage device 102 independently. The modular data storage elements may have different temporal lifetimes, different ages (elapsed amount of temporal lifetime), different endurance ratings, or other different characteristics. The bandwidth governor module 120a may manage lifetimes for the modular data storage elements independently, with the target module 702 determining separate write bandwidth targets for each modular data storage element, the audit module 704 monitoring write bandwidths independently for each modular data storage element, the throttle module 706 adjusting execution of write operations independently for each modular data storage element, and the like. For example, the target module 702 may determine an elapsed amount of temporal lifetime separately for each modular data storage element, and the like.

In another embodiment, the bandwidth governor module 120a may manage lifetimes for the modular data storage elements together. For example, the target module 702 may determine an elapsed amount of temporal lifetime based on an oldest modular data storage element, and use the elapsed amount of temporal lifetime to determine a single write bandwidth target for the modular data storage elements, or the like.

Figure 7B:
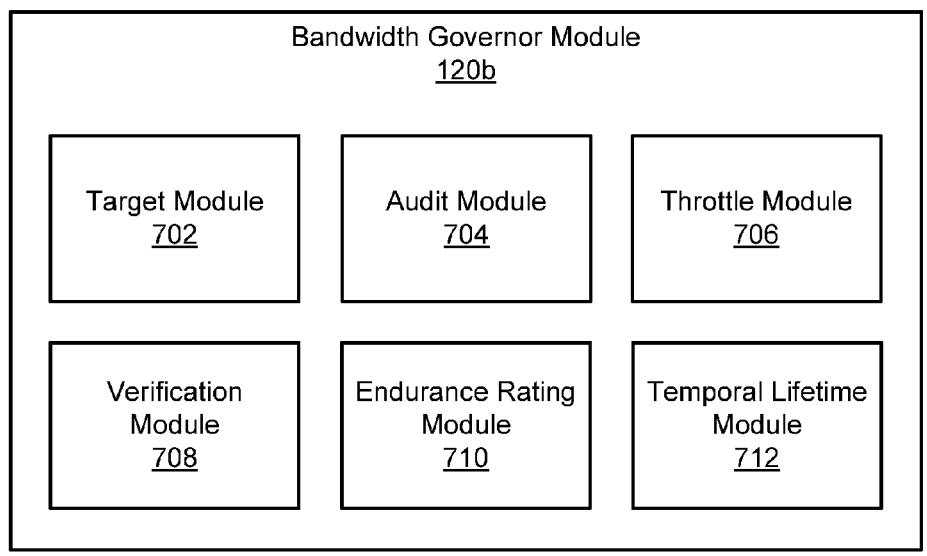
FIG. 7B is a schematic block diagram illustrating another embodiment of a bandwidth governor module.

FIG. 7B depicts another embodiment of a bandwidth governor module 120b. The bandwidth governor module 120b, in one embodiment, is substantially similar to the bandwidth governor module 120 described above with regard to FIG. 1A and/or the bandwidth governor module 120a described above with regard to FIG. 7A. In the depicted embodiment, the bandwidth governor module 120b includes the target module 702, the audit module 704, and the throttle module 706, and further includes a verification module 708, an endurance rating module 710, and a temporal lifetime module 712.

The verification module 708, in one embodiment, verifies whether the write bandwidth of the corresponding storage device 102 satisfies the write bandwidth target in response to the throttle module 706 adjusting execution of write operations on the storage device 102. The verification module 708, in one embodiment, is substantially similar to, is integrated with, is in communication with, cooperates with, and/or performs similar functions to the audit module 704. For example, in one embodiment, the verification module 708 may be part of or integrated with the audit module 704 and may compare a write bandwidth from prior to the adjustment of write operations to a write bandwidth from after the adjustment of write operations. In a further embodiment, the verification module 708 may compare a write bandwidth directly to the write bandwidth target to determine whether the write bandwidth satisfies the write bandwidth target, during a subsequent write bandwidth sample period, or the like. In one embodiment, the audit module 704 automatically verifies whether the write bandwidth satisfies the write bandwidth target in each sample period.

In one embodiment, instead of or in addition to verification by the audit module 704, the verification module 708 waits a predefined period of time, such as several write bandwidth sample periods or the like, after the throttle module 706 adjusts the write operations before verifying that the write bandwidth of the storage device 102 satisfies the write bandwidth target. For example, in various embodiments, the predefined period of time may be selected to account for throughput of the adjustments, or the like. In one embodiment, if the verification module 708 determines that the write bandwidth fails to satisfy the write bandwidth target, the throttle module 706 readjusts execution of subsequent write operations on the storage device 102.

In a further embodiment, the verification module 708 may adjust, update, or otherwise set a scale or amplitude for adjustments by the audit module 704 based on the efficacy of previous adjustments by the audit module 704. For example, in certain embodiments, if the verification module 708 determines that the write bandwidth of the storage device 102 does not satisfy the write bandwidth target in response to a previous adjustment to execution of write operations, the verification module 708 may update an adjustment scale to increase the amplitude of subsequent adjustments by the audit module 704, or the like.

In bandwidth governor module 120b, the endurance rating module 710 provides the current total data written value and the endurance rating value to the target module 702. The target module 702, in a further embodiment, determines the remaining temporal lifetime for a storage device 102 by subtracting an elapsed amount of a temporal lifetime for the storage device 102 from a temporal lifetime value for the storage device 102. The temporal lifetime module 712, in one embodiment, provides the elapsed amount of the temporal lifetime and the temporal lifetime value to the target module 702.

In one embodiment, the endurance rating module 710 stores an endurance rating value in persistent storage of the storage device 102 and/or retrieves a stored endurance rating value from persistent storage of the storage device 102. The temporal lifetime module 712, in one embodiment, stores a temporal lifetime value in persistent storage of the storage device 102 and/or retrieves a stored temporal lifetime value from persistent storage of the storage device 102. Preferably, the temporal lifetime module 712 stores the stored temporal lifetime in a location and manner inaccessible to a user of the storage device 102. Similarly, the endurance rating module 710 may store the endurance rating in a location and manner that is inaccessible to a user of the storage device 102. In this manner, the current temporal lifetime and/or the endurance rating may be unchangeable by a user and may also be tamper proof and/or tamper detectable.

The bandwidth governor module 120b may also encrypt, lock, or otherwise secure the write bandwidth target itself, write bandwidth target settings, or other write bandwidth target information to prevent a user from tampering with or circumventing the bandwidth governor module 120b. In certain embodiments, if the bandwidth governor module 120b detects that a user has tampered with an endurance rating, a temporal lifetime value, a write bandwidth target, and/or another write bandwidth setting for a storage device 102, the bandwidth governor module 120b may void a warrantee of the storage device 102. For example, the bandwidth governor module 120b may set an indicator that the warrantee is void, notify a user that the warrantee is void, notify a vendor or manufacturer that the warrantee is void, or the like.

As described above with regard to FIG. 1, persistent storage of the storage device 102 may include a PROM, such as a MID-PROM or the like that stores vendor specific device characteristics for the storage device 102. In one embodiment, the endurance rating value, current temporal lifetime, and/or other data stored in a MID-PROM or other persistent storage may be encrypted, digitally signed, or otherwise protected from tampering. In certain embodiments, instead of the endurance rating module 710 and the temporal lifetime module 712 storing values in persistent storage of the storage device 102, a vendor, a manufacturer, or the like may store the endurance rating value and the temporal lifetime value in persistent storage of the storage device 102 and the endurance rating module 710 and the temporal lifetime module 712 may retrieve the values.

In one embodiment, the endurance rating module 710 and the temporal lifetime module 712, a software driver for a storage device 102, a storage controller 104, or the like store counts or tallies of the total amount of data written to the storage device 102 and the elapsed amount of the temporal lifetime for the storage device 102. These counts or tallies and elapsed time values may be stored at intervals on the storage device 102. As described above with regard to the audit module 704, in one embodiment, a count or tally of the total amount of data written to a storage device 102 is stored each time an erase block, such as a PEB, an LEB, or the like are written to the storage device 102, in an erase block header (aka an "opener") or other set of metadata. In one embodiment, the counts or tallies of the total amount of data written to the storage device 102 and the elapsed amount of the temporal lifetime for the storage device 102 are encrypted, digitally signed, or otherwise protected from tampering.

In embodiments where a software driver for the storage device 102, a storage controller 104, or the like determines and stores the total data written amount and the elapsed temporal lifetime amount, the endurance rating module 710 and the temporal lifetime module 712, in one embodiment, retrieve the stored amounts and provide them to the target module 702, the audit module 704, the verification module 708, and/or other modules. In one embodiment, a portion of the bandwidth governor module 120b that is part of a software driver on the computing device 114 determines the total data written amount, the elapsed temporal lifetime amount, or the like, to prevent computation error that may be present using fixed point computations on a storage controller 104 or other embedded system.

The elapsed temporal lifetime amount, in various embodiments, may be measured from different start times, such as a time when the storage device 102 is manufactured, a time when the storage device 102 is purchased, a time when the storage device 102 is first attached to a computing system 114, a time when data is first written to the storage device 102.

The elapsed temporal lifetime amount, in one embodiment, is a total amount of time from the start time. In a further embodiment, the elapsed temporal lifetime amount includes only times when the storage device 102 is in a predefined state, such as attached to a computing system 114, powered on, or the like. In one embodiment, a storage device 102 is "attached" when the storage device 102 is capable of, or ready to, write data to the storage device 102. A software driver for a storage device 102, in certain embodiments, may attach the storage device 102 using an attach command at some point after the software driver loads. In one embodiment, by measuring the elapsed temporal lifetime amount as an amount of time that a storage device 102 is attached, the temporal lifetime of the storage device 102 represents usage time or attached time.

In one embodiment, the elapsed temporal lifetime amount is a relative time based on the selected start time, instead of an absolute time based on a system clock or other external time source. For example, in one embodiment, the elapsed temporal lifetime amount may be a timer or counter that starts at time zero as the start time. Basing the elapsed temporal lifetime amount on a start time, in certain embodiments, provides consistent measurement of elapsed temporal lifetime as a storage device 102 is moved between different computing systems 114, different time zones, or the like that are not affected by incorrect or improperly set system clocks or other time data.

Figure 8A:
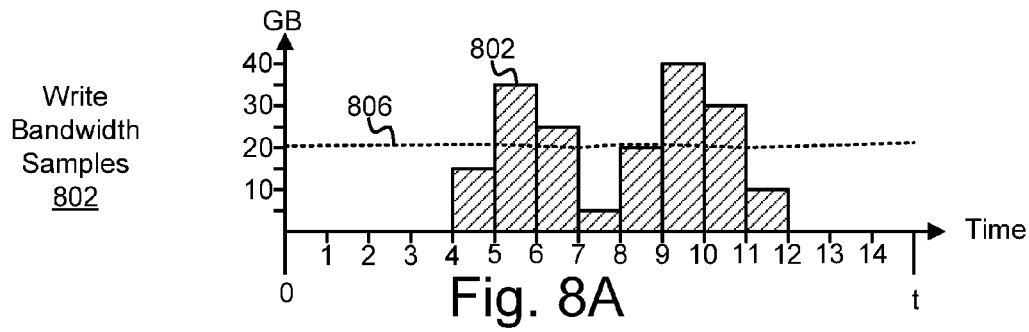
FIG. 8A is a schematic block diagram illustrating one embodiment of write bandwidth samples for a storage device.
Figure 8B:
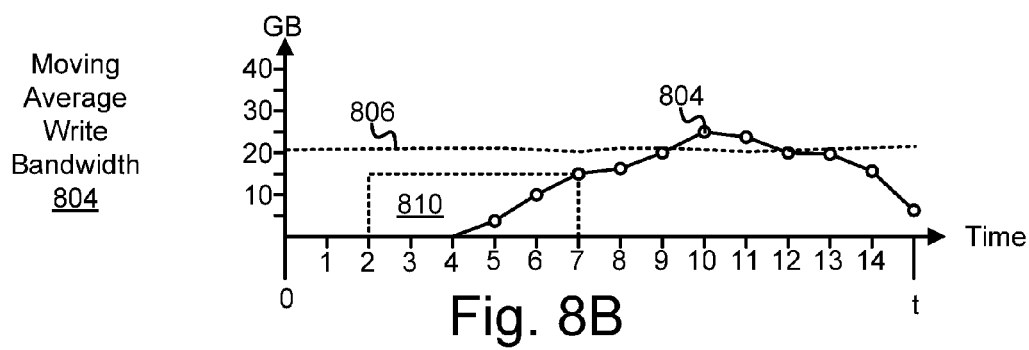
FIG. 8B is a schematic block diagram illustrating one embodiment of a moving average write bandwidth for a storage device.
Figure 8C:
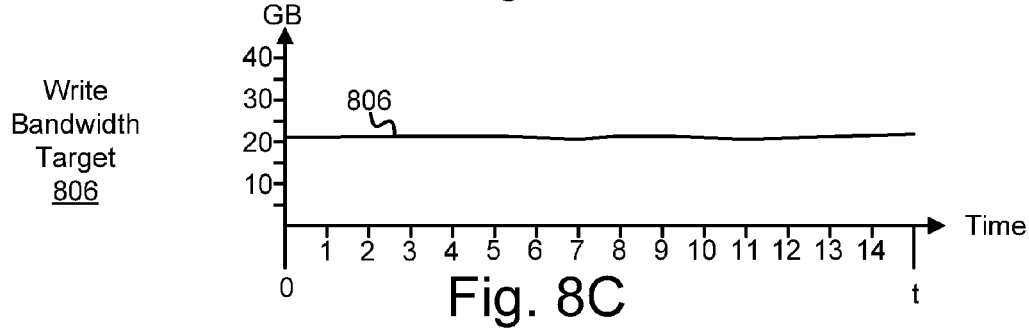
FIG. 8C is a schematic block diagram illustrating one embodiment of a write bandwidth target for a storage device.
Figure 8D:
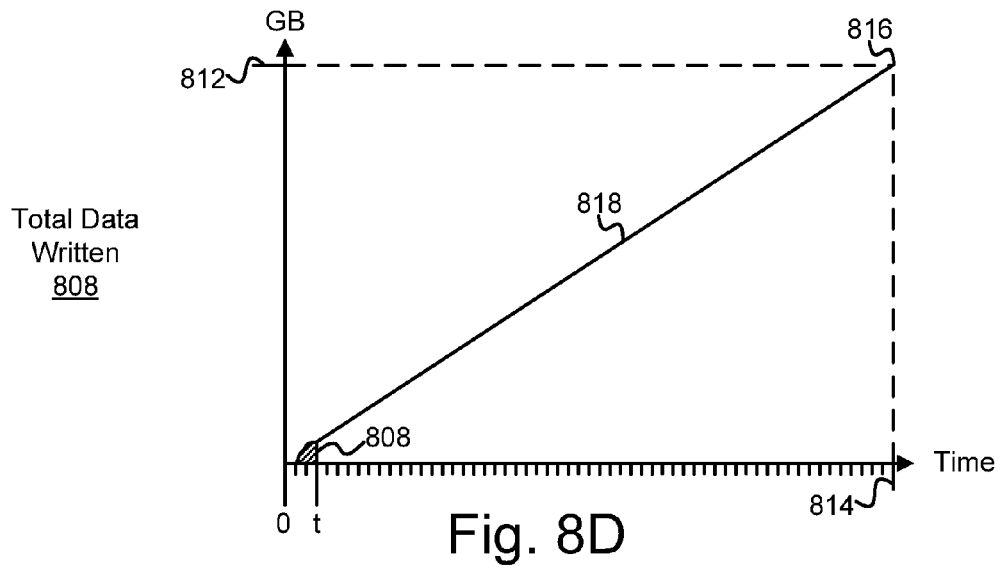
FIG. 8D is a schematic block diagram illustrating one embodiment of a total amount of data written for a storage device.

FIGS. 8A, 8B, 8C, and 8D depict embodiments of results of lifetime management for a storage device 102. The results are depicted as graphs of write bandwidth samples 802 (FIG. 8A), a moving average write bandwidth 804 (FIG. 8B), a write bandwidth target 806 (FIG. 8C), and a total data written 808 (FIG. 8D). For simplicity of depiction, for the depicted graphs 802, 804, 806, 808, a write bandwidth sample period of 1 hour, a moving window size of 5 hours, an endurance rating of 4 petabytes, and a temporal lifetime of 5 years are used. In other embodiments, write bandwidth sample periods from many times a second to once a day or less may be used, as well as various values for moving window sizes, endurance ratings, temporal lifetimes, and the like. One of skill in the art, in light of this disclosure, will recognize various ranges of possible values for write bandwidth sample periods, moving window sizes, endurance ratings, temporal lifetimes, and the like for governing write bandwidth of a storage device 102.

The graph of write bandwidth samples 802, as depicted in FIG. 8A, shows write bandwidth samples 802 over time relative to a dynamic write bandwidth target 806. The write bandwidth sample 802 for each sampling period or hour, in the depicted embodiment, represents a number of gigabytes of data written to the storage device 102 in the sampling period. Although, for clarity of illustration, the write bandwidth samples 802 are depicted as bars lasting the entire hour, in one embodiment, a write bandwidth sample 802 is measured at the end of a sampling period and represents a total of data written during the sampling period. In other embodiments, write bandwidth samples 802 may be instantaneous bandwidths or other types of samples.

In the depicted embodiment, the target module 702 divides 4 petabytes by 5 years to determine a write bandwidth target 806 of 22.83 gigabytes per hour. In the depicted embodiment, the target module 702 re-determines the write bandwidth target 806 at each sample period, (e.g. hour). As depicted, the target module 702 increases the write bandwidth target 806 slightly when the write bandwidth samples 802 are below the write bandwidth target 806 and decreases the write bandwidth target 806 slightly when the write bandwidth samples 802 exceed the write bandwidth target 806.

The adjustments to the write bandwidth target 806, as depicted in FIG. 8C, are due to the changes in the slope of a trajectory 818 between the total data written 808 at time t and the intersection of an endurance rating value 812 and a temporal lifetime value 814, shown in FIG. 8D. The target module 702, in one embodiment, sets the write bandwidth target 806 as the slope of the trajectory 818 of FIG. 8D, by subtracting the total data written 808 from the endurance rating value 812 and dividing the result by the result of time t (the currently elapsed amount of the temporal lifetime 814) subtracted from the temporal lifetime value 814, i.e. the rise of the trajectory 818 divided by the run of the trajectory 818.

In the depicted embodiment, the audit module 704 determines that no data was written to the storage device 102 for the first 4 hours and the throttle module 706 determines that the moving average write bandwidth 804 satisfies the write bandwidth target 806. The audit module 704 determines that, during the fifth hour (between time 4 and time 5), 15 gigabytes were written to the storage device 102. The audit module 704, in the depicted embodiment, uses the total amount of data written to the storage device 102 between time 0 and time 5 (the moving window size) of 15 gigabytes, divided by 5 hours, to determine a moving average write bandwidth 804 of 3 gigabytes per hour. The throttle module 706 determines that the moving average write bandwidth 804 satisfies the write bandwidth target 806.

The audit module 704 determines that, during the sixth hour, 35 gigabytes were written to the storage device 102. The audit module 704, in the depicted embodiment, uses the total amount of data written to the storage device 102 between time 1 and time 6 (the moving window) of 50 gigabytes, divided by 5 hours, to determine a moving average write bandwidth 804 of 10 gigabytes per hour. As the audit module 704 adds the sixth hour to the moving window, the first hour falls out of the moving window. The throttle module 706 determines that the moving average write bandwidth 804 satisfies the write bandwidth target 806, even though the write bandwidth sample 802 was a burst of data that exceeded the write bandwidth target 806 by nearly double.

The audit module 704 determines that, during the seventh hour, 25 gigabytes were written to the storage device 102. The audit module 704, in the depicted embodiment, uses the total amount of data written to the storage device 102 between time 2 and time 7 (the moving window) of 75 gigabytes, divided by 5 hours, to determine a moving average write bandwidth 804 of 15 gigabytes per hour. The throttle module 706 determines that the moving average write bandwidth 804 satisfies the write bandwidth target 806, even though the write bandwidth sample 802 for hour 7 exceeded the write bandwidth target 806. The graph for the moving average write bandwidth 804, as depicted, illustrates the moving window 810 for hour 7, drawn to scale. The area of the write bandwidth samples 802 of the moving window 810 for hour 7, in the depicted embodiment, is equal to the depicted area for the moving window 810. The audit module 704 averages or amortizes the bursts in the write bandwidth samples 802 over the entire moving window 810.

The audit module 704 determines that, during the eighth hour, 5 gigabytes were written to the storage device 102. The audit module 704, in the depicted embodiment, uses the total amount of data written to the storage device 102 between time 3 and time 8 (the moving window) of 80 gigabytes, divided by 5 hours, to determine a moving average write bandwidth 804 of 16 gigabytes per hour. The throttle module 706 determines that the moving average write bandwidth 804 satisfies the write bandwidth target 806.

The audit module 704 determines that, during the ninth hour, 20 gigabytes were written to the storage device 102. The audit module 704, in the depicted embodiment, uses the total amount of data written to the storage device 102 between time 4 and time 9 (the moving window) of 100 gigabytes, divided by 5 hours, to determine a moving average write bandwidth 804 of 20 gigabytes per hour. The throttle module 706 determines that the moving average write bandwidth satisfies the write bandwidth target 806, because the moving average write bandwidth 804 of 20 gigabytes is still below the write bandwidth target 806.

The audit module 704 determines that, during the tenth hour, 40 gigabytes were written to the storage device 102. The audit module 704, in the depicted embodiment, uses the total amount of data written to the storage device 102 between time 5 and time 10 (the write bandwidth sample 802 for the fifth hour falls out of the moving window) of 125 gigabytes, divided by 5 hours, to determine a moving average write bandwidth 804 of 25 gigabytes per hour. The throttle module 706 determines that the moving average write bandwidth 804 of 25 gigabytes per hour exceeds the write bandwidth target 806, and the throttle module 706 slows or throttles execution of write operations on the storage device 102. In one embodiment, because the moving average write bandwidth 804 of 25 gigabytes per hour is about 10% greater than the write bandwidth target 806, the throttle module 706 adjusts execution of write operations in proportion, such as an adjustment of 1 on a scale of 1 to 10, or the like.

The audit module 704 (and/or the verification module 708) determines that, during the eleventh hour, 30 gigabytes were written to the storage device 102, even with the write bandwidth adjustments that the throttle module 706 made based on the write bandwidth of the tenth hour. The audit module 704, in the depicted embodiment, uses the total amount of data written to the storage device 102 between time 6 and time 11 (the write bandwidth sample 802 for the sixth hour falls out of the moving window) of 120 gigabytes, divided by 5 hours, to determine a moving average write bandwidth 804 of 24 gigabytes per hour. The throttle module 706 determines that the moving average write bandwidth 804 of 24 gigabytes per hour still exceeds the write bandwidth target 806, and the throttle module 706 readjusts execution of write operations on the storage device 102. In one embodiment, because the moving average write bandwidth 804 of 24 gigabytes per hour is less than the previous moving average write bandwidth 804 of 25 gigabytes, the throttle module 706 may adjust execution of write operations slightly less than the adjustment made based on hour 10, increasing the rate that write operations may be executed in the following sample period between time 11 and time 12.

The audit module 704 (and/or the verification module 708) determines that, during the twelfth hour, 10 gigabytes were written to the storage device 102. The audit module 704, in the depicted embodiment, uses the total amount of data written to the storage device 102 between time 7 and time 12 (the write bandwidth sample 802 for the seventh hour falls out of the moving window) of 105 gigabytes, divided by 5 hours, to determine a moving average write bandwidth 804 of 21 gigabytes per hour. The throttle module 706 determines that the moving average write bandwidth satisfies the write bandwidth target 806, because the moving average write bandwidth 804 of 21 gigabytes is slightly below the write bandwidth target 806 so the throttle module 706 decreases or removes the throttling adjustments to write operations on the storage device 102.

In the depicted embodiment, the throttle module 706 adjusts write operations during a sample period based on the moving average write bandwidth 804 of the previous sample period. In the depicted embodiment, the throttle module 706 increases throttling to slow the allowed rate of write operations as the moving average write bandwidth 804 exceeds the write bandwidth target 804 (i.e. time 10), decreases throttling to increase the allowed rate of write operations as the moving average write bandwidth 804 moves toward the write bandwidth target 806 (i.e. time 11), and removes throttling restrictions on write bandwidth as the moving average write bandwidth 804 falls below the write bandwidth target 806 (i.e. time 12). If usage patterns permit, in certain embodiments, the bandwidth governor module 120 may impose little or no bandwidth governing on the storage device 102 such that full bandwidth is available to a storage client 118 for at least a certain period of time.

In the depicted embodiment, no data is written to the storage device 102 during the thirteenth, fourteenth, and fifteenth hours up to time t. As time progresses, the eighth, ninth, and tenth hour write bandwidth samples 802 fall from the moving window, and the moving average write bandwidth 804 decreases, continuing to satisfy the write bandwidth target 806 up to time t, or 15.

Figure 9:
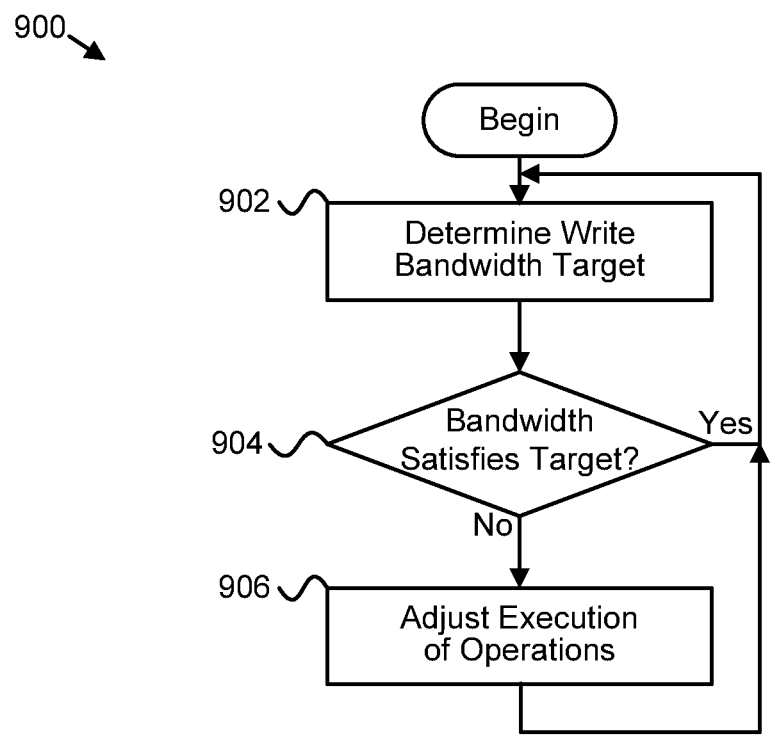
FIG. 9 is a schematic flow chart diagram illustrating one embodiment of a method for managing lifetime of a storage device.

FIG. 9 depicts one embodiment of a method 900 for managing lifetime for a storage device 102. The method 900 begins, and the target module 702 determines 902 a write bandwidth target for a data storage device 102. The audit module 704 monitors 904 a write bandwidth of the data storage device 102 relative to the write bandwidth target. In the depicted embodiment, if the audit module 704 determines 904 that the write bandwidth satisfies the write bandwidth target, the audit module 704 continues to monitor 904 the write bandwidth of the data storage device 102.

In the depicted embodiment, if the audit module 704 determines 904 that the write bandwidth fails to satisfy the write bandwidth target, the throttle module 706 adjusts 906 execution of one or more operations on the data storage device 102. The method 900 returns to the determining step 902, and the target module 702 redetermines 902 a write bandwidth target for the data storage device 102 and the method 900 continues.

Figure 10:
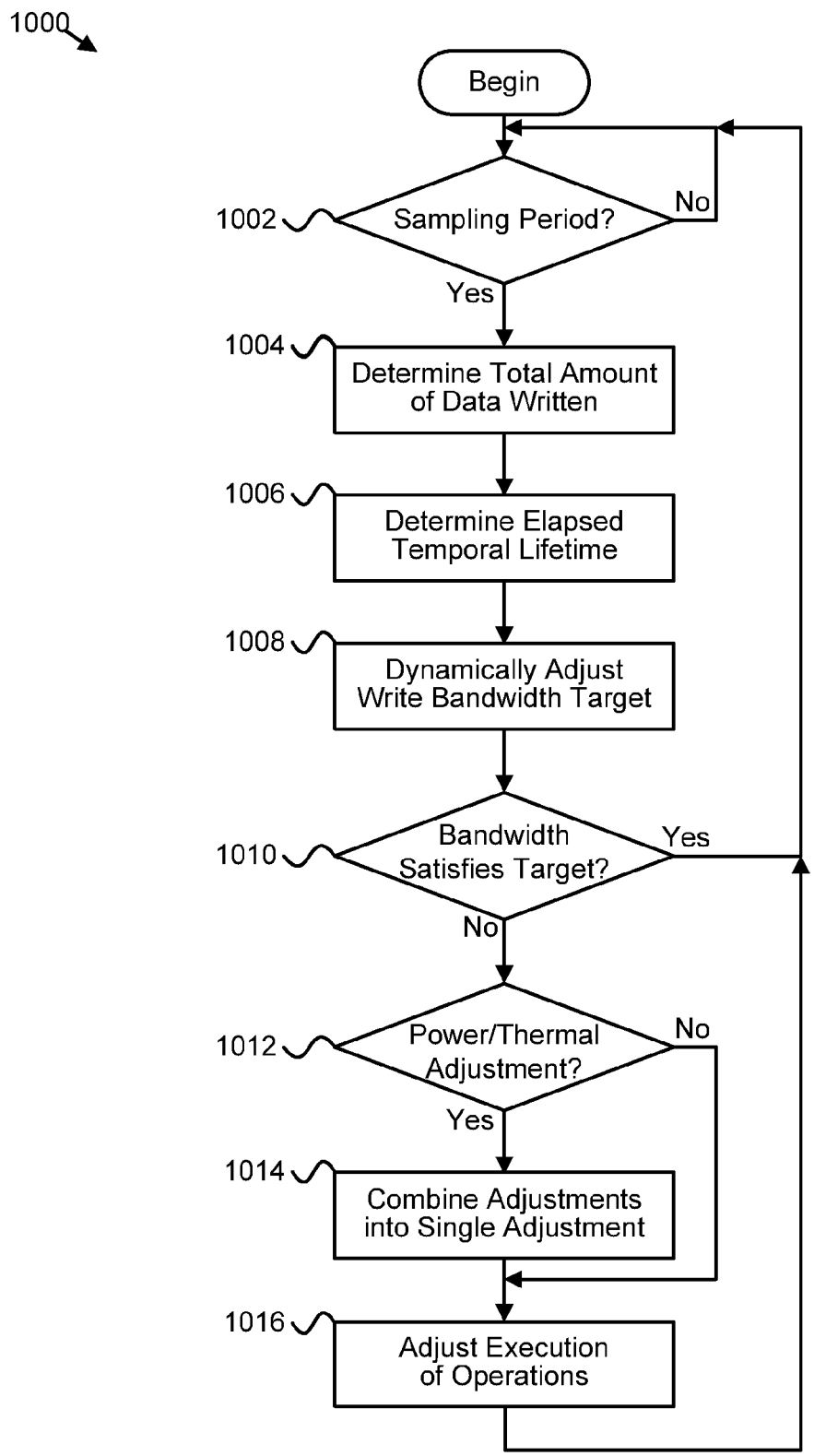
FIG. 10 is a schematic flow chart diagram illustrating another embodiment of a method for managing lifetime of a storage device.

FIG. 10 depicts one embodiment of a method 1000 for managing lifetime for a storage device 102. The method 1000 begins, and the target module 702 determines 1002 whether or not a sampling period for a data storage device 102 has been satisfied. If the target module 702 determines 1002 that the sampling period for the data storage device 102 has not yet been satisfied, the target module 702 continues to wait 1002 for the next sampling period. If the target module 702 determines 1002 that the sampling period has been satisfied, the target module 702 determines 1004 a total amount of data written to the data storage device 102 and determines 1006 an elapsed amount of a temporal lifetime for the data storage device 102. The target module 702 dynamically adjusts 1008 a write bandwidth target for the data storage device 102 based on the determined 1004 total amount of data written and the determined 1006 elapsed amount of temporal lifetime.

The audit module 704 monitors 1010 a write bandwidth of the data storage device 102 relative to the write bandwidth target. In the depicted embodiment, if the audit module 704 determines 1010 that the write bandwidth satisfies the write bandwidth target, the target module 702 continues to wait 1002 for the next sampling period. If the audit module 704 determines 1010 that the write bandwidth fails to satisfy the write bandwidth target, the throttle module 706 determines 1012 whether there is a power management and/or a temperature adjustment to write operations for the data storage device 102.

If the throttle module 706 determines 1012 that there is a power management and/or a temperature adjustment to write operations, the throttle module 706 combines 1014 a write bandwidth adjustment with the determined 1012 power management adjustment and/or temperature adjustment into a single adjustment and adjusts 1016 execution of one or more write operations on the data storage device 102 based on the single adjustment. If the throttle module 706 determines 1012 that there is not a power management and/or a temperature adjustment, the throttle module 706 adjusts 1016 execution of one or more write operations toward the write bandwidth target, without combining 1014 the adjustment with a power management and/or temperature adjustment. The method 1000 returns to the determining step 1002, and the target module 702 waits 1002 for the next sampling period.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
    determining a write bandwidth target for a data storage device;
    monitoring write bandwidth of the data storage device relative to the write bandwidth target;
    adjusting execution of one or more write operations on the data storage device in response to the write bandwidth of the data storage device failing to satisfy the write bandwidth target; and
    adjusting the write bandwidth target periodically in different sample periods for monitoring the write bandwidth of the data storage device, based on a total amount of data written to the data storage device, so that the total amount of data written does not exceed a threshold within the lifetime of the data storage device.

2. The method of claim 1, further comprising adjusting the write bandwidth target also based on an elapsed amount of a temporal lifetime for the data storage device such that the amount of data written to the data storage device does not exceed a defined endurance rating for the data storage device within the temporal lifetime of the data storage device.

3. The method of claim 2, wherein the data storage device comprises a plurality of modular data storage elements and the elapsed amount of the temporal lifetime is one of, based on an oldest modular data storage element; and determined separately for each modular data storage element.

4. The method of claim 1, wherein the write bandwidth comprises a moving average write bandwidth over a predefined period, the predefined period defines a window size for the moving average, and a sampling period defines a number of periodic write bandwidth samples within the window size that are included in the moving average.

5. The method of claim 1, further comprising,
    verifying whether the write bandwidth of the data storage device satisfies the write bandwidth target in response to adjusting the execution of the one or more write operations; and
    readjusting execution of one or more subsequent write operations on the data storage device in response to verifying that the write bandwidth fails to satisfy the write bandwidth target in response to adjusting the execution of the one or more write operations.

6. The method of claim 1, further comprising,
    monitoring a power consumption rate of the data storage device relative to a power consumption target; and
    adjusting execution of the one or more write operations on the data storage device in response to the power consumption rate of the data storage device failing to satisfy the power consumption target.

7. The method of claim 6, further comprising combining the adjustment of execution of the one or more write operations in response to the write bandwidth with the adjustment of execution of the one or more write operations in response to the power consumption into a single adjustment.

8. The method of claim 7, wherein combining the adjustment of execution of the one or more write operations in response to the write bandwidth with the adjustment of execution of the one or more write operations in response to the power consumption comprises selecting the largest adjustment as the single adjustment.

9. The method of claim 6, further comprising,
    monitoring a temperature for the data storage device relative to a thermal ceiling; and
    adjusting execution of the one or more write operations on the data storage device in response to the temperature approaching the thermal ceiling.

10. The method of claim 9, further comprising combining the adjustment of execution of the one or more write operations in response to the write bandwidth, the adjustment of execution of the one or more write operations in response to the power consumption rate, and the adjustment of execution of the one or more write operations in response to the temperature into a single adjustment.

11. The method of claim 1, wherein adjusting execution of the one or more write operations comprises adjusting a frequency with which the one or more write operations execute on the data storage device.

12. The method of claim 11, wherein adjusting the frequency with which the one or more write operations execute comprises setting a timer value specifying a frequency with which hardware of the data storage device polls to verify that an operation has completed.

13. The method of claim 12, wherein the data storage device comprises a nonvolatile solid-state storage device, the one or more write operations comprise program operations, and the timer value comprises a tPROG wait time specifying a period of time between submitting a program command to a memory area of the data storage device and submitting a status command to the same memory area of the data storage device to verify that execution of the program command has completed.

14. The method of claim 11, wherein adjusting the frequency with which the one or more write operations execute comprises managing a submission frequency at which the one or more write operations are submitted to the data storage device for execution.

15. The method of claim 14, further comprising allowing one or more other operations to execute on the data storage device between submitting the one or more write operations to the data storage device for execution.

16. The method of claim 14, wherein managing the submission frequency comprises,
    allowing a write operation to execute in response to an amount of time since a previous write operation satisfying the submission frequency; and
    delaying a write operation in response to the amount of time since a previous write operation failing to satisfy the submission frequency.

17. An apparatus comprising:
    a target module configured to determine a write bandwidth target for a data storage device;
    an audit module configured to monitor write bandwidth of the data storage device relative to the write bandwidth target; and
    a throttle module configured to adjust execution of one or more write operations on the data storage device in response to the write bandwidth of the data storage device failing to satisfy the write bandwidth target;
    wherein the target module is configured to dynamically adjust the write bandwidth target periodically in two or more different sample periods for monitoring the write bandwidth of the data storage device, based on the elapsed temporal lifetime of the data storage device.

18. The apparatus of claim 17, wherein the target module is also configured to dynamically adjust the write bandwidth target based on a total amount of data written to the data storage device such that the total amount of data written to the data storage device does not exceed a defined endurance rating for the data storage device within the remaining temporal lifetime for the data storage device.

19. A system comprising:
- a data storage device containing multiple storage elements;
- a target module that determines a write bandwidth target for each data storage element;
- an audit module that monitors write bandwidth of each data storage element relative to the write bandwidth target, the write bandwidth comprising an average of periodic write bandwidth samples within a moving window comprising a fixed number of write bandwidth samples; and
- a throttle module that adjusts execution of one or more write operations on each data storage element in response to the write bandwidth of the data storage element failing to satisfy the write bandwidth target.

20. The system of claim 19, further comprising a host device in communication with the data storage device, wherein at least a portion of one or more of the target module, the audit module, and the throttle module is part of a device driver for the data storage device installed on the host device.

21. An apparatus comprising:
- a target module configured to determine a write bandwidth target for a data storage device;
- an audit module configured to monitor write bandwidth of the data storage device relative to the write bandwidth target; and
- a throttle module configured to adjust execution of one or more write operations on the data storage device in response to the write bandwidth of the data storage device failing to satisfy the write bandwidth target by setting a tPROG wait time for the one or more write operations, the tPROG wait time specifying a period of time between submitting a program command to a memory area of the data storage device and submitting a status command to the same memory area of the data storage device to verify that execution of the program command has completed.

* * * * *